(12) United States Patent
Page

(10) Patent No.: US 9,895,841 B2
(45) Date of Patent: Feb. 20, 2018

(54) USER SPECIFIC DESIGN CUSTOMIZATION FOR 3D PRINTING

(71) Applicant: Autodesk, Inc., San Rafael, CA (US)

(72) Inventor: James Sherwood Page, Oakland, CA (US)

(73) Assignee: Autodesk, Inc., San Rafael, CA (US)

( * ) Notice: Subject to any disclaimer, the term of this patent is extended or adjusted under 35 U.S.C. 154(b) by 316 days.

(21) Appl. No.: 14/701,362

(22) Filed: Apr. 30, 2015

(65) Prior Publication Data

US 2015/0324490 A1     Nov. 12, 2015

Related U.S. Application Data

(60) Provisional application No. 61/991,154, filed on May 9, 2014.

(51) Int. Cl.
    *G06F 17/00*               (2006.01)
    *B29C 67/00*               (2017.01)
    (Continued)

(52) U.S. Cl.
    CPC .......... *B29C 67/00* (2013.01); *B29C 67/0088* (2013.01); *B33Y 50/00* (2014.12);
    (Continued)

(58) Field of Classification Search
    CPC ..... B29C 67/00; B29C 67/0088; B33Y 50/00; B33Y 50/02; G06F 17/50; G06Q 30/06;
    (Continued)

(56) References Cited

U.S. PATENT DOCUMENTS

| | | |
|---|---|---|
| 5,303,141 A | 4/1994 | Batchelder et al. |
| 5,316,219 A | 5/1994 | Christyson et al. |

(Continued)

FOREIGN PATENT DOCUMENTS

DE     10 2011 119 735     6/2013

OTHER PUBLICATIONS

*3-way extruder and colour blending nozzle Part 2—Build up and Printed things.* YouTube. Published Aug. 23, 2012. Retrieved on Sep. 10, 2014. Retrieved from the Internet: URL <http://www.youtube.com/watch?v=nkkbjpHVNZQ>, 2 pages.

(Continued)

*Primary Examiner* — Kenneth M Lo
*Assistant Examiner* — Michael W Choi
(74) *Attorney, Agent, or Firm* — Fish & Richardson P.C.

(57) ABSTRACT

Methods, systems, and apparatus, including computer programs encoded on computer storage media, for determining 3D printing customizations for a user. One of the methods includes receiving data indicating a selection of a product design by a user for creation of a three-dimensional product that includes a plurality of attributes, determining a style which includes values for some of the plurality of attributes and that is associated with the user, for each of the plurality of attributes determining whether the style includes a value for the respective attribute, and upon determining that the style includes a value for the respective attribute, customizing the product design using the value for the respective attribute, or upon determining that the style does not include a value for the respective attribute, customizing the product design using a default value for the respective attribute, and providing data for the customized product design for the three-dimensional product.

17 Claims, 27 Drawing Sheets

(51) Int. Cl.
  G06F 17/50 (2006.01)
  G05B 15/02 (2006.01)
  G06Q 30/06 (2012.01)
  B33Y 50/00 (2015.01)
  G05B 19/418 (2006.01)
  B33Y 50/02 (2015.01)

(52) U.S. Cl.
  CPc ......... *G05B 15/02* (2013.01); *G05B 19/4183* (2013.01); *G06F 17/50* (2013.01); *G06Q 30/06* (2013.01); *G06Q 30/0621* (2013.01); *G06Q 30/0635* (2013.01); *B33Y 50/02* (2014.12); *G05B 2219/32035* (2013.01); *G05B 2219/32036* (2013.01); *Y02P 90/10* (2015.11); *Y02P 90/265* (2015.11)

(58) Field of Classification Search
  CPC ............ G06Q 30/0621; G06Q 30/0635; Y02P 90/10; Y02P 90/265; G05B 2219/32035; G05B 2219/32036; G05B 15/02; G05B 19/4183
  USPC .......................................................... 700/98
  See application file for complete search history.

(56) References Cited

U.S. PATENT DOCUMENTS

| | | | |
|---|---|---|---|
| 5,943,235 A | 8/1999 | Earl et al. | |
| 5,960,411 A | 9/1999 | Hartman et al. | |
| 6,722,872 B1 | 4/2004 | Swanson et al. | |
| 6,749,414 B1 | 6/2004 | Hanson et al. | |
| 6,814,907 B1 | 11/2004 | Comb | |
| 6,944,327 B1* | 9/2005 | Soatto ................. | G02C 13/003 351/159.75 |
| 7,122,246 B2 | 10/2006 | Comb et al. | |
| 7,754,807 B2 | 7/2010 | Priedeman, Jr. et al. | |
| 8,512,024 B2 | 8/2013 | Pax | |
| 9,339,974 B2 | 5/2016 | Spalt | |
| 2001/0017085 A1 | 8/2001 | Kubo et al. | |
| 2002/0013735 A1* | 1/2002 | Arora ..................... | G06Q 30/06 705/26.61 |
| 2008/0147512 A1* | 6/2008 | Yankton ................. | G06Q 10/08 705/26.5 |
| 2010/0021580 A1 | 1/2010 | Swanson et al. | |
| 2010/0100224 A1 | 4/2010 | Comb et al. | |
| 2011/0059256 A1 | 3/2011 | Ebisawa | |
| 2011/0079936 A1 | 4/2011 | Oxman | |
| 2011/0106594 A1* | 5/2011 | Shirey .................. | G06F 17/3053 705/14.4 |
| 2011/0313878 A1 | 12/2011 | Norman | |
| 2013/0110666 A1* | 5/2013 | Aubrey .............. | G06Q 30/0269 705/26.5 |
| 2014/0034214 A1 | 2/2014 | Boyer et al. | |
| 2014/0070461 A1 | 3/2014 | Pax | |
| 2014/0291886 A1 | 10/2014 | Mark et al. | |
| 2014/0304661 A1* | 10/2014 | Topakas .............. | G06F 3/04815 715/848 |
| 2014/0328963 A1 | 11/2014 | Mark et al. | |
| 2014/0344102 A1* | 11/2014 | Cooper .............. | G06Q 30/0631 705/26.7 |
| 2014/0361460 A1 | 12/2014 | Mark | |
| 2015/0093465 A1 | 4/2015 | Page | |
| 2015/0108677 A1 | 4/2015 | Mark et al. | |
| 2015/0266235 A1 | 9/2015 | Page | |
| 2015/0266244 A1 | 9/2015 | Page | |
| 2015/0367375 A1 | 12/2015 | Page | |
| 2015/0367576 A1 | 12/2015 | Page | |

OTHER PUBLICATIONS

*CubePro 3D Printer*. CubePro. Published Jan. 6, 2014. Retrieved on Sep. 10, 2014. Retrieved from the Internet: URL <http://cubify.com/en/CubePro?gclid=CJbWgJiz1cACFUiGfgod7zgA6A>, 7 pages.

Douglass, Carl. *Next Generation 3D Printer Extruders: The Rugged-HPX Line*. Kickstarter. Published Feb. 17, 2014. Retrieved on Sep. 10, 2014. Retrieved from the Internet: URL <https://www.kickstarter.com/projects/dglass3d/next-generation-3d-printer-extruders-the-rugged-hp>, 22 pages.

*MakerBot Replicator 2X*. MakerBot. Published Sep. 18, 2012. Retrieved on Sep. 10, 2014. Retrieved from the Internet: URL <http://store.makerbot.com/replicator2x>, 9 pages.

*Multicolor-extruder*. RepRap. Published Aug. 11, 2014. Retrieved on Sep. 10, 2014. Retrieved from the Internet: URL <http://reprap.org/wiki/Multicolor-extruder>, 3 pages.

*RepRap 3D printer 3-way extruder and colour blending nozzle Part 1—intro video*. YouTube. Published Aug. 23, 2012. Retrieved on Sep. 10, 2014. Retrieved from the Internet: URL <http://www.youtube.com/watch?v=_g0fiWx8RyM>, 3 pages.

*RUG/Pennsylvania/State College/Software/Parts/Dual Extruder*. PepRap. Published Aug. 6, 2014. Retrieved on Sep. 10, 2014. Retrieved from the Internet: URL <http://reprap.org/wiki/RUG/Pennsylvania/State_College/Software/Parts/Dual_Extruder>, 13 pages.

Neri Oxman, U.S. Appl. No. 61/248,555, "Variable Property Rapid Prototyping (VPRP)," filed on Oct. 5, 2009, 36 pages.

"Nike Air Huarache Run ID Shoe," [online] [Retrieved on Jan. 28, 2015]; Retrieved from the Internet URL: http://store.nike.com/us/en_us/product/air-huarache-run-id/?piid=39329&pbid=712882438, 6 pages.

"Style sheet (web development)," [online] [Retrieved on Jan. 28, 2015]; Retrieved from the Internet URL: http://en.wikipedia.org/wiki/Style_sheet_(web_development), 4 pages.

"T-shirt," [online] [Retrieved on Jan. 28, 2015]; Retrieved from the Internet URL: http://en.wikipedia.org/wiki/T-shirt, 7 pages.

"Upload your 3D Design," [online] [Retrieved on Jan. 28, 2015]; Retrieved from the Internet URL:http://www.shapeways.com/create?li=home-2ndPring-promo-create, 8 pages.

"3D printing," [online] [Retrieved on Jan. 28, 2015]; Retrieved from the Internet URL: http://en.wikipedia.org/wiki/3D_printing, 39 pages.

"3D Printer Software & Apps," [online] [Retrieved on Jan. 28, 2015]; Retrieved from the Internet URL: https://3dprinter.dremel.com/3d-printer-software-apps, 11 pages.

"How Shapeways 3D Printing Works," [online] [Retrieved on Jan. 28, 2015]; Retrieved from the Internet URL: http://www.shapeways.com/how-shapeways-works, 14 pages.

Moto X (1st generation), [online] [Retrieved on Jan. 28, 2015]; Retrieved from the Internet URL: http://en.wikipedia.org/wiki/Moto_X_(1st_generation), 10 pages.

* cited by examiner

USER SPECIFIC DESIGN CUSTOMIZATION FOR 3D PRINTING

CROSS-REFERENCE TO RELATED APPLICATION

This application claims the benefit of priority under 35 U.S.C. § 119(e) of U.S. Provisional Application No. 61/991,154, filed on May 9, 2014. The disclosure of the prior application is considered part of and is incorporated by reference in the disclosure of this application.

BACKGROUND

The industrial revolution reduced cost for many products by virtue of mass production and economies of scale. But the products made using mass production techniques are generally not made for a specific user.

3D printing manufacturing systems may enable companies to manufacture products on-demand (often after receiving payment for the product), reduce or eliminate tooling costs, launch new products rapidly, have faster product evolution, reduce product inventory, introduce supply chain simplification and savings, have design and assembly simplification via reduced part count, perform manufacturing locally, reduce shipping and waste, and increase local recycling and material re-use.

SUMMARY

A product customization system may enable consumers to customize and order products with a single action, such as a single mouse click or touch on a touch screen. The product customization system stores customizable product designs, styles, and uses a customization algorithm to apply particular styles for particular users to a particular customizable product design.

For example, the system may allow a user to select a style, defined by the user or another user, which the system will apply to products viewed by the user. The system may include multiple styles, e.g., which include style data, each of which may be collections, e.g., databases, of information that can include attribute values, rules, personal data, biometric data, context data, patterns, textures, images, logos, icons, motifs, selective space structures, or any two or more of these that form a design language that the system can apply to products. A product style may be unique to a particular user. A product style may be promoted by a particular brand. A product style might not be product-specific.

For instance, the style for the user may indicate particular dimensions for the product specific to the user, such as a size of a computer mouse, dimensions for shirts and pants the user will wear, or dimensions of a product the user purchased previously when viewing an accessory for the product, e.g., the dimensions of a laptop when the user is viewing laptop bags. The style may indicate a particular design, color, texture, or other properties the system should apply to products viewed by the user.

When the system receives a request from a device operated by the user to view a product page, e.g., web page or page in another user interface, the system applies the style for the user to the product to customize the product for the user and presents an image of the customized product in the product page. For instance, the system includes a customizable product design, e.g., a product design or a customizable design, which defines basic product geometry for the product and, optionally, how the appearance and other attributes of the product may be modified during a customization process, e.g., using style data.

The system uses a customization process to match attributes included in the style with product attributes for the product design to create a customized product design. For example, as explained in more detail below, the system determines whether the style and the product design both have a particular attribute and apply the value of the attribute from the style to the attribute in the product design. In one example, the system determines, for a shoe product design, that the style indicates the user wears a size 10 shoe, and the system determines dimensions for the shoe product design for a size 10 shoe.

In general, one aspect of the subject matter described in this specification can be embodied in methods that include the actions of storing a product design in a database, wherein the product design includes a customization vector for an attribute, storing data representing a style in a style database, wherein the style includes style data for an attribute, storing an identifier of a user in a user database that associates the user with the style, receiving data indicating selection of the product design by the user, determining, using the identifier of the user, to apply the style, from multiple styles in the style database, to the product design, determining that the attribute for the customization vector and the attribute for the style data are the same attribute, creating a user-specific design by modifying values of the customization vector of the product design using the style data in response to determining that the attribute for the customization vector and the attribute for the style data are the same attribute, and providing data representing the user-specific design for display. Other implementations of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination of them, installed on the system that in operation causes or cause the system to perform the actions. One or more computer programs can be configured to perform particular operations or actions by virtue of including instructions that, when executed by data processing apparatus, cause the apparatus to perform the actions.

In general, one aspect of the subject matter described in this specification can be embodied in a system that includes a first database configured to store multiple product designs each including one or more customization vectors, a second database configured to store multiple styles style each including style data, a third database configured to store associations between each of multiple users and a respective style for the user by mapping an identifier for the respective user to an identifier for the respective style, and at least one processor configured to perform operations including receiving data indicating selection of a particular product design from the multiple product designs by a user, determining, using an identifier of the user, to apply a particular style and corresponding style data from the multiple styles to the product design, determining that an attribute for a customization vector in the product design is the same as an attribute for the style data, creating a user-specific design by modifying values of the customization vector of the product design using the style data in response to determining that the attribute for the customization vector in the product design is the same as the attribute for the style data, and providing data representing the user-specific design for display. Other implementations of this aspect include corresponding computer systems, apparatus, methods, and computer programs recorded on one or more computer storage devices, each configured to perform the actions of the methods. A system of one or more computers can be configured to perform particular operations or actions by virtue of having software, firmware, hardware, or a combination of them, installed on the system that in operation causes or cause the system to perform the actions. One or more computer programs can be configured to perform particular operations or actions by virtue of including instructions that, when executed by data processing apparatus, cause the apparatus to perform the actions.

In general, one aspect of the subject matter described in this specification can be embodied in methods that include the actions of receiving data indicating a selection of a product design by a user for creation of a three-dimensional product that includes a plurality of attributes, determining a style which includes values for some of the plurality of attributes and that is associated with the user, for each of the plurality of attributes determining whether the style includes a value for the respective attribute, and upon determining that the style includes a value for the respective attribute, customizing the product design using the value for the respective attribute, or upon determining that the style does not include a value for the respective attribute, customizing the product design using a default value for the respective attribute, the default value being specified by the product design, and providing, as output, data for the customized product design for the three-dimensional product. Other implementations of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination of them, installed on the system that in operation causes or cause the system to perform the actions. One or more computer programs can be configured to perform particular operations or actions by virtue of including instructions that, when executed by data processing apparatus, cause the apparatus to perform the actions.

The foregoing and other embodiments can each optionally include one or more of the following features, alone or in combination. The product design may include product design data of at least one of a surface, a facet, an edge, a vertex, a volume, a voxel, a feature, a region of purpose, or a property for a surface or an edge. The property may include data representing at least one of a color, a material, or a texture for the surface or the edge. The method may include modifying the product design before storing of the product design in the database by selecting at least one of the product design data to be used for the customization vector. Storing the product design may include storing design data for the customization vector, the design data indicating that the attribute for the customization vector may be customized for a user and at least one of: a maximum value for the attribute, a minimum value for the attribute, or a list of discrete options for the attribute.

In some implementations, the method includes storing data representing a second style in the style database, wherein the second style includes second style data for an attribute and is different from the style, storing a second identifier of a second user in the user database that associates the second user with the second style, receiving data indicating selection of the product design by the second user, determining, using the second identifier of the second user, to apply the second style to the product design, determining that the attribute for the customization vector and the attribute for the second style data are the same attribute, creating another user-specific design by modifying the customization vector of the product design with the second style data in response to determining that the attribute for the customization vector and the attribute for the second style data are the same attribute, and providing data representing the other user-specific design for display.

In some implementations, the style data includes data representing a style attribute including a color, a color palette, an image, a texture, an embossing, a debossing, biometric data, a material, data about past purchases of the user, data about a home of the user, data about a physical location of the user, or brand preference data. The product design may include a second customization vector for an attribute, and the style may include second style data for an attribute. The method may include determining that the attribute for the second customization vector and the attribute for the second style data are the same attribute, and creating the user-specific design by modifying the second customization vector of the product design with the second style data in response to determining that the attribute for the second customization vector and the attribute for the second style data are the same attribute.

In some implementations, the customization vector includes two or more attributes including the attribute, storing data representing the style includes storing style data for each of the two or more attributes including the style data, and modifying the customization vector includes, for each of the two or more attributes matching the attribute for the customization vector to the corresponding style data for the style, and applying the matched style data to the attribute for the customization vector to create the user-specific design. The customization vector may include a particular attribute with multiple allowable options, and matching the attribute from the customization vector to the corresponding style data for the style may include selecting one of the allowable options for the particular attribute that is a best fit using the style. The style data may include multiple sets of style data for a particular attribute, and matching the attribute from the customization vector to the corresponding style data for the style may include selecting one of the sets of style data for the particular attribute that is a best fit using the customization vector and the style data.

In some implementations, the executing of the customization algorithm includes producing quantitative design output from qualitative inputs. Modifying the customization vector of the product design with the style data may include selectively modifying a geometry of the product design to create the user-specific design. The selectively modifying the geometry of the product design to create the user-specific design may include selectively modifying the geometry using non-geometric input data. The non-geometric input data may include data about past purchases of the user.

In some implementations, the method includes storing data representing a pre-style in the style database, wherein the pre-style includes pre-style data and may be modified by a user to create a style, receiving data indicating a modification to the pre-style data by the user, and creating the style data using the modification to the pre-style data, wherein storing the data representing the style may include storing the data representing the style in response to creating the style data using the modification to the pre-style data. Receiving data indicating a modification to the pre-style data by the user may include receiving the data indicating the modification across a network. The method may include transmitting the user-specific design to a manufacturing device. The method may include forming a three-dimensional product by the manufacturing device using the user-specific design.

In some implementations, receiving the data indicating selection of the product design by the user includes receiving data indicating a single input that identifies a request to order the product and the identifier of a user. The method may include prior to receiving the data indicating the single input that identifies the request to order the product, providing instructions for a presentation of a user interface that includes information identifying the product, and in response to receiving the data indicating the single input that identifies the request to order the product, manufacturing the product based on the user-specific design. The method may include generating an order to purchase the product for the user using the style and the product design.

In some implementations, the method includes providing instructions for presentation of at least one of the multiple product designs, including the particular product design, from a user device operated by the user. A system may include a manufacturing device in data communication with the at least one processor and configured to receive the user-specific design and form the product using the user-specific design. The second database may include the third database.

In some implementations, customizing the product design using the value for the respective attribute includes modifying a customization vector defined in the product design using the value. Providing, as output, data for the customized product design for the three-dimensional product may include sending instructions to a manufacturing device requesting creation of the three-dimensional product using the customized product design.

In some implementations, the method includes generating a feature hierarchy that ranks the attributes in the product design from highest priority to lowest priority, wherein determining whether the style includes a value for the respective attribute includes determining whether the style includes a value for a higher priority attribute before determining whether the style includes a value for a lower priority attribute. Generating the feature hierarchy that ranks the attributes in the product design from highest priority to lowest priority may include generating a feature hierarchy that ranks attribute values in the product design from highest priority to lowest priority. Generating the feature hierarchy that ranks the attributes in the product design from highest priority to lowest priority may include generating a feature hierarchy that ranks the attributes in the product design from highest priority to lowest priority using the product design. Generating the feature hierarchy that ranks the attributes in the product design from highest priority to lowest priority may include generating a feature hierarchy that ranks the attributes in the product design from highest priority to lowest priority using the style. Generating the feature hierarchy that ranks the attributes in the product design from highest priority to lowest priority may include generating a feature hierarchy that ranks the attributes in the product design from highest priority to lowest priority using the product design and the style. Generating the feature hierarchy that ranks the attributes in the product design from highest priority to lowest priority using the product design and the style may include applying weights to attribute ratings to generate the feature hierarchy. Applying the weights to attribute ratings to generate the feature hierarchy may include applying greater weights to attribute ratings from the product design and lower weights to the attribute ratings from the style to cause the attribute ratings from the product design to have more influence on the feature hierarchy than the attribute ratings from the style.

In some implementations, customizing the product design using the value for the respective attribute includes determining whether the value conflicts with a rule for the product design, and upon determining that the value does not conflict with a rule for the product design, customizing the product design using the value for the respective attribute. The method may include upon determining that the value conflicts with a rule for the product design, customizing the product design using the default value for the respective attribute. The method may include determining, for each rule in the style, whether a context for the rule applies to the product design, and upon determining that the context for the rule does not apply to the product design, not customizing the product design using the rule, or upon determining that the context for the rule applies to the product design determining whether the rule conflicts with a product design rule specified in the product design, and upon determining that the rule does not conflict with a product design rule specified in the product design, customizing the product design using the rule, or upon determining that the rule conflicts with a product design rule specified in the product design, not customizing the product design using the rule.

The subject matter described in this specification may be implemented in various implementations and may result in one or more of the following potential advantages. In some implementations, a company provides a system with a product design for a particular product to allow customers to customize the particular product while maintaining brand recognition for the particular product.

In addition to the added incremental value from product customization, truly flexible automated manufacturing systems such as 3D printing enable other substantial economic benefits to product companies including manufacturing on-demand (often after payment), elimination of tooling cost, rapid product launches, rapid product evolution, reduced inventory, supply chain simplification and savings, design and assembly simplification via reduced part count, local manufacturing, reduced shipping and waste and increased local recycling and material re-use.

In some implementations, a system may provide a single-step or automatic customization process, in which products may be customized upon ordering by a user. In some implementations, a system may allow a user to customize products in a myriad of significant or subtle ways, or both, by leveraging customer data, e.g., data which the user does not need to input at the time of customization, but which may be aggregated over time and may form the basis of user's style(s). In some implementations, a system may create styles "in the background" as a user goes about their life with user behavior data, user preference data, user biometric data, and other data without requiring much if any explicit style input from the user.

Details of one or more implementations are set forth in the accompanying drawings and the description below. Other features, aspects, and potential advantages will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
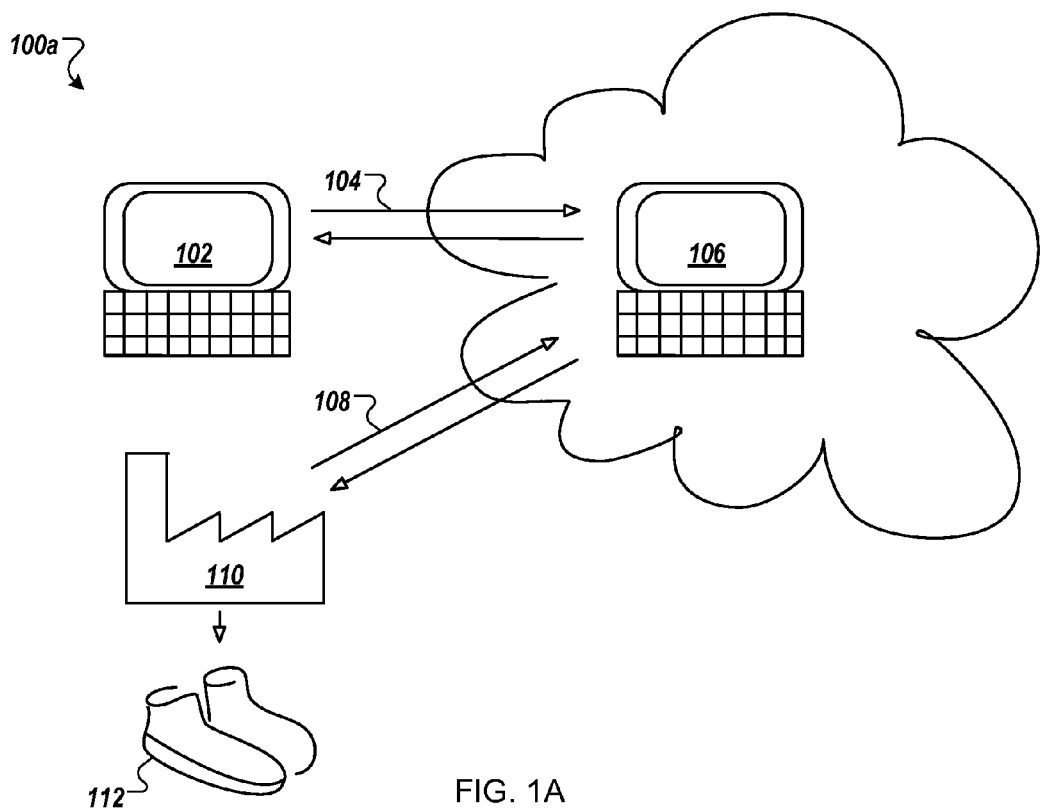
FIGS. 1A-B show examples of a distributed product customization system.

A product customization system may enable consumers to customize and order products with a single action, such as a single mouse click or touch on a touch screen. The product customization system stores customizable product designs, styles, and uses a customization algorithm to apply particular styles for particular users to a particular customizable product design.

For example, the system may allow a user to select a style, defined by the user or another user, which the system will apply to products viewed by the user. The system may include multiple styles, e.g., which include style data, each of which may be collections, e.g., databases, of information that can include attribute values, rules, personal data, biometric data, context data, patterns, textures, images, logos, icons, motifs, selective space structures, or any two or more of these that form a design language that the system can apply to products. A product style may be unique to a particular user. A product style may be promoted by a particular brand. A product style might not be product-specific.

For instance, the style for the user may indicate particular dimensions for the product specific to the user, such as a size of a computer mouse, dimensions for shirts and pants the user will wear, or dimensions of a product the user purchased previously when viewing an accessory for the product, e.g., the dimensions of a laptop when the user is viewing laptop bags. The style may indicate a particular design, color, texture, or other properties the system should apply to products viewed by the user.

When the system receives a request from a device operated by the user to view a product page, e.g., web page or page in another user interface, the system applies the style for the user to the product to customize the product for the user and presents an image of the customized product in the product page. For instance, the system includes a customizable product design, e.g., a product design or a customizable design, which defines basic product geometry for the product and, optionally, how the appearance and other attributes of the product may be modified during a customization process, e.g., using style data.

The system uses a customization process to match attributes included in the style with product attributes for the product design to create a customized product design. For example, as explained in more detail below, the system determines whether the style and the product design both have a particular attribute and apply the value of the attribute from the style to the attribute in the product design. In one example, the system determines, for a shoe product design, that the style indicates the user wears a size 10 shoe, and the system determines dimensions for the shoe product design for a size 10 shoe.

This specification refers to the term "attributes" as characteristics or details of features in a product design that may be changed by a customization process to yield a customized product design. Some example attributes may include sizes, dimensions, colors, textures, materials, manufacturing methods, quantity, quality, material properties, logos, artwork, motifs, photos, lettering, words, numbers, and geometric treatments (e.g., sharp, rounded, beveled), that apply to product features. Attributes included in style data may refer to or be modifiers of non-product-specific geometry or features, e.g., classes or categories of geometry or features. Attributes included in style data may be referred to as "style attributes" or simply "attributes" as used in the context of or as part of style data.

In some implementations, the customization process can be a process or set of processes that instruct a processor to execute instructions that include arbitration between potentially conflicting or ambiguous goals, data, or both from the a product design and a style applied to the product design. For instance, the system may use the customization process to determine that a style for the user indicates that the user bought a computer mouse with their laptop and that a corresponding laptop bag should include space for the computer mouse, e.g., using the dimensions for the computer mouse. The system may determine that a particular laptop bag product design does not include any space for the computer mouse and determine that a size of the particular laptop bag cannot be changed to accommodate the computer mouse but should be customized in other ways for the user, e.g., a color and a texture of the laptop bag may be customized for the user.

A customizable product design may include information about how a corresponding product can be customized while still achieving a good result with respect to desired functions or aesthetics for the product. A customizable design may include 1) a product design geometry, 2) customization vectors, 3) optional default attributes, e.g., for the customization vectors, and 4) optional context information.

The product design can be a collection of data, e.g., entries in a database or a database for a single product design, describing one version of geometry for a product. The product design data may include features, e.g., identifiable geometric units such as bosses, flanges, holes, gaps, edges, corners, blobs, mathematically specified geometries, chamfers, fillets (i.e. rounded corners), scallops, hollows, revolved cuts, solids of revolution, toroids, patterns, ridges, identifiably distinct geometries or areas of a design, or combinations of two or more of these. The product design may be for a particular version of a product and include the most basic, essential features and attributes for that particular version of the product, e.g., a simple version of the product. For instance, the product design can be a version of a product that is not customized. The system may use the product design to manufacture a version of a product such that the product is functional and meets a set of general use criteria, for example specific to a non-customizable product that already exists.

In some implementations, products may be designed from the outset to be customizable. In these implementations, the customizable product design alone may not have all the information needed to produce a functional product and may be used in conjunction with a base product design to create a customized product.

Each customizable product design may include digital or other representations of faces (surfaces), facets, edges, curves, vertices, volumes, voxels, unique identifiers (ID tags) for each face, edge and vertex, or combinations of two or more of these. Shape data for a product may be in the form of surface-based data, facet-based data, voxel-based data, parametric instructions based data, or combinations of two or more of these.

Surface-based data may be a mathematical description of surfaces which may include vertex, edge data, or both, to support the mathematical description of the surfaces. Surfaces, vertices, edges, or combinations of two or more of these can be tracked with ID tags or other types of identification or memory location information so that the surfaces, vertices, edges, or combinations of two or more of these can be uniquely and reliably retrieved and distinguished.

Facet-based data may define product surfaces broken up into discrete surface facets, e.g., typically flat, that can be small enough so that, in aggregate, the facets approximate the product shape with sufficient resolution. For example, facets may deviate from the surfaces from which they may be derived by less than 0.4 mm for a product not requiring high precision or by less than 0.02 mm for a product requiring high precision. The system may define facets by specifying the facet vertices, the facet edges, or both. Facets may contain auxiliary or derivative data such as normal vectors, e.g., used to determine which side faces out, and nearest neighboring facets. Facets, vertices, edges, or combinations of two or more of these can be tracked with ID tags or other unique identification or memory location information.

Voxel-based data may define volumes making up the product shape that can be broken into small volume units ("voxels") with resolution sufficient to represent the product shape according to the requirements of the product. For example, voxels may have a deviation from the ideal product shape less than 0.4 mm for a product not requiring high precision or deviation of less than 0.02 mm for a product requiring high precision. Voxels may be represented by the voxel vertices and may have derivative data including faces and edges. External faces of the outermost voxels may be facets similar to those of the purely facet-based scheme above. For instance, voxels may be a super-set of facets and the system may perform the same actions with facets that may be performed with voxels.

Parametric instructions based data may include the shape and other aspects of a product design encoded as a set of sequential steps or instructions and/or features including sketches, dimensions and other data which, when executed in order, yield a desired geometry for the product. In some implementations, a system using parametric instructions based data may include resulting surface information and identifiers (IDs) so the system may be a superset of a surface-based data system.

In this specification, for simplicity, a surface may include a surface, a facet, a voxel, a triangle, an edge, a curve, a vertex, a parametric instruction, or other data that defines a layer of a product.

In some implementations, a product design may include default attribute values, such as a particular color and a particular material. For instance, the system uses the default attribute values for a particular attribute when a style does not include attribute values for the particular attribute.

A product design includes customization vectors that define attributes for a product which may be customized, e.g., using a style. For instance, a customization vector may include different ways that a product can be customized, as described in more detail below. A customization vector may define a set of rules about which attributes of a product may be customized, in what ways the attributes may be customized, in what contexts the attributes may be customized, and appropriate ranges for the attributes.

In some implementations, the system receives a product design from a product designer, e.g., a company, that includes a set of customization vectors and associated controls such that possible variations made to the product design using the customization vectors, and associated attribute ranges defined by the customization vectors, yield results that the product designer deems useful and acceptable. For instance, the system, or another system, may provide a tool to the product design that provides the product designer with access to all product geometry data for a particular product and the ability to change any aspect of the generic product geometry data. The product designer may then view all of the product geometry data, create controls for some of the product geometry data, and finalize the product design to allow another user to view a customized product created using the product design and a style for the other user, e.g., when attribute values in the style are applied to the customization vectors defined by the product designer.

Customization vectors may be defined as ways that a product may be customized and ways that it may not be customized. Examples of attributes included in a customization vector may include, but are not limited to: overall product dimensions, specific feature dimensions (e.g., any given feature may include any number of dimensions and some or all may be selected to be customizable, while others may be selected to stay fixed), specific feature location, feature existence (i.e., a binary yes or no), number of features of a given type, geometric treatment for a given type of feature (e.g., corners could be sharp, round, beveled, or combinations thereof), texturing of regions of purpose, materials for the whole product, whether colors or color palettes may be changed and the range of allowable changes, materials for regions of purpose, manufacturing method for the whole product or regions of purpose, color for the whole product or regions of purpose, whether regions of purpose may be modified with biometric data, whether regions of purpose may be modified with other style related data, whether regions of purpose may be modified with embossed or debossed pictures, whether regions of purpose may be modified by embossed or debossed logos, icons or motifs, whether regions of purpose may have graphics added, whether regions of purpose or the whole product may have strength, stiffness or weight changed, whether the center of gravity or balance point may be changed, or combinations of two or more of these. In some examples, a customization vector may have associated modifiers such as parameters, rules, equations, heuristics, ranges, or combinations of two or more of these that can govern and potentially limit the range of outcomes for that customization vector.

Modifiers associated with customization vectors may be quantitative or qualitative. Quantitative modifiers may include acceptable ranges of attribute values (for example if the customization vector is a dimension), maximum and minimum attribute values, or discrete attribute options such as a list of acceptable values, for example a list of names of colors, sizes, materials, textures, themes, logos, feature treatments, geometry filters, manufacturing methods, material densities, material properties or combinations of two or more of these. Qualitative modifiers may include word descriptors like hard, soft, angular, grippy, smooth, or ornate. Qualitative modifiers may include phrases like "devoid of detail", "evokes a sense of springtime", "compliments Scandinavian design", or "futuristic but understated". Qualitative modifiers of customization vectors may be used to look up metadata within a style, for example by selecting from among available style data options to create a best match between the qualitative modifier and the possible style data choices.

A customization vector may include a region of purpose. Regions of purpose can be areas, groups of surfaces, subsets of the product volume, or combinations of two or more of these that can be defined as having a common purpose or that can be treated as a unit with respect to customization. For example, the grip on a tool may include one or more surfaces in the product design that can define a region of purpose. The surfaces of the grip can be grouped together and manipulated together during a customization process as a single region of purpose. A product feature, for example such as a mounting boss, product foot, bezel, handle, nameplate, wheel, seat, sole, pocket or button can have a region of purpose associated with the product feature. A product feature may have more than one region of purpose associated with the product feature. For example a pocket may have both inside and outside regions of purpose. A region of purpose may have more than one feature associated with it. For example several buttons can be on a keypad region of purpose.

Default attributes are attributes of particular product features, or areas of purpose of a product design that may optionally be included as part of a customizable product design. Default attributes might not be applied to a customized product, e.g., when a style includes a corresponding attribute value, but may be included in a customized product design in the absence of other available suitable attributes from a set of style data.

In some implementations, context information may be included as part of a customized product design. Context information may be referred to as product context information. A system may use context information to make refined, intelligent choices about how to match attributes from a style to attributes of a product design and, optionally, how to modify style attributes to best suit the intended context for the customized product. Product context information may typically include: a) the type of product or product category (e.g., sporting goods, fashion accessories, or tools); b) the intended function of the product; c) the type of activity the product is used for; d) the overall aesthetic qualities to be maintained in any customized design (e.g., this may be more general than specific attributes); e) the environment the product will typically exist in or be used in; f) specific environmental factors or requirements (e.g., salt water spray, UV radiation, environment that must remain quiet, subject to impacts of 200 Joules, subject to exposure to oil-containing cosmetics, must slide on floor without marking or scratching, must have friction coefficient of >0.7 on concrete, etc.); g) target product price; h) other usage information (e.g., worn on feet, works with a particular brand's product; etc.); i) demographic information of intended likely users or market (e.g., girls 19-23, survival gear enthusiasts, makers, senior citizens, people who like to cook, etc.); j) high-level adjectives describing the experience or feeling the product is intended to enable; k) associated groups, movements, cultural connections or other memes (e.g., Japanese anime, "Republicans for Obama", slow food movement, Hip hop, minimalism, Free Tibet, etc.); l) fashion or lifestyle designations such as casual, formal, surf lifestyle, fashion-minimalism, 70's retro etc.; m) specific brand associations (e.g., the product may in fact be for a specific brand, or there may be several brands that are used as inspiration or influencing factors in interpreting style data such as APPLE, HUMMER, BMW, DEWALT, GUCCI, etc.); and n) people or icons (e.g., designers (for example if the product has been designed by or is being promoted by a famous designer), or iconic names that an intelligent customization system can use to help interpret style data and customize the product).

Product context information may be linked to specific product features or regions of purpose or types of attributes to be applied from style data. For example some context items for a footwear product might include ["bears users weight"->sole (region of purpose) and "has impacts of 200 Joules with rough pavement"->sole (region of purpose)], which communicate the meaning that the footwear sole region of purpose must be designed and manufactured and use materials such that it can bear the weight of the user and withstand impacts with pavement.

Design intent may be the collection of intended objectives and results for a customizable product that should be maintained through a customization process. A design intent hierarchy is a ranking of the objectives that make up the design intent. The design intent hierarchy enables a system, performing a customization process, to work on interpreting the product design and style data to achieve the most important design intent objectives first. Design intent objectives may be categorized within the customizable product design as "must have", "nice to have", "optional", "very important", "low importance" or with ranked importance, or with other similarly functional designations that the system may interpret and use for prioritization within the customization process, e.g., to resolve conflicts between attributes or rules in the style data and the product design that cannot be used to create a customized product, such as the customized product being both entirely blue and entirely red.

A style, which includes style data, is defined as a collection of product-independent data which may include attributes, preferences, rules, heuristics, and equations that may be drawn upon by an algorithm to change and customize products. A style is generally independent of a particular product, e.g., is not specific to one particular product, but may contain rules and references that create different outcomes depending on the type of product or category of product being customized. A style may be personal, i.e., defined for a particular person, defined using personal data, or both, or a style may be intended for or related to a group of people or a style may be independent of a particular person and broadly applicable. One aspect of styles is data, which may include but is not limited to data representing colors, color palettes (e.g., groups of colors to be used together), images, textures, textures created from images, embossed or debossed features, biometric data, features derived from images, logos, motif, personal icons, graphics, graphics derived from images, sketches, features derived from sketches, application specific data that may or may not be related to biometric data, collections of preferences, likes or dislikes, materials, other personal data, data about past purchases, data about a person's environment or home, and any other appropriate data. Some or all style data may be derived from external, cultural or brand sources. For example, a style may be created that reflects the essence of a videogame or movie, or that reflects the essence of a real individual (e.g., Brad Pitt) or a fictional individual (e.g., James Bond), or an organization (e.g., SF MOMA, Girl Scouts, NFL, etc.).

In some implementations, a style, a product design, or both may include preferences and rules about how style data should be used. For example, a style may include the rules. In some examples, a product design or a customization process may include rules. Rules may include which attributes or data (such as colors, textures, materials, graphics, embossed icons, etc.) are applied to what categories of products.

In some examples, a style may include contextual information. In a product style, contextual information may be speculative, and be used to direct how to apply style attributes to different products with contexts that happen to match specific speculative contextual style instructions. For instance, a given collection of style data may be applied very differently in different product contexts. A system may use contextual information embedded in a style to determine how to apply a style in different contexts.

A pre-styles may be a style, e.g., created by a style designer, that has not been modified by a user, e.g., before undergoing user-modification process(es). A customization system may enable users to modify pre-styles to create their own unique styles. In some examples, a user modification processes may not result in a change to a pre-style so it is possible that a style may be the same as a pre-style in some instances. The customization system may modify a pre-style in response to data indicating user browsing habits, shopping habits, Facebook habits, gamification, or asking survey or yes/no questions to adjust style to be more specific to the user.

Product designs may be created on a first user device. Pre-styles may be created on a second user device. User fine-tuning of style data may occur on a third user device. The first user device may be at a location where the product design is created and/or stored, the second user device may be at another location where a pre-style is created and/or stored, and the third user device may be at a different location where a user may modify a pre-style to create a style. In some examples, all of the user devices may be at the same location, some of the user devices may be the same device, or the user devices may be at any combination of locations.

A customization system may optimize the resulting design of the customizable product using customization vectors specified by the product designer and style data which may be general or user-specific. The customization system may create quantitative output data, e.g., the specific geometry, materials, colors and manufacturing methods of a customized design. The customization system may use either or both qualitative and quantitative inputs selected from style data and may use them to create typically unique customized designs. Qualitative inputs may mean words or other codified meaning such as "cozy", "warm", "gentle", "aggressive", "skate culture", "high fashion", "Bauhaus", "grunge", "high traction", "abuse resistant", or "suitable for children". The customization system may use non-geometric inputs, e.g., qualitative inputs or other inputs that may not be geometrically represented such as colors, color palettes, and materials.

For instance, qualitative data may be adjectives that are part of a style, such as "bold", "angular", "organic", or "soft", or they may be "likes" and "dislikes" or other non-quantitative inputs which a customization system may use when customizing a product design. For instance, a product design may allow for a particular feature to be "angular" or "soft," and a customization system may determine that, for a particular user, the product design should be soft, and apply corresponding soft attributes to the product design during the customization process. The customization system may determine for another user that the product design should be angular and apply corresponding angular attributes to the product design. The specific attributes, soft or angular, applied to the product design may be specified in the product design, a style for the corresponding user, or in other data stored in the customization system, e.g., a database that maps qualitative input values to groups of corresponding quantitative values.

In some examples, a computer representation of a product design is by nature quantitative, but a customization system may customize the design of a shoe sole, with inherent dimensional information, with a knurled tread pattern using qualitative inputs "bold" and "angular" instead of using only specific user choices, e.g. color, or numerical or quantitative input. In some implementations, a customization system may determine qualitative data using machine learning based on user habits, e.g., products the user purchases, views, or rates.

The customization system may produce a customized product design from a product design and customization vectors plus style data inputs by selectively modifying geometry, features or attributes of the product design, e.g., specified by the customization vectors. "Selectively modifying" may mean modifying only those geometries, features, regions of purpose, described in more detail below, materials, colors, sizes, manufacturing methods or attributes of a design which are useful in creating a customized design tailored to contexts specified via the product design and customization vectors and style data and not modifying those geometries, features, regions of purpose, and other attributes which are not available to be changed via customization vectors for that product design or which do not need to be changed to create an optimized design for the given contexts and style data.

The customization system can be the arbitrator between the product designer's preferences and customization vectors for a given product and the data and rules that make up a given style that a customer may choose to apply to a product. The customization system considers the vectors, rules, data, or combination of two or more of these from a product designer and a user and performs a detailed design process that transforms the product design to yield a customized product for the user according to the style he or she has chosen to apply. The customization system applies a hierarchy of importance ranking to match style data with customization vectors. The customization system may find a "best fit" between available style data and customization vectors and context data for the product to be customized. A best fit is not necessarily an exact match. For instance, an available attribute in style data might be purple which the style rates at nine for a particular context and black which the style rates at six, but the customization vector may rank black at ten and purple at two. In this example, the customization system may select black because of the higher combined score, e.g., of fifteen, even though purple is dominant in the style.

In some examples, the customization system may apply weights to the attribute ratings. For instance, when a customization vector or a product design rate black at a seven and a style rates purple at a seven, without any other ratings of the two attributes, the customization system may use black for the color of the corresponding portion of the product design.

The customization system may use machine learning from previous customer ratings of results or other feedback data to continuously refine its decision making process and styles for a particular user or group of users, e.g., as qualitative input. In some implementations, the customization system may apply personal styles with contextual intelligence, e.g., to determine how specific attributes can be applied under different circumstances. For example, contextual intelligence may include: a) types of contexts; b) attributes to apply; and c) rules within a context that affect how attributes are applied.

Types of contexts may include but are not limited to: a) product category (e.g., fashion accessories, sporting goods, tools, personal electronics, housewares); and b) functional area, for example "grip area" or "primary aesthetic surface set," "rear or deprecated surface set," "interior or non-aesthetic or functional surface set," "logo area," and "non-modifiable area." Functional areas may be combined with product category and other attributes to achieve specific meaning or function. For example, a product in category "tools" may have a "grip area" functional area, and have attributes "high-wear area," "high strength required" and "light to moderate texture acceptable" which in combination can be used by the customization system to determine what types of personal product style attributes are applicable to a particular product design and how the attributes may be applied and changed.

In some implementations, the customization system may use selected space structures, e.g., for functional components of a customized product, ascetically pleasing components, or both. Selective space structures are three dimensional structures that can be used to make up a volume of a component or create a texture pattern on the surface of a component. The selective space structures may have substructures including fractal structures or other structures that are smaller than the larger selective space structure that they make up. The selective space structures may employ a unit cell or unit pattern element that may be repeated either verbatim, or scaled or stretched or repeated with incremental or non-incremental changes. Individual cells of a selective space structure may be integrally joined, separate (not joined), intertwined or woven together, or combinations thereof. Individual cells may or may not be based upon a consistent seed cell structure. Selective space structures may form elastic, deformable structures.

In some implementations, the customization system may initiate 3D printing of a customized product design. 3D printing can be fused deposition modeling (FDM) —also called fused filament fabrication (FFF), selective laser sintering (SLS), digital light projection (DLP), direct metal laser sintering (DMLS), selective laser melting (SLM), High Speed Sintering (HSS), electron beam melting (EBM), stereo lithography (SLA), laminated object manufacturing (LOM), inkjet head printing for powdered plaster or other media (PP), digital light processing of photopolymers (DLP), or combinations thereof.

FIG. 1A shows an example of a distributed product customization system 100a. For instance, a user device 102 may send a request to a computer 106 via a communication link 104, e.g., a network, for information about a particular product. In response, the computer 106 determines a product design for the particular product and a style for a user of the user device 102. The computer 106 customizes the product design using the style and provides instructions, e.g., via the communication link 104, to the user device 102 for a presentation of the customized product.

For instance, the user device 102 receives data indicating user input. The user input may indicate selection or modification of a style, responses to questions, e.g., received from the computer 106, selection of a product or product category to be customized, a request that a product be customized with a style, or a combination of two or more of these. In some examples, the data may indicate a selection to share a style with other people or organizations, acceptance or rejection of a customized product, or a selection to purchase a product or other transactional interactions and information.

The computer 106 processes the user input, e.g., the selection of a product or product category, a style for the user and product design data to create a customized product design which is customized for the user, as described in more detail below. The customized product design may be represented digitally in a memory of the computer 106.

When the computer 106 determines that the user has chosen to purchase the customized product or to have the customized product manufactured, the computer 106 sends the customized product design to a manufacturing system 110, using a communication link 108, so that the manufacturing system 110 produces a customized product 112 using the customized product design. The computer 106 may send the customized product design to another computer operating at or controlling the manufacturing system 110, e.g., a machine or factory that can create the customized product 112.

The user device 102 may be a computer and have processors, memory, hard drive, solid-state drive, and inputs interfaces such as touch screen, mouse, or voice input capability, brain-wave input capability (e.g., mind control). In some examples, the user device 102 may be a smartphone, a watch, or a tablet.

The computer 106 may have processors, memory, hard drive, solid-state drive, and inputs such as touch screen, mouse, or voice input capability. The computer 106 may be an internet server or some other device, computer, a processor on a computer, phone, or tablet. The computer 106 may be a virtual device or reside in the cloud shown. The computer 106 may be local to or part of the same device as the user device 102.

Figure 1B:
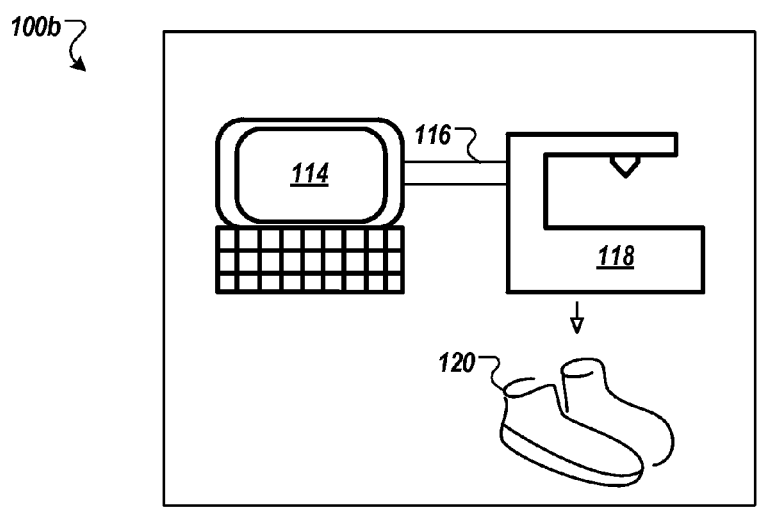

FIG. 1B shows an example of a self-contained product customization system 100b. The self-contained product customization system 100b includes a computer 114 and a manufacturing system 118 which communicates with the computer 114 via a communication link 116. In this example, all of the components of the self-contained product customization system 100b are in close physical proximity, e.g., in the same building or room of a building.

The computer 114, similar to the user device 102, may receive data indicating selection of a style for a user operating the computer 114, a product design, other user preferences, e.g., for use when creating a style for the user, or a combination of two or more of these. For instance, the self-contained product customization system 100*b* may be a kiosk, a building, a factory, a store or some other form of device or combination of devices and may receive data from the user device 102 indicating input from the user.

In this example, the computer 114 performs the actions of the computer 106 to create a customized product design. The computer 114 may include a database of product designs, a database of styles, and information about the user. In some examples, another device or other devices may include one or more of the databases.

The computer 114 provides the manufacturing system 118 with a customized product design to initiate the creation of a customized product 120. For instance, the manufacturing system 118 receives the customized product design and produces physical products such as the customized product 120. Examples of customized products 120 may include shoes or other footwear, clothing, watches, phone cases, phone components, tablet components or cases, computer mouse components, toys, fashion accessories, tools, industrial components, auto parts, bags, cases, eyewear, home furnishings, building components such as sections of buildings or homes, interior design pieces such as space dividers, wall screens, medical devices, biological organs or tissues, colonies of biological cells, electronic components, composite components, motorcycle components, bicycle components, aircraft components, machine tool components, landscaping accessories, food items such as sandwiches or desserts, other types of products, or any combination of two or more of these.

In some implementations, the self-contained product customization system 100*b* may function similarly to the distributed product customization system 100*a* except that the components and functions of the self-contained product customization system 100*b* are in close physical proximity to each other and the computer 114 may serve to both communicate with the user and control the manufacturing system 118, e.g., by sending instructions to the manufacturing system 118 that cause the manufacturing system 118 to create customized products. The computer 114 may have processors, memory, hard drive, solid-state drive, and inputs such as touch screen, mouse, or voice input capability. The computer 114 may be a computer, a processor on a computer, a phone, or a tablet, to name a few examples.

In some implementations, the user device 102 and the manufacturing system 110 are at a first location and the computer 106 is at a second location. For instance, the user device 102 may be a user's computer and the manufacturing system 110 may be a 3D printer owned by the user. The user device 102 may send information identifying the user, e.g., a user account or a style for the user, to the computer 106, e.g., a server, and information identifying a product design, e.g., selected from a web page or an application executing on the user device 102. The user device 102, the computer 106, and, optionally, the manufacturing system 110, may communicate over a network, e.g., the Internet. The user device 102, or the user's 3D printer, may receive the customized product design from the computer 106. The user device 102 may send instructions to the user's 3D printer to cause the 3D printer to create a physical version of the customized product design.

Figure 2:
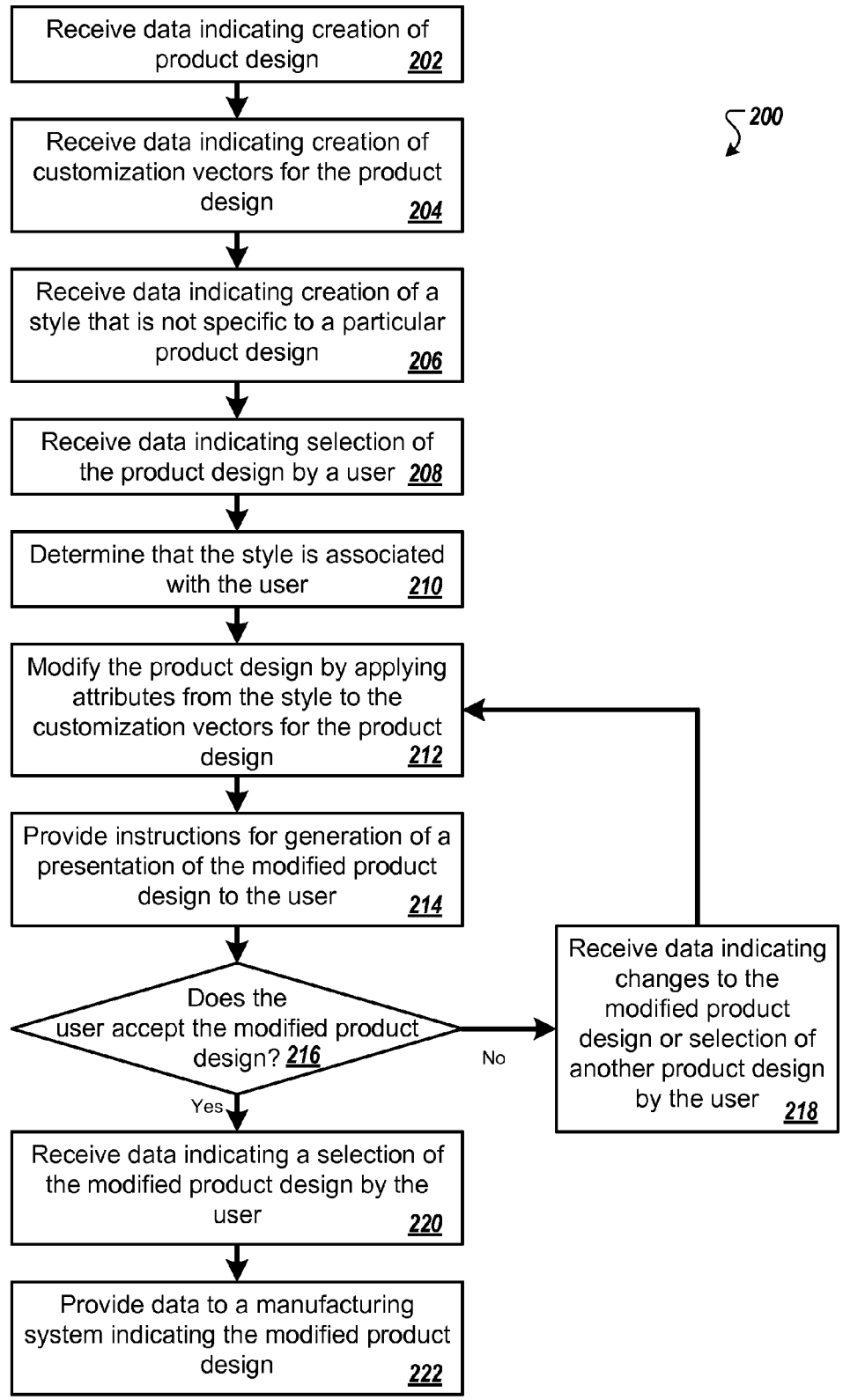
FIG. 2 shows a flowchart of a process for creating a customized product.

FIG. 2 shows a flowchart of a process 200 for creating a customized product. In some examples, the process 200 may be a product customization and purchase process. For example, the process 200 can be used by the computer 106 or the computer 114, shown in FIG. 1A and FIG. 1B respectively.

A computer receives data indicating creation of a product design (202). For instance, the computer receives data indicating creation of customization vectors for the product design (204). The product design may include a product design geometry and customization vectors. The computer may receive data indicating the product design geometry and customization vectors from one or more product designers, each using an input device such as the user device 102. The customization vectors refer to specific features and attributes of the product design and specify how those features and attributes may be changed. The computer may store data representing the product design geometry and the customization vectors in memory, e.g., a database.

In some implementations, the computer may receive some or all of the product design geometry from a scanner, e.g., via scanning of objects. In some examples, the computer may determine some or all of the product design geometric by analyzing multiple images of an object or may create some or all of the product design geometry from other digital representations of design geometry.

In some examples, the computer receives all of the data defining the product design from a product designer of a customizable product. In some implementations, a product designer may also be a customer who requests the creation of a customized product, though there are many situations where the product designer and the customer are different people or entities.

The computer receives data indicating creation of a style that is not specific to a particular product design (206). The computer may receive the data indicating creation of the style before, after, or in parallel with receiving the data indicating creation of the product design, the data indicating creation of the customization vectors, or both.

For instance, a developer may create the style before, after, or in parallel with the creation of the product design, the customization vectors, or both. A particular developer may create two or more of the product design, the customization vectors, and the style. In some implementations, different developers create each of the product design, the customization vectors, and the style. In some examples, style data for the style may be created by a user who may be a customer for customized products. In some implementations, a third party, e.g., different from the customer and the product designer of the product design, may create the style. For example, the third party may create a basic style (e.g., a pre-style) which a customer may later modify.

The computer receives data indicating selection of the product design by a user (208). The selection may be a single mouse click or one tap on a touch screen to select an image of the product design.

For instance, the computer may receive data indicating the user initiating a user session by logging into a web system provided by the computer. The computer may receive the data indicating the selection of a product in response to the user selecting the product, browsing through a list of products and selecting the product from the list, e.g., by scrolling or viewing products automatically presented by the web system or by actively searching for a specific type of product, or by choosing a product recommended by a friend. The user may select the product via clicking, tapping, striking a key, shaking, voice command, eye gestures, sensing of brain signals, or any other appropriate type of input.

The computer determines that the style is associated with the user (210). For instance, the data may indicate that the user selected a style from among multiple styles, the creation of the style uniquely for and/or by a customer, or both. In some examples, a style may contain default style data. For example, the computer may use an identifier, e.g., for a user account of the user, to determine the style. The computer may load the style data, e.g., from a memory.

In some implementations, a user device may receive information about multiple styles from the computer and present one or more of the styles to the user at a single time. The user may visually preview any product with any style.

The computer modifies the product design by applying attributes from the style to the customization vectors for the product design (212). For instance, the computer parses the customizable product design and style data for the style to create a customized product design. The computer may load the product design and the corresponding customization vectors from a memory. The loading of the product design, the customization vectors, and the style for the user may happen in any order or in parallel.

The computer may selectively apply attributes from the style corresponding to the user according to instructions for the customization vector. The term "selectively" may mean finding a best fit between available style data in the style and customization vectors for the product design. The computer may use logic, reasoning, heuristics, prioritization, best fit ranking and other appropriate methods to create the customized product design. In some examples, the customized product design may be a unique result of the product design and the style, e.g., may be unique or substantially unique to the particular user associated with the style. The computer may create the modified product design using the user's primary style, e.g., when the user has more than one style.

The computer provides instructions for generation of a presentation of the modified product design to the user (214). The computer may provide the instructions to a user device operated by the user to cause the user device to present the modified product design to the user, e.g., in a web browser or another application.

For instance, the presentation may include a preview of the modified product design to allow the user to view the modified product design. In response to the presentation of the modified product design, the computer may receive data indicating that the user wants to have the customized product manufactured, e.g., with his or her product style, and ordered the customized product with a single action. In some examples, the single action may be a click, tap, keystroke, voice command, shake, eye gesture, hand gesture, creation of a brain signal that the system may be able to sense, or any other appropriate type of input.

The computer determines whether the user accepts the modified product design (216). For instance, the user device may receive data indicating that the user selects or rejects the modified product design.

The computer receives data indicating changes to the modified product design or selection of another product design by the user (218). The data indicating the changes to the modified product design or the selection of another product design may indicate that the user does not accept the modified product design. After the computer receives the data indicating the changes to the modified product design, the computer may perform step 212, e.g., and continue with the process 200.

The computer receives data indicating a selection of the modified product design by the user (220). For instance, the selection may indicate a user request for the creation of a product using the modified product design, that the user would like to purchase a product manufactured using the modified product design, or both.

For example, when the computer receives the data indicating the selection of the modified product design, a purchase transaction may occur. In some examples, when the computer receives the data indicating the selection of the modified product design, the computer may initiate presentation of a prompt to the user asking the user whether he would like to purchase a product fabricated according to the modified design.

The computer provides data to a manufacturing system indicating the modified product design (222). For instance, the data causes the manufacturing system to create a customized product using the modified product design.

The order of steps in the process 200 described above is illustrative only, and the creation of the customized product can be performed in different orders. For example, the computer may receive data indicating the creation of the style before receiving data indicating the creation of the product design.

In some implementations, the process 200 can include additional steps, fewer steps, or some of the steps can be divided into multiple steps. For example, some of the steps of the process 200 may be performed by a first computer and other steps of the process may be performed by a second computer. In some implementations, some of the steps may be performed by more than one computer, e.g., step 212.

In some examples, receipt of data indicating creation of a style, or selection of a style, and subsequent association of the selected style with a user, may have taken place in a previous session. For instance, the selection of a style for the user may occur during a first session so that when the computer initiates another session for the user, the computer may perform both the customization and purchase processes to obtain a customized product with in response to data indicating only a single action by the user during the other session.

Figure 3:
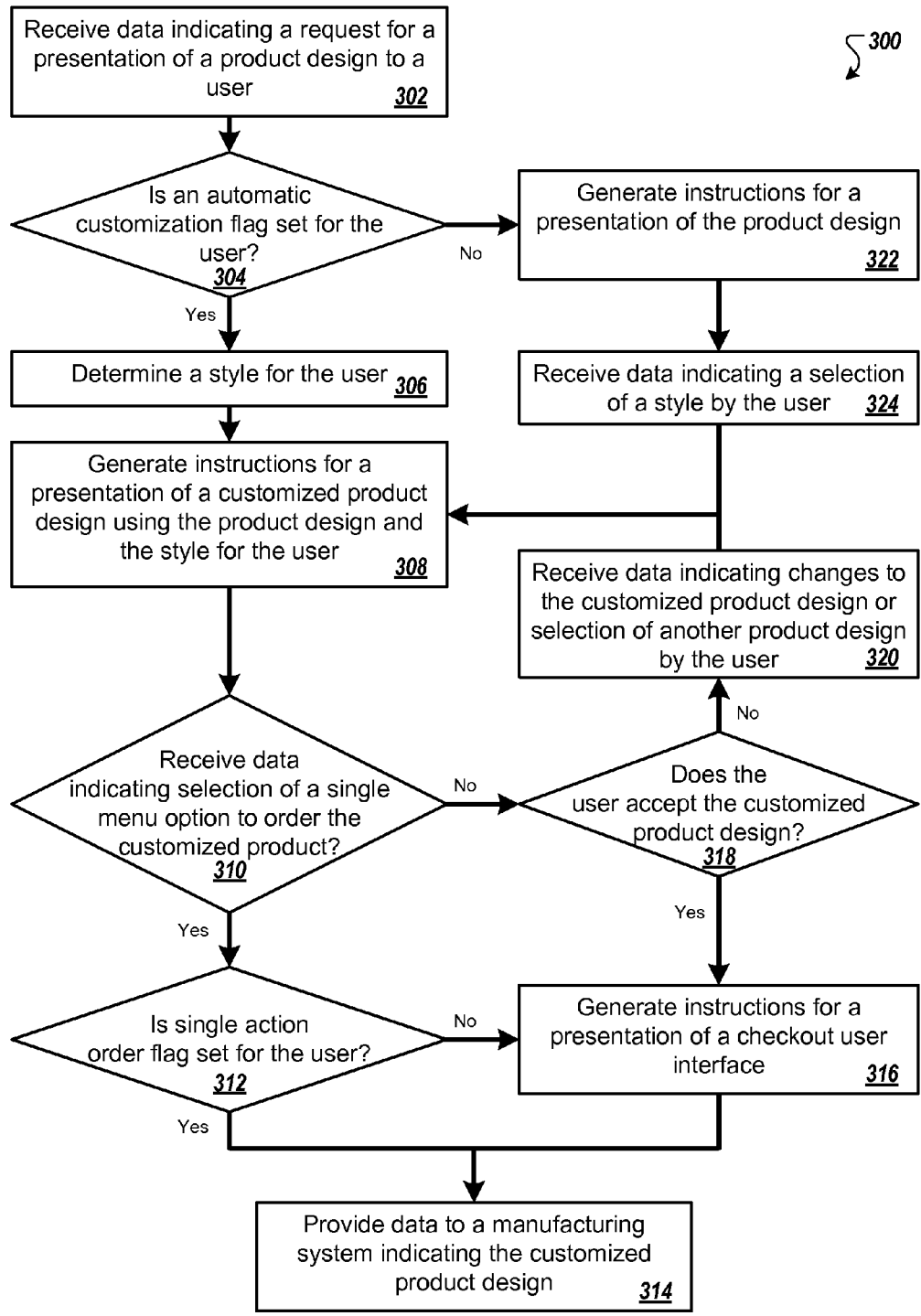
FIG. 3 shows a flowchart of a process for automatically customizing a product design.

FIG. 3 shows a flowchart of a process 300 for automatically customizing a product design. For example, the process 300 can be used by the computer 106 or the computer 114, shown in FIG. 1A and FIG. 1B respectively.

A computer receives data indicating a request for a presentation of a product design to a user (302). For instance, the computer may generate instructions for the presentation of the product design for a non-customized version of the product design and provide the instructions to a user device operated by the user, e.g., for presentation of the non-customized product to the user.

The computer determines whether an automatic customization flag is set for the user (304). In response to determining that the automatic customization flag is set for the user, the computer determines a style for the user (306). The determination of whether the automatic customization flag is set may occur before, after, or concurrently with the generation of the instructions for the presentation of the non-customized version of the product design. In some examples, when the computer determines that the automatic customization flag is set, the computer may generate instructions for a presentation of a customized product design and provides those instructions to the user device instead of the instructions for the presentation of the non-customized version of the product design. For instance, the computer may customize the product design using a previously defined or chosen style for the user, e.g., the user's preferred style, and other user preferences. The style for the user may be a style currently presented to the user, may be a style previously associated with the user, e.g., which the user previously selected, or may be another appropriate style. If the automatic customization flag is set for the user, e.g., based on user settings, all products shown to the user may be automatically customized, e.g., using a style the user previously selected as indicated in the user settings.

The computer generates instructions for a presentation of a customized product design using the product design and the style for the user (308). For example, the computer provides the instructions to the user device to cause the user device to present a user interface, which includes the customized product design, to the user.

The computer determines whether the computer receives data indicating selection of a single menu option to order the customized product (310). In response to determining that the computer receives the data indicating the selection of the single menu option to order the customized product, the computer determines whether a single action order flag is set for the user (312). For instance, the computer determines whether a single action order flag was previously set for the user, e.g., and is specified in a setting for the user.

In response to determining that the single action order flag is set for the user, the computer provides data to a manufacturing system indicating the customized product design (314). For instance, the computer completes a transaction, e.g., a purchase transaction, with the user and provides the data to the manufacturing system without requiring additional input from the user other than the selection of the single menu option.

In response to determining that the single action order flag is not set for the user, the computer generates instructions for a presentation of a checkout user interface (316). For instance, the user interface prompts the user for information regarding a shipping address and other checkout information.

In response to determining that the computer receives the data indicating the selection of the single menu option to order the customized product, the computer may determine whether the user accepts the customized product design (318). For instance, the computer may determine whether the user inputs data indicating that the user wants to purchase a customized product created using the customized product design.

In response to determining that the user accepts the customized product design, the computer may generate the instructions for the presentation of the checkout user interface (316). The computer may determine that the user has initiated a check out process that includes inputting user information, e.g., to create a user account, and provided payment information. The computer may store selected information to streamline future customization and purchase transactions with the user.

The computer may then provide data to the manufacturing system indicating the customized product design (314). After manufacturing of the customized product, the customized product design may be delivered to the user or available to the user for pick up, e.g., from a physical location other than the user's home.

In response to determining that the user does not accept the customized product design, the computer may receive data indicating changes to the customized product design or selection of another product design by the user (320). The computer may determine that the user does not accept the customized product design in response to receiving the data indicating the changes or the selection of the other product.

In response to determining that the automatic customization flag is not set for the user, the computer generates instructions for a presentation of the product design (322). For example, the computer may prompt the user to determine whether or not the user wants to customize the product design.

The computer receives data indicating a selection of a style by the user (324). For instance, the computer may receive data indicating that the user chose to customize the product design. The computer may then generate the instructions for the presentation of the customized product design. If the user decides to customize the product design, the computer may receive data indicating a selection or a definition of a style. In response, the computer may generate instructions for a representation of the customized version of the product design.

The computer may then receive input indicating the customer purchased the customized product. The computer sends data representing the customized product design to a manufacturing system to cause the manufacturing system to custom make the customized product for the user.

The order of steps in the process 300 described above is illustrative only, and the automatic customization of the product design can be performed in different orders. For example, the computer may determine the style for the user and then determine whether the automatic customization flag is set.

In some implementations, the process 300 can include additional steps, fewer steps, or some of the steps can be divided into multiple steps. For example, the computer may provide the data to the manufacturing system indicating the customized product design without providing instructions for the presentation of the customized product design, or a non-customized version of the product design, to the user device, e.g., depending on settings for the user.

Figure 4:
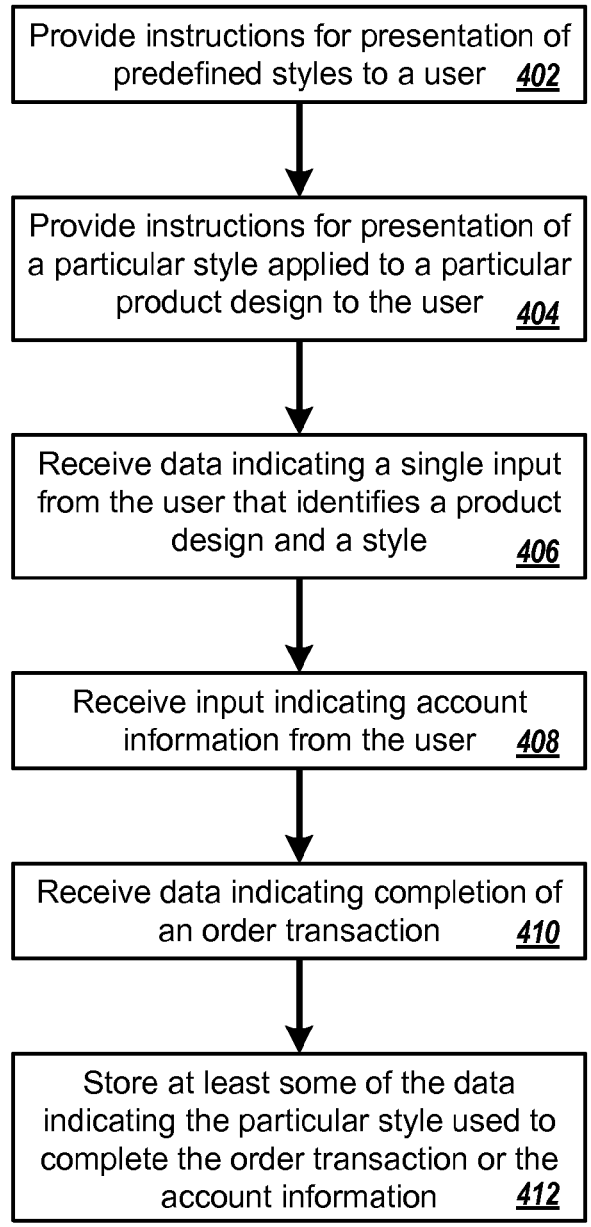
FIG. 4 shows a flowchart of a process for storing style data for a user.

FIG. 4 shows a flowchart of a process 400 for storing style data for a user. For instance, the process 400 may represent step performed during a user's first experience using a customization system. The process 400 can be used by the computer 106 or the computer 114, shown in FIG. 1A and FIG. 1B respectively.

A computer provides instructions for presentation of predefined styles to a user (402). For instance, a user device operated by the user receives the instructions and allows the user to browse through the predefined styles.

The computer provides instructions for presentation of a particular style applied to a particular product design to the user (404). For instance, the user device uses the instructions to allow the user to preview any product design with any of the predefined styles applied to the product design.

The user device may receive data indicating that the user is scrolling through the predefined styles while viewing information about a particular product design. As the user device receives the data, the user device automatically applies each of the predefined styles to the particular product design. For example, the user device may provide the computer with information about a currently selected style from the predefined styles, e.g., as the user scrolls through the predefined styles. The computer applies the currently selected style to the particular product design and provides the user device with instructions for presentation of a customized version of the particular product design using the currently selected style. In some examples, the user device may receive data indicating the user clicked or tapped a particular style to see the particular style applied to the particular product design. In some examples, the user device may receive data indicating the user clicked or tapped on different product designs to see a currently selected style applied to each of the product designs. In some implementations, the user device may receive data indicating the user selected a product design or a style using a voice command or a keystroke. The term "applied" as used here may mean that a customization system performs a set of actions to intelligently find the best fit from among available style data in a selected style to the available customization vectors associated with a product design to be customized.

The computer receives data indicating a single input from the user that identifies a product design and a style (406). For example, the user device may receive data indicating that the user selected a particular product design and a particular style with a single action which may be a click, tap, keystroke, voice command, or shake. The computer may receive the data indicating that the user selected the particular product design and the particular style from the user device or a message that identifies the single action selection by the user.

The computer receives input indicating account information from the user (408). For instance, the computer may initiate a checkout process after receiving the data indicating the user selection of the particular and the particular style. The computer may prompt the user to input user information or create a user account, e.g., by providing the user device with instructions for presentation of a user interface requesting the user information or the account information from the user.

The computer receives data indicating completion of an order transaction (410). For example, after the computer receives the user information from the user device, the computer may receive an indication of a request for a purchase transaction from the user device, e.g., which indicates that the user would like to purchase a customized product created using the particular product design and the particular style.

The computer stores at least some of the data indicating the particular style used to complete the order transaction or the account information (412). For instance, the computer stores data associating the particular style with the user account to streamline future customization and purchase transactions for the user. In some examples, the computer stores data that identifies the particular style chosen, the products browsed, product categories, and other styles the user considered.

The order of steps in the process 400 described above is illustrative only, and storing style data for the user can be performed in different orders. For example, the computer may receive input indicating the account information before providing the instructions for the presentation of the pre-defined styles.

In some implementations, the process 400 can include additional steps, fewer steps, or some of the steps can be divided into multiple steps. For example, the computer may store data associating the particular style with an account for the user without receiving data indicating completion of an order transaction.

Figure 5:
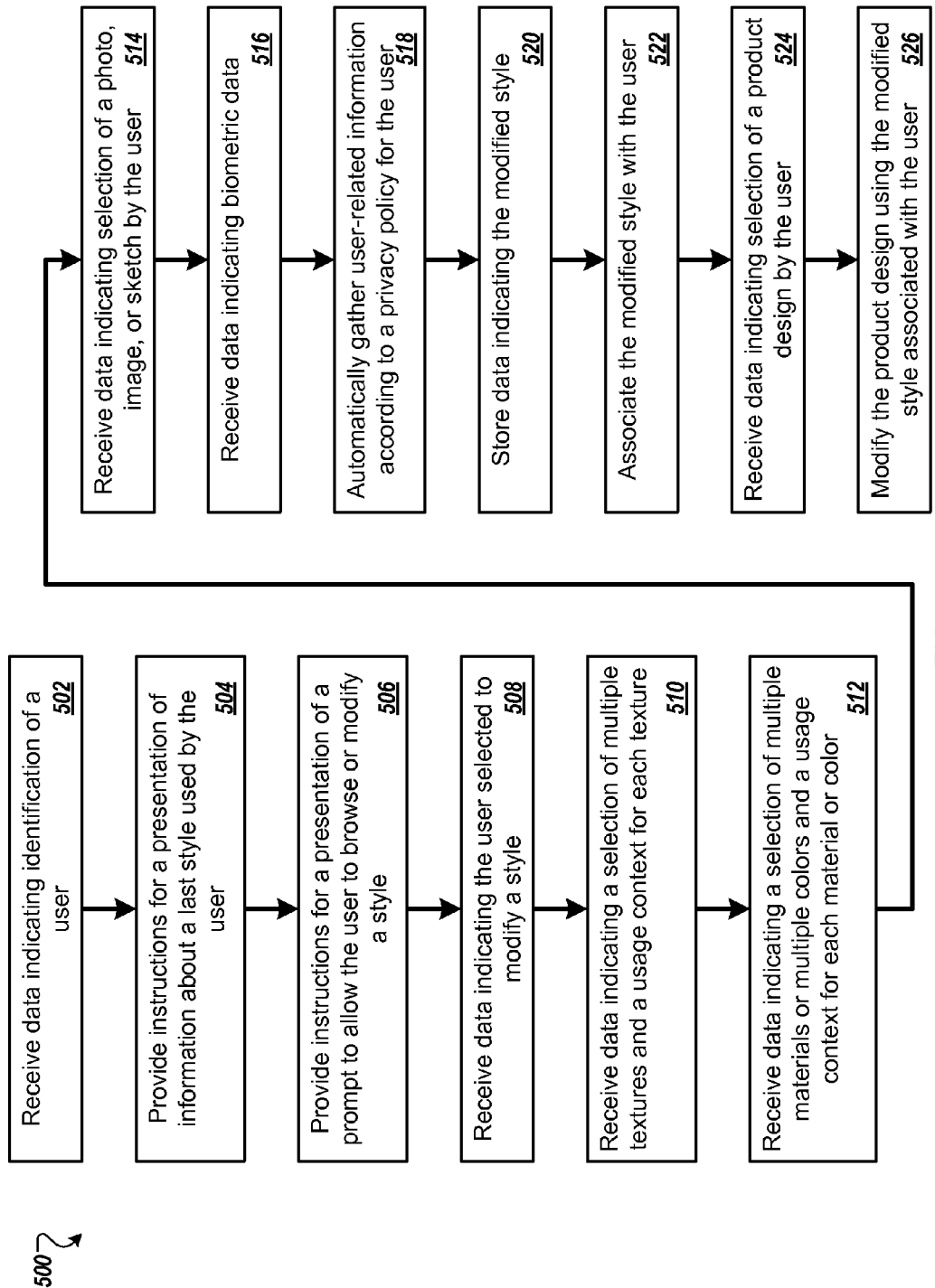
FIG. 5 shows a flowchart of a process for modifying a style.

FIG. 5 shows a flowchart of a process 500 for modifying a style. For example, the process 500 may represent a user's second, or subsequent, use of a customization system. In some examples, the process 500 can be used by the computer 106 or the computer 114, shown in FIG. 1A and FIG. 1B respectively.

A computer receives data indicating identification of a user (502). For instance, the computer receives data identifying account information for the user, e.g., received during a login process.

The computer provides instructions for a presentation of information about a last style used by the user (504). For instance, the computer, e.g., part of a customization system, automatically displays information about a last style that was used. In some examples, the computer may display information about one or more products that were previously viewed or ordered by the user.

The computer provides instructions for a presentation of a prompt to allow the user to browse or modify a style (506). For example, the computer provides the instructions to a user device operated by the user to prompts the user to browse or modify styles.

In response, the computer may receive data indicating the user selected to modify a style (508). For instance, the user device may receive data indicating the user selected an option to modify a pre-existing style and provides the data to the computer.

The computer receives data indicating a selection of multiple textures and a usage context for each texture (510). For instance, the user device may receive the data indicating the user selection of one or more textures for the pre-existing style and usage contexts for each texture and provides the data to the computer.

The computer receives data indicating a selection of multiple materials or multiple colors and a usage context for each material or color (512). For example, the user device receives the data indicating the user selection of one or more materials, one or more colors, or both, and associated usage contexts for each of the materials and for each of the colors, and provides the data to the computer. Materials are physical substances that products may be made of, for example, and may include type 304 stainless steel, Polycarbonate plastic, walnut wood, 70 shore A durometer urethane, or any other appropriate type of material.

The computer receives data indicating selection of a photo, image, or sketch by the user (514). For instance, the user device may receive the data indicating the user selection of an option to upload photos, images or sketches. The computer may receive the data, the uploaded content, or both, and create custom textures, motifs, logos or other embossable shapes from the uploaded photos, images or sketches. The computer may receive data indicating selected contexts in which to use each texture, motif, logos or embossable shape or may automatically determine the selected contexts.

The computer receives data indicating biometric data (516). For example, the user device may receive input from the user indicating the biometric data. The input may be received through a manual input methods, creation or uploading of 3D scan data for some or all of his or her body, or uploading simplified biometric data for specific uses such as foot/shoes fit data, shirt fit data or pants fit data, or uploading biometric measurements, to name a few examples. The computer receives the data indicating the biometric data from the user device.

The computer automatically gathers user-related information according to a privacy policy for the user (518). For instance, the computer may prompt the user for permission to gather user-related information or determine user preferences, e.g., for the user account, that indicate the privacy policy for the user. The computer may automatically gather, e.g., via a network from another device, the user-related information. In some examples, the computer may receive some of the user related information from an online service, such as Facebook, Instagram or Twitter.

The computer stores data indicating the modified style (520). For example, the computer completes modification of the user's style and saves the modified style for the user. The computer may store the modified style so that the modified style is only associated with the user, and not any other users. In some examples, the computer stores the modified style so that another user may view or select the modified style for their own use.

The computer associates the modified style with the user (522). The computer may associate the modified style with the user such that the modified style is the user's primary style.

The computer receives data indicating selection of a product design by the user (524). For instance, the computer receives data from the user device indicating a selection by the user to customize and purchase a product created with the modified style.

The computer modifies the product design using the modified style associated with the user (526). For example, the computer determines the product design for the selected product and creates a customized product for the user using the product design and the modified style.

The order of steps in the process 500 described above is illustrative only, and modifying the style can be performed in different orders. For example, the computer may receive the data indicating the biometric data before receiving the data indicating the selection of the textures.

In some implementations, the process 500 can include additional steps, fewer steps, or some of the steps can be divided into multiple steps. For example, the computer may perform the process 500 without gathering the user-related information, without receiving data indicating a color, or both, optionally while receiving data indicating a selecting of a material.

Figure 6:
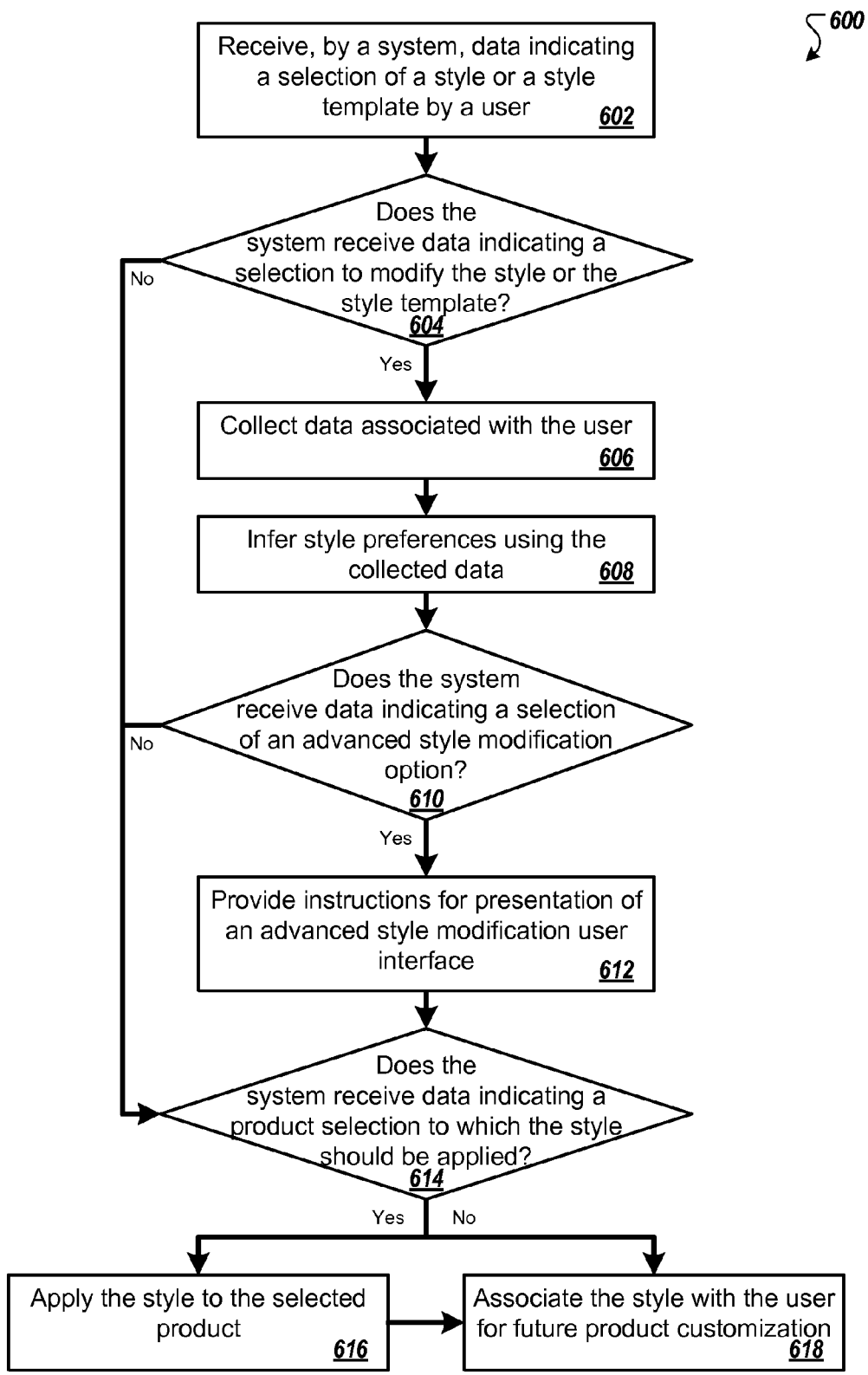
FIG. 6 shows a flowchart of a process for creating a style.

FIG. 6 shows a flowchart of a process 600 for creating a style. For example, the process 600 can be used by the computer 106 or the computer 114, shown in FIG. 1A and FIG. 1B respectively.

A computer receives data indicating a selection of a style or a style template by a user (602). For instance, a style creation process may make it easy for users to quickly and easily use, modify, and create styles and customize products. The style creation process, e.g., the process 600, may be used by customers who may purchase a product, e.g., to create a customized style, or by a style designer. For example, the process 600 may require no special design skills and very little time and effort to achieve excellent results with unique styles that are applicable to a wide variety of products. The style selected by the user may be a pre-existing style or template which the user will customize.

A style designer may typically be someone who designs products or may be someone who is a "taste-maker" and is skilled in design or artistry, or may be a general system user, e.g., a system administrator. A style designer may use the process 600 to create pre-defined styles and provide those pre-defined styles to consumers, e.g., customers of the style designer, so that the consumers have access to rich, tasteful styles and may customize products without having to create a style themselves. In some examples, a pre-defined style may be useful for brands to realize revenue via third-party manufactured products, e.g., typically 3D printed products, while maintaining brand integrity and consistency.

The computer determines whether data indicating a selection to modify the style or the style template was received (604). For instance, the data indicates whether the user wants to modify the style or style template or use the style or style template without any customizations, e.g., performed by the user. In some examples, the computer or another system may automatically customize a style or a style template selected by the user, e.g., based on information associated with the user, such as past purchases, user preferences, or biometric data.

In some implementations, the computer may receive the data indicating the selection to modify the style or the style template when a user, e.g., a style designer, is creating a new style. For instance, a user device may receive data indicating the style designer wants to create a new style, with or without using a style template, and providing data indicating the selection to the computer.

In response to determining that data indicating a selection to modify the style or the style template was received, the computer collects data associated with the user (606). For instance, the computer may perform one or more steps described below with reference to FIG. 7. The steps may collect data about the user without requiring the user to perform any action. For example, the computer may use privacy settings for the user to collect the data.

In some examples, the computer may provide a basic user interface to a user device operated by the user which allows the user to perform a "passive" creation and modification process of style data for the selected style or style template. The basic user interface may be "passive" in that the user interface does not allow a user to directly edit a style and instead prompts the user for information about the user's preferences and types of styles the user likes. The user device then provides data, representing the responses received from the user, to the computer.

The computer infers style preferences using the collected data (608). For instance, the computer modifies the selected style or style template using the collected data, e.g., the computer creates style data for a customized style for the user. The style may be specific to the user, e.g., and no other users, or for multiple users, e.g., when a style designer creates the style for others to select and apply to products.

The computer determines whether data indicating a selection of an advanced style modification option was received (610). For example, the computer determines whether the user device received a selection of an advanced user interface option. The computer may allow the user device to present both the advanced user interface and the basic user interface to a user. In some examples, the computer receives an indication of selection of either the basic user interface, or the advanced user interface, but not both.

In response to determining that data indicating the selection of the advanced style modification option was received, the computer provides instructions for presentation of an advanced style modification user interface (612). In some examples, the computer automatically provides instructions for the advanced user interface, or the basic user interface, to the user device upon receipt of a style or a style template. For example, the advanced user interface may allow the computer to perform one or more of the steps described below with reference to FIG. 8. The advanced user interface may allow direct and precise control of style creation, modification, or both.

In response to providing the instructions to the user device, the computer may receive data indicating user modification of the selected style or style template. The computer may use the data to update or create style data for the selected style or style template. The computer may store the style data and, optionally, associate the style data with the user, e.g., when the user is a consumer.

The computer determines whether data indicating a product selection to which the style should be applied was received (614). For instance, when a consumer has chosen not to modify the style using either the basic user interface or the advanced user interface, or has already modified the style, the computer determines whether the user wants the style applied to a product. The application of a style to a product, or multiple products, may be performed as part of the style creation or modification process to allow the user to view the use of the style.

In response to determining that data indicating a product selection to which the style should be applied was received, the computer applies the style to the selected product (616). For example, if the customer chooses to customize a product, the computer may apply the style data to the product to create a customized product and provide instructions for the presentation of the customized product to the user device.

In response to determining that data indicating a product selection to which the style should be applied was not received, the computer associates the style with the user for future product customization (618). In some implementations, whether or not a product is customized at this time, the computer may save the style data for use at a later time, e.g., by the user or another user.

In some example, the computer may modify a style that is specific to an individual user, e.g., a consumer, over time in response to continued collection of behavioral data, purchase data, and other data related to the user and his or her environment and activities. For example, with the user's permission, e.g., indicated in privacy settings, the computer may continually and automatically update a style with a list of the names of the user's possessions or other attributes of the possessions, e.g., size or weight. Then, when the user customizes a computer bag with her style, the computer will be able to automatically design the bag to accommodate all the devices that the user is likely to need to carry in the bag, e.g., computer, phone, tablet, audio headset, wallet, chargers, and other products, and may use the exact make, model, dimensions and other data, e.g., metadata, relevant to each device in the design of the bag.

In some implementations, the computer may use crowd-learning to modify a style over time, e.g., as qualitative input. In some examples, the computer may include context-sensitive rules in or apply context-sensitive rules to a style. The computer may add or adjust the rules associate with a style over time.

The computer may allow style creation via a cloud-based style portal. In these implementations, style data may reside in a style portal, e.g., that includes the computer, so that the style portal may modify learning-enabled styles as needed. In some examples, the computer may use learning to modify a style. For instance, the computer may use context learning to create context sensitive rules as users (e.g., the crowd) create styles, customize products with their styles, accept or reject customized products, and modify their styles or context rules.

In some examples, the computer may learn context rules by automatic analysis of many users' style adaptations and choices over time. For example, for the context "product=jacket" and a region of purpose with tags "sleeve" and "inner surface", over time the computer, e.g., style portal, may learn that textures and finishes for that context should be soft, not aggressive, and prevent a texture with associated qualitative modifiers "spiky" or "aggressive" from being used in that context for styles where users have enabled context based rules, e.g., based on crowd learning.

The order of steps in the process 600 described above is illustrative only, and creating the style can be performed in different orders. For example, the computer may associate the style with the user and then receive data indicating that the style should be applied to a product.

In some implementations, the process 600 can include additional steps, fewer steps, or some of the steps can be divided into multiple steps. For example, the computer may store the style without determining whether the style should be applied to a product, e.g., when a style designer created the style.

Figure 7:
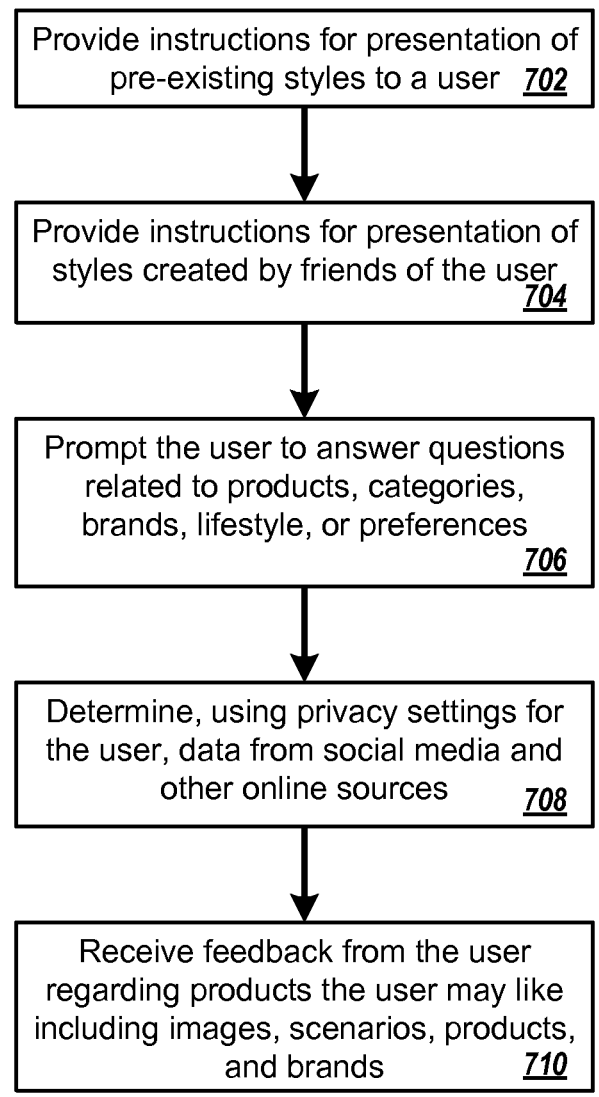
FIG. 7 shows a flowchart of a process for collecting data associated with a user.

FIG. 7 shows a flowchart of a process 700 for collecting data associated with a user. For example, the process 700 can be used by the computer 106 or the computer 114, shown in FIG. 1A and FIG. 1B respectively.

A computer provides instructions for presentation of pre-existing styles to a user (702). A user device may receive the instructions and present a user interface to the user. The user interface may include a prompt for feedback from the user that indicates whether or not the user likes a particular pre-existing style. For instance, the user interface may present a pre-existing style applied to a product to a consumer and prompt the consumer for a thumbs up, approve, or thumbs down, don't approve, response that indicates whether or not the consumer likes the pre-existing style. The user interface may apply the pre-existing style to multiple products to allow the user to have a better understanding of how the pre-existing style will look when applied to multiple different products, instead of only a single product.

The computer provides instructions for presentation of styles created by friends of the user (704). For instance, the computer may provide the instructions to the user device to prompt the user for feedback on the styles created by the user's friends. The feedback may include approval or disapproval responses, e.g., thumbs up or thumbs down responses.

The computer prompts the user to answer questions related to products, categories, brands, lifestyle, or preferences (706). For example, the computer may determine questions about the products types, product brands, or both, the user likes to determine styles typically associated with those products or brands or style attributes typically associated with those products or brands. The computer may use these styles typically associated with those products or attributes from these styles as elements of one or more styles when creating a style(s) for the user. In some examples, the computer may weight attributes in style(s) created for the user according to the prevalence of the attributes in the styles of products that the user likes. In some examples, the computer may use brand preference data, e.g., data about brands the user likes. For example, if the user likes a particular brand, the computer may create a style with materials, colors, and geometric treatments similar to the products of that particular brand.

The computer determines, using privacy settings for the user, data from social media and other online sources (708). For instance, the computer may determine that the computer may use social media data and determine "likes" and other information about the user's product preferences. In some examples, the computer may provide a prompt to the user device asking the user whether the computer may retrieve the data from the online sources. The prompt may be specific to all online data, or include separate requests for different types of online data, e.g., from web posts, social media, etc.

The computer receives feedback from the user regarding products the user may like including images, scenarios, products, and brands (710). For example, the computer may provide the user device with instructions for presentation of an image to prompt the user for responses that indicate whether or not the user likes the image, e.g., approves or disapproves of the image, to create or modify a style for the user. The computer may use the user's responses to determine styles or style data for other users who have the same preferences as the user, e.g., like the same images, dislike the same images, or both.

The order of steps in the process 700 described above is illustrative only, and collecting data associated with the user can be performed in different orders. For example, the computer may prompt the user to answer questions related to products, categories, brands, lifestyle, or preferences and then provide the instructions for the presentation of styles created by the user's friends.

In some implementations, the process 700 can include additional steps, fewer steps, or some of the steps can be divided into multiple steps. For example, the computer may perform one or more of the steps from the process 700 multiple times, e.g., in response to updated data for the user, to determine updated data for the user, or both.

Figure 8:
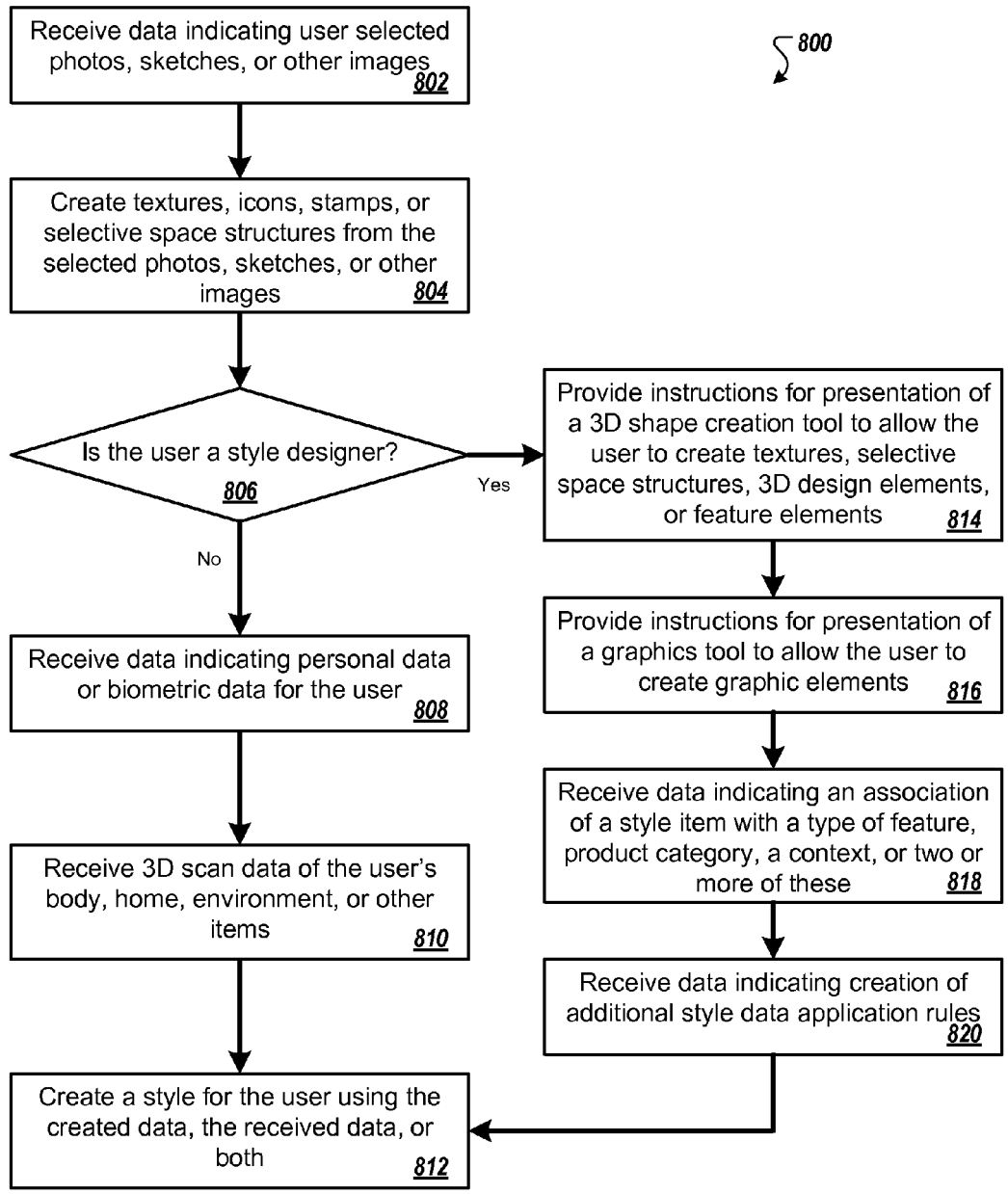
FIG. 8 shows a flowchart of a process for creating a style.

FIG. 8 shows a flowchart of a process 800 for creating a style. For example, the process 800 can be used by the computer 106 or the computer 114, shown in FIG. 1A and FIG. 1B respectively.

A computer receives data indicating user selected photos, sketches, or other images (802). For example, the computer receives the data from a user device operated by the user.

The computer creates textures, icons, stamps, or selective space structures from the selected photos, sketches, or other images (804). The computer may analyzed the received data to determine a best fit for the received data to style data for a style. For instance, the computer may determine that an image of a logo for the user best applies to an icon or a stamp. In some examples, an icon may be a visual representation of a shape that may be made in a variety of ways, for example as a graphic with distinct color. In some examples, a stamp may be a shape that is presented as relief, e.g., surface deviation, and may or may not have color distinct from the item it is applied to. In some examples, the computer may create a texture, an icon, a stamp, or a selective space structure using data indicating another type of appropriate input from the user.

The computer determines whether the user is a style designer (806). For instance, the computer determines whether the user is a consumer or a style designer, e.g., using account or login information. In some examples, the user may be both a consumer and a style designer. In some implementations, the computer may perform steps 814 through 820 for the user when the user is both a consumer and a style designer. In other implementations, the computer may perform steps 808 and 810 for the user when the user is both a consumer and a style designer unless the computer receives data indicating the user wants one or more of the style creation options available using steps 814 through 820.

In response to determining that the user is not a style designer, the computer receives data indicating personal data or biometric data for the user (808). For instance, the computer may receive data representing input from the user, or a scan or upload of biometric data from the user. In some examples, the computer may receive the biometric data from a third party system, e.g., a computer system operated by the user's doctor.

The computer receives 3D scan data of the user's body, home, environment, or other items (810). In some examples, the computer receives the 3D scan data of the user's body with the biometric data. The 3D scan data may include images of the home, environment or the other items.

The computer creates a style for the user using the created data, the received data, or both (812). For instance, the computer determines styles of products previously purchased by the user, e.g., using the 3D scan data, and sizes of products purchased by the user or sizes of space in the user's home for new products and uses this information to create the style.

In response to determining that the user is a style designer, the computer provides instructions for presentation of a 3D shape creation tool to allow the user to create textures, selective space structures, 3D design elements, or feature elements (814). The computer provides instructions for presentation of a graphics tool to allow the user to create graphic elements (816). For example, the user device uses the instructions to generate the advanced user interface.

The computer receives data indicating an association of a style item with a type of feature, product category, a context, or two or more of these (818). For instance, the style may be specific to a particular product category, such as stereo equipment or audio receivers, multiple product categories, such as audio receivers and amplifiers, or may apply to any type of product category.

The computer receives data indicating creation of additional style data application rules (820). For example, the system receives additional style data from the user device in response to presentation of the advanced user interface.

The computer then create the style for the user using the created data, the received data, or both. In some examples, the computer may classify, filter, tag, integrate, or a combination of two or more of these, all the collected data into the style.

In some implementations, the computer determines whether any rules or attributes for the style conflict with other rules or attributes for the style before creating the style. When the computer determines that two or more rules conflict with each other, the computer may prompt the user to select one of the rules to keep for the style.

The order of steps in the process 800 described above is illustrative only, and the creation of the style can be performed in different orders. For example, the computer may receive any of the data in a different order. In one example, the computer may determine that the user is not a style designer, received the biometric data, and then receive the data indicating the user selected photos, sketches, or other images.

In some implementations, the process 800 can include additional steps, fewer steps, or some of the steps can be divided into multiple steps. For example, the computer may provide the instructions for the advanced user interface without determining whether the user is a style designer.

Figure 9:
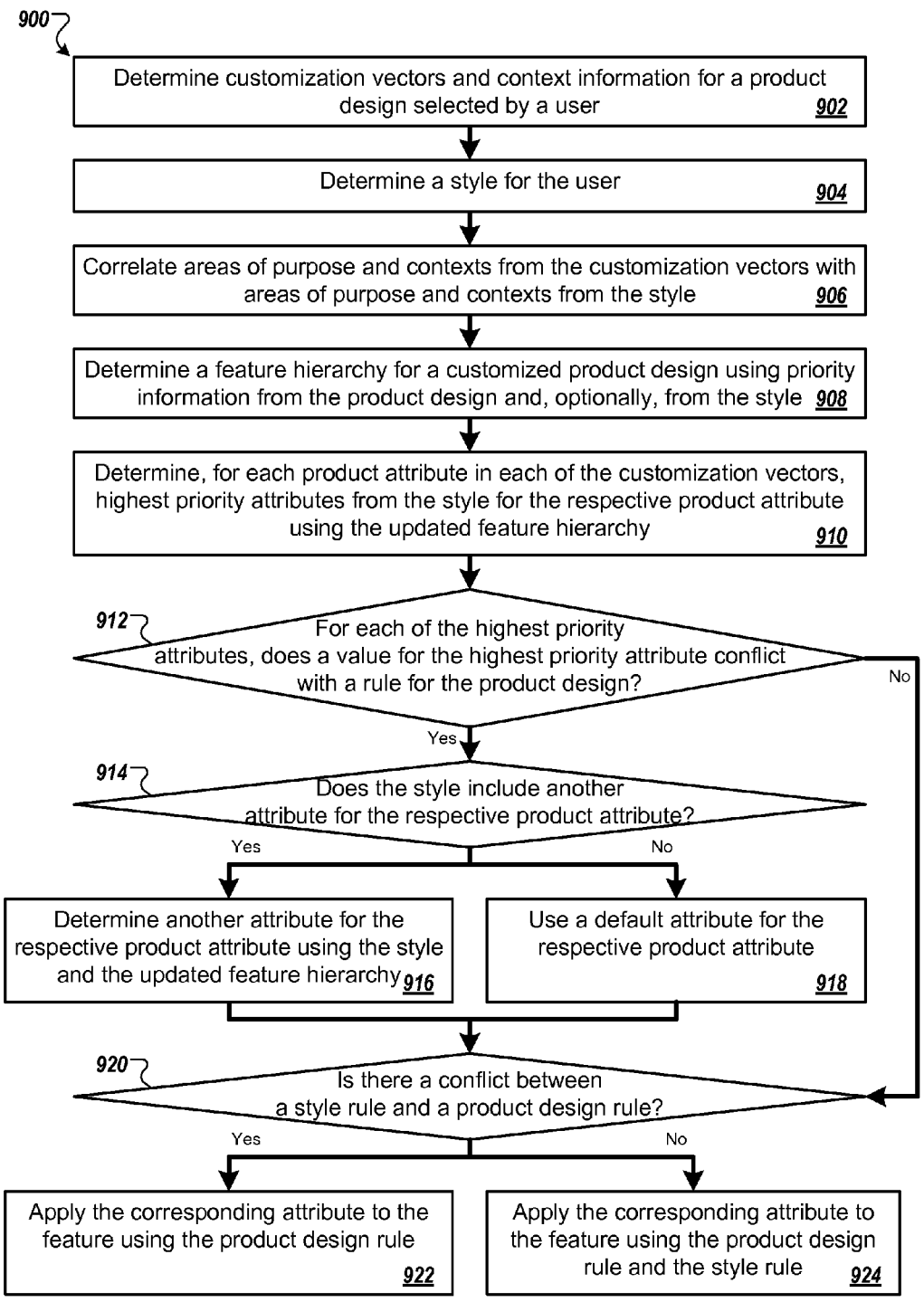
FIG. 9 shows a flowchart of a process for customizing a product design using a style.

FIG. 9 shows a flowchart of a process 900 for customizing a product design using a style. For example, the process 900 can be used by the computer 106 or the computer 114, shown in FIG. 1A and FIG. 1B respectively. For instance, the process 900 may determine whether there are conflicts between a product design and a style and resolve the conflict.

A computer determines customization vectors and context information for a product design selected by a user (902). For example, the computer loads a product design for a product that will be customized. The product design includes customization vectors and additional context information for the product to be customized.

The computer determines a style for the user (904). For instance, the computer uses an identifier for the user, e.g., user account information, to load style information appropriate to this customer.

The computer correlates areas of purpose and contexts from the customization vectors with areas of purpose and contexts from the style (906). For example, the computer may match regions of purpose and context information from the customization vectors with regions of purpose and context information from the style for the user.

The computer determines a feature hierarchy for a customized product design using priority information from the product design and, optionally, from the style (908). In some examples, the computer may create a product feature hierarchy, e.g., that describes an order in which to perform feature customization for the product design, by assessing attribute priorities from the product design. The computer may create a style feature hierarchy, e.g., that describes an order in which to perform customization actions for the style, by assessing attribute priorities from the style. In some examples, the computer may create the product feature hierarchy as an initial feature hierarchy and then create a refined feature hierarchy from the initial feature hierarchy using the attribute priorities from the style. For instance, the computer may match the most important style attributes with the most important features of the product to be customized and include those attributes higher in the refined feature hierarchy than less important attributes, e.g., from the style, the product design, or both.

The computer determines, for each product attribute in each of the customization vectors, highest priority attributes from the style for the respective product attribute using the updated feature hierarchy (910). For example, the computer may evaluate each potential match of style data, e.g., style attributes, to product customization vectors, e.g., product attributes, to determine if each attribute to be applied from the style conflicts with directives or rules from the customizable product design.

The computer determines, for each of the highest priority attributes, whether a value for the highest priority attribute conflicts with a rule for the product design (912). For instance, the computer determines whether the value indicates that the customized product should be blue but a rule for the product design indicates that the product is made from copper and cannot be painted or that the product should be red.

In response to determining, for each of the highest priority attributes, that the value highest priority attribute conflicts with a rule for the product design, the computer determines whether the style includes another attribute for the respective product attribute (914). For example, the computer determines how to resolve the conflict.

In response to determining that the style includes another attribute for the respective product attribute, the computer determines another attribute for the respective product attribute using the style and the updated feature hierarchy (916). If there is a conflict for a potential match instance, the computer may look for an acceptable alternative to the conflicting attribute, context or data within the current style.

In response to determining that the style does not include another attribute for the respective product attribute, the computer uses a default attribute for the respective product attribute (918). If no acceptable alternative is found, the computer may substitute a default attribute, context or data from the customizable product design.

If either an acceptable alternative was found, a default attribute is substituted, or if no conflict was found, the computer may evaluate each match again to find application rules for this context both from the style and from the customizable product design. For instance, the computer may determine the style rules and the product design rules for each of the product attributes in each of the customization vectors.

The computer determines whether there a conflict between a style rule and a product design rule (920). For example, the computer may check for conflicts between the application rules from the style and those from the customization vectors.

In response to determining that there is a conflict between a style rule and a product design rule, the computer applies the corresponding attribute to the feature using the product design rule (922). For instance, the computer may always apply product rules when a conflict is found, e.g., the computer may follow the application instructions from the customizable product as these may trump the style instructions.

In response to determining that there is not a conflict between a style rule and a product design rule, the computer applies the corresponding attribute to the feature using the product design rule and the style rule (924).

In some examples, the computer may interpret the net combined rules, e.g., instructions, for the current customization vector and may modify the relevant sections of the product design data and geometry using the net combined rules. If there are more customization vectors, the computer may perform one or more of steps 910 through 924 until all customization vectors, and all attributes for the customization vectors, have been acted upon.

The order of steps in the process 900 described above is illustrative only, and customizing the product design using the style can be performed in different orders. For example, the computer may create the style feature hierarchy and then create the product feature hierarchy. In some examples, the computer may determine whether there is a conflict between a style rule and a product design rule prior to determining whether a highest priority attribute conflicts with a rule.

In some implementations, the process 900 can include additional steps, fewer steps, or some of the steps can be divided into multiple steps. For example, the computer may receive data indicating a selection of the product design by the user.

Figure 10:
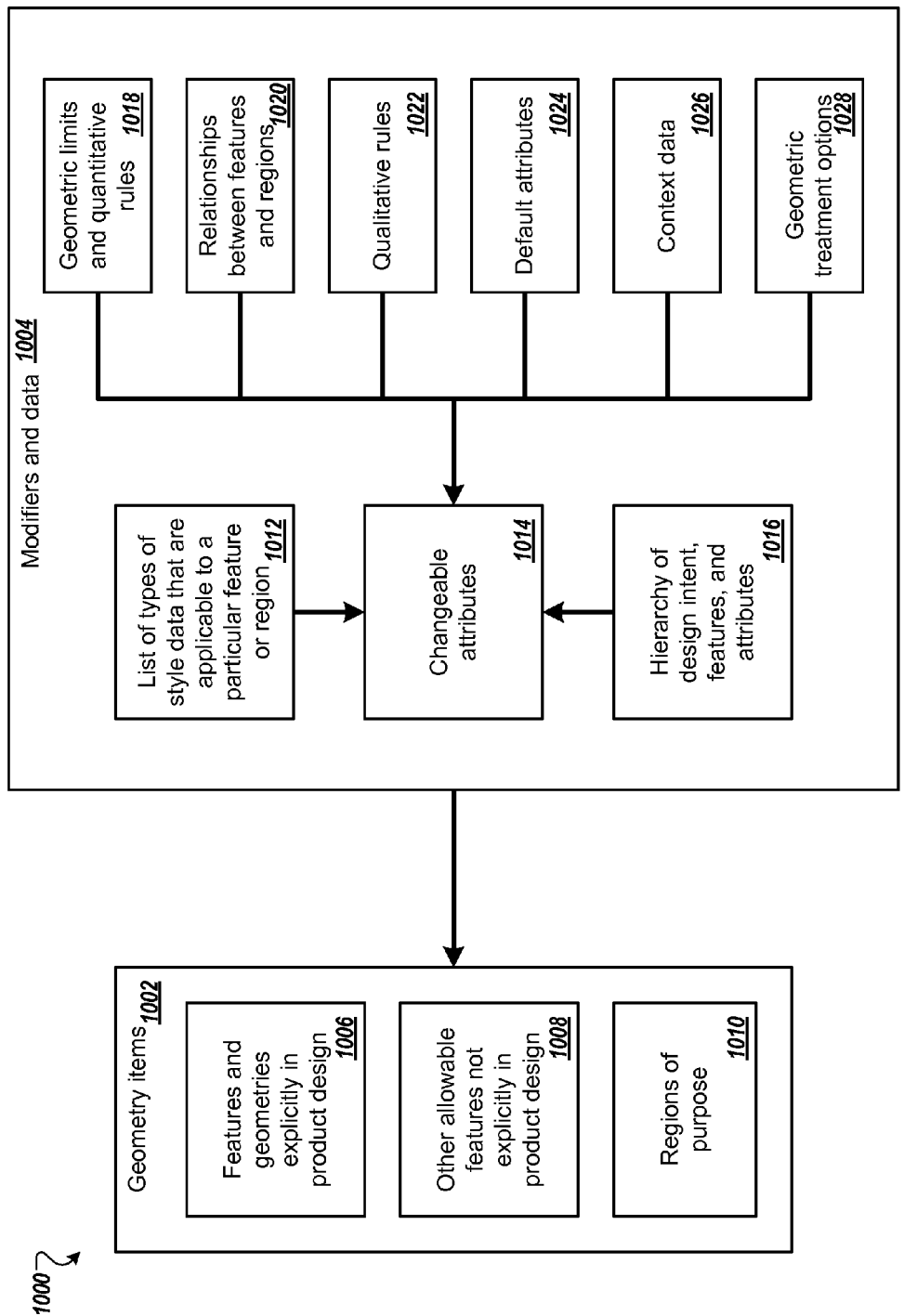
FIG. 10 is an example block diagram of customization vector data.

FIG. 10 is an example block diagram of customization vector data 1000. The customization vector data 1000 may include geometry items 1002 and modifiers and data 1004 or it may include references to the geometry items 1002 and the modifiers and data 1004, for example references to locations in a computer memory for items that are already part of a generic product design geometry or are already in computer memory for some other reason.

The geometry items 1002 may include features and geometries 1006 included explicitly in the product design, other allowable features and geometries 1008 that are not included explicitly in the product design, and regions of purpose 1010 which may be volumes, regions, portions of surfaces, groups of surfaces or areas to which it may be advantageous to apply common attributes or operations because they may share common purpose(s), function(s), or both.

The modifiers and the data 1004 may include one or more of the following: one or more lists of changeable attributes 1014 which may correspond to attributes of elements 1006, 1008, 1010, or two or more of these, for example, but not limited to, dimensions, colors, materials, textures, locations and feature treatments; lists of types of style information or data 1012 that may be applicable to each of the changeable attributes 1014; a hierarchy or prioritized list of design intent, features and attributes 1016; geometric limits and other quantitative rules 1018 that may apply to changeable attributes 1014; relationships between features and/or regions 1020 that may apply to changeable attributes 1014; qualitative rules 1022 that may apply to changeable attributes 1014; default attributes 1024 that may apply to changeable attributes 1014; context data 1026 that may apply to each changeable attribute 1014; and geometric treatment options 1028 that may apply to changeable attributes 1014.

A system may use style data, described in more detail below, with the modifiers and the data 1004 to customize and modify the geometry items 1002 to create a customized product design.

Figure 11:
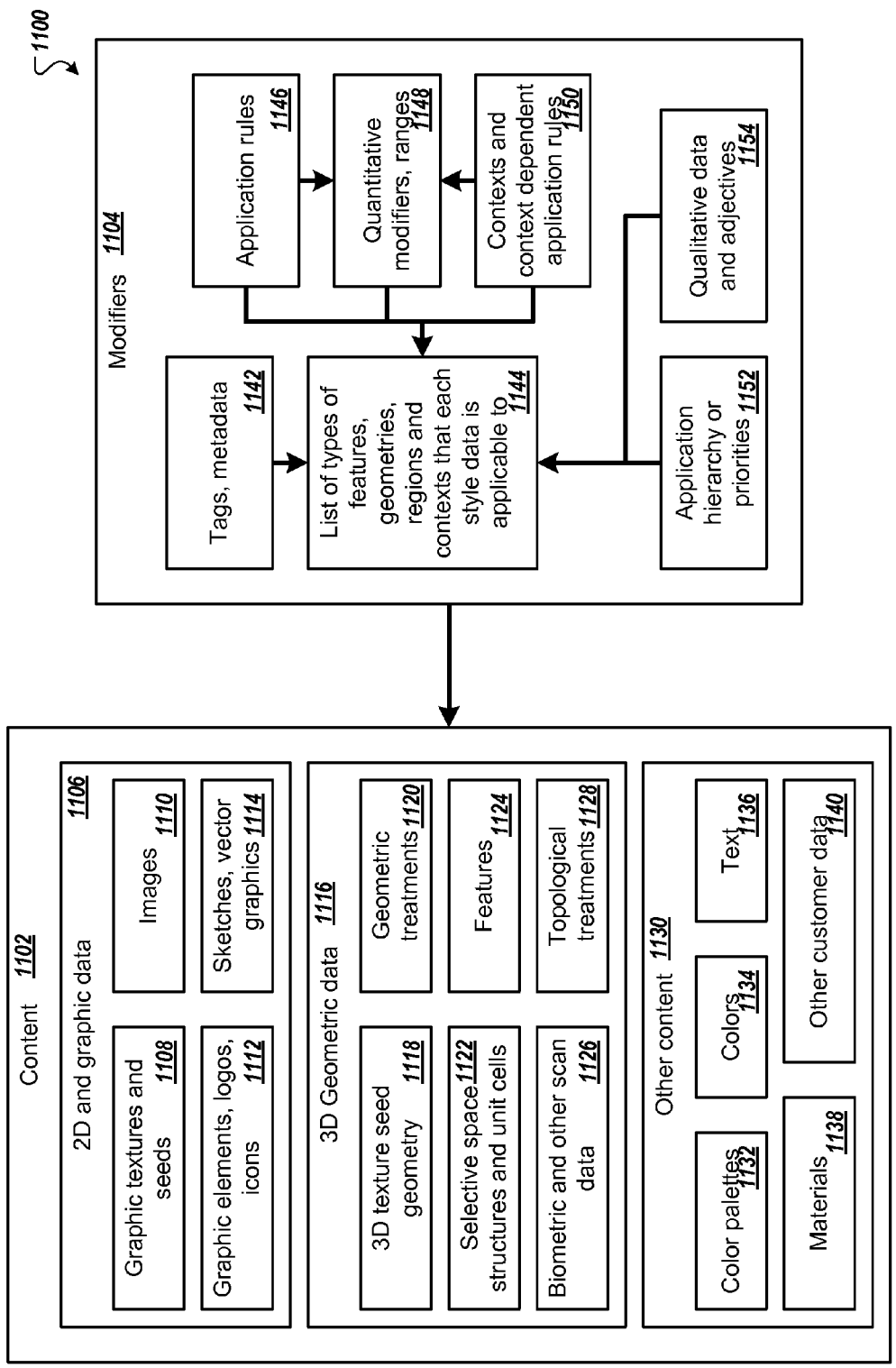
FIG. 11 shows an example block diagram of style data.

FIG. 11 shows an example block diagram of style data 1100. The style data 1100 may include content 1102 and modifiers 1104. The content 1102 may include 2D graphic data 1106, 3D geometric data 1116 and other content 1130.

The 2D graphic data 1106 may include graphic textures and texture seeds 1108, images 1110, graphic elements, and logos 1112, motifs, icons, and sketches, vector graphics and other 2D graphic information 1114. The 3D geometric data 1116 may include 3D texture and 3D texture seed geometry 1118, geometric treatments 1120, selective space structures and unit cells 1122, features 1124, biometric and other scan data 1126, and topological treatments 1128. The other content 1130 may include color palettes 1132, colors 1134, text 1136, materials 1138, and other customer data 1140.

The modifiers 1104 may include lists of types of features, geometries, regions of purpose and/or contexts that each piece of style content 1144 and the modifiers 1104 may be applicable to, tags and metadata 1142, application hierarchy or priorities 1152, quantitative modifiers and ranges 1148 including but not limited to discrete lists, maxima, minima and/or ranges, qualitative modifiers and adjectives 1154 including but not limited to adjectives, nominal application rules 1146 for both quantitative and qualitative modifiers, and contexts and context dependent application rules 1150 for both quantitative and qualitative modifiers. A customization system may use the content 1102 in conjunction with the modifiers 1104 to customize product designs by modifying their customization vectors as described in more detail above.

In some implementations, a customization system may modify a product design before storing the product design in a database, e.g., by selecting some or all of the product design data to be used for a customization vector and applying style data to the customization vector. The customization system may mark or tag the product design data, e.g., some aspect of the design, for use as a customization vector in a customization process. In some examples, the "design data" might be some edges in the product design. The system would then tag these edges as a customization vector that could have different edge treatments applied, e.g. beveled, rounded, etc., during the customization process and using a user's style.

Style attributes may include, but are not limited to: textures (embossed, debossed); logos, icons, monograms, motifs, crests; embossed photos; embossed shapes; geometry attributes: corner treatment types (e.g., fillets, radii, chamfer types, bevels sharp corners, etc.), avatars, representational shapes (e.g., cats, flowers, etc.); colors; materials; specific combinations of attributes (e.g., texture in specific material with a certain color); graphic patterns; color palettes (note that this is distinct from just favorite colors); specific toolpath patterns; selective space structures, described in more detail below; design algorithms (e.g., surfaces might be eroded or holes created according to some algorithm that can be applied in a variety of circumstances on a variety of geometries); biometric data; other input data related to preferences; other data about a person's life or circumstances (e.g., what kind of car they drive, what devices they own, room dimensions or room scan data); relationships to other people, groups or entities; and location or location patterns. One example of style data for a particular user, e.g., Jane Smith, is described below. In some examples, voluminous data files such as textures are referenced by placeholder names. For instance, the style may have a name: "Style for Jane Smith," and multiple sections such as one or more of the following: textures, graphics, embossed icons, color palettes, biometric data, and a list of products owned.

Textures may include "Texture 1: waves," "Texture 2: coarse leather," "Texture 3: paisley motif," and "Texture 4: water drops." Graphics may include "Graphic 1: fleur de lys," and "Graphic 2: floral." Embossed icons may include "Icon 1: initials," "Icon 2: posterized mountain silhouette," and "Icon 3: snowflake." Color palettes may include "Color palette 1: Primary color=salmon; Secondary color=light yellow; Tertiary color=light green; Non-aesthetic region color=white," and "Color palette 2: . . ." Biometric data may include "foot size: 7 extra wide," "hand size: 6" and scan data files. Scan data files may include links to scan data files and optional orientation and context information. In some examples, scan data may include accurate geometry representation of a user's whole body or a portion or portions of his or her body. In some examples, scan data may be simplified, adjusted or approximated geometry representation of part or all of his or her body, for example accurate scan data of a user's hand might be simplified so that the data set is smaller, e.g., has fewer geometric data points. Scan data may be smoothed, and/or scan data may be adjusted for a particular application, for example offset or be adjusted for extra space or padding so that a glove may fit and function optimally.

A list of products owned may include any type of products, such as phones, computers, and other electronic devices. In some examples, the list of products owned may include multiple products that each belong to the same category, e.g., when the user owns multiple cars.

In some implementations, a style may include preferences for a particular product category, some examples of which are described below. In some examples, each category below may optionally have specific choices for which attributes to apply in different contexts and how to apply it. For instance, for an electronic cases category, the style may specify: to use color palette 2 and apply secondary color to inside areas and apply tertiary color to graphics; to use texture 4 as primary outer surface texture with a scaling=2 mm and a texture height=1 mm; to user material 1 for primary outer surfaces with texture; to use material 2 for smooth surfaces; to use material 3 for interior surfaces; to apply embossed icon 1 for primary icon areas with action=deboss and deboss height=0.5 mm; to apply embossed image 2 for image/graphic areas with an emboss height=0.75 mm and orientation angle=normal; and to use a beveled edge/corner treatment with a bevel amount=2 mm.

In some implementations, a style may include category contextual application rules. For instance, some example categories may include: category=fashion, light, warm weather; category=fashion, cold weather; category=fashion, formal; category=fashion accessories; category=sporting goods; category=tools; category=housewares; category=footwear, formal; category=footwear, informal; category=automotive; and category=electronics. Corresponding rules may indicate attributes or requirements, e.g., identified for the user, for the types of products in the respective category.

Figure 12A:
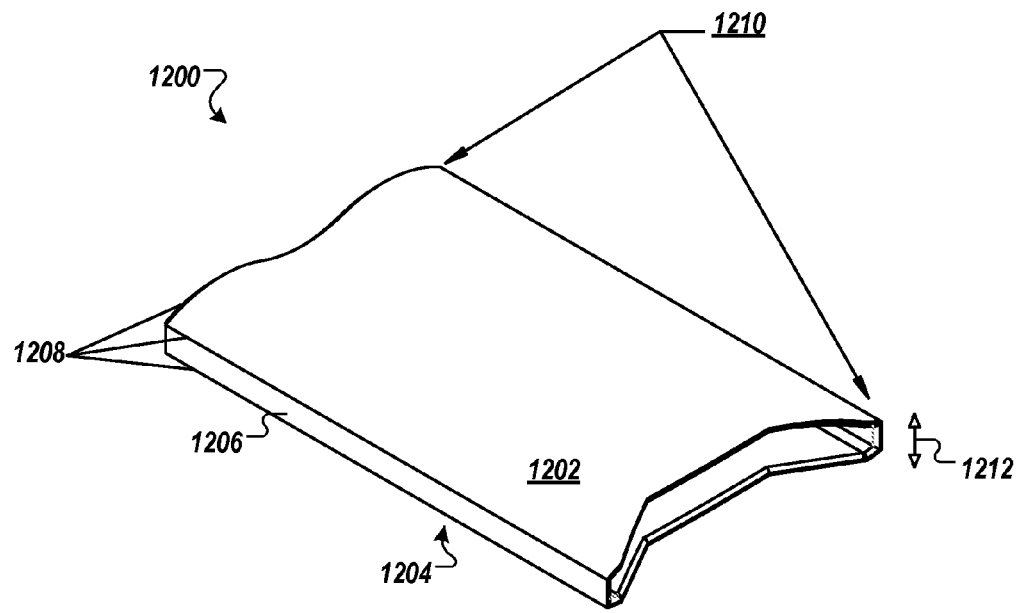
FIGS. 12A, 12B, 12C, and 12D show block diagrams of an example of a product design geometry for a customizable wallet design.

FIG. 12A shows a block diagram of an example of a product design geometry for a customizable wallet design 1200. The customizable wallet design 1200 may include the product design geometry plus customization vectors (not shown) which a customization system may use to create a customized wallet. The customizable wallet design 1200 may have customization vectors for the modification of the following: primary aesthetic top surface 1202, secondary aesthetic bottom surface 1204, side surfaces 1206, geometric treatment modifications of edges 1208 and corners 1210, changeable dimension 1212 for different contents of the customizable wallet, among others.

Figure 12B:
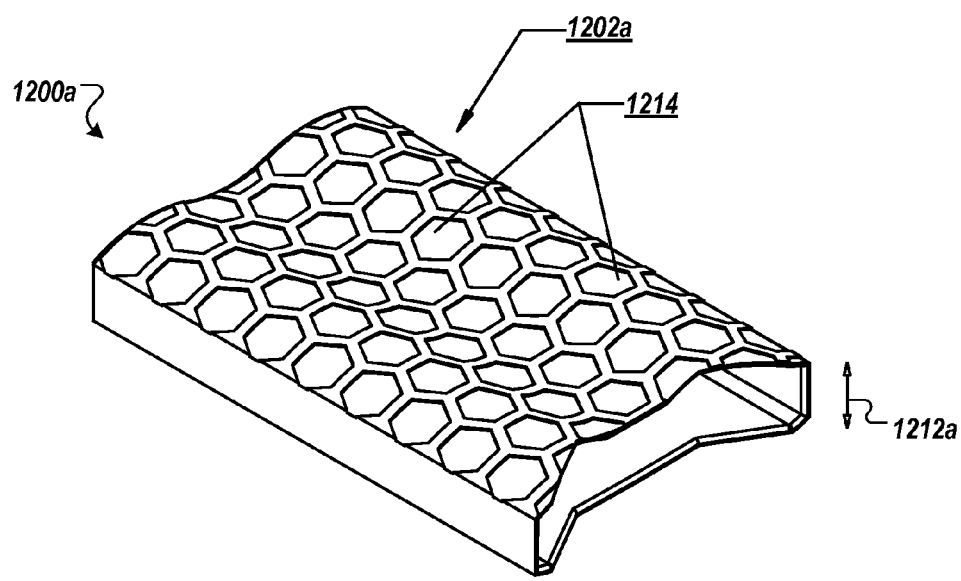

FIG. 12B shows a block diagram of a customized wallet design 1200a. The customized wallet design 1200a may be created by customizing the product design geometry for the customizable wallet design 1200 of FIG. 12A using a customization process, such as one of those described in more detail above. For instance, a customization system may apply a user's style to the product design geometry to create the customized wallet design 1200a.

The customized wallet design 1200a may have a honeycomb texture 1214 applied to the primary aesthetic surface 1202a. The customization system adjusts the changeable dimension 1212a to accommodate larger contents, e.g., a larger number of cards, using data from the style. In some examples, the style may have called for a different texture on product inner surfaces, but the customization vectors in or a rule for the customizable product design may require that the inner surfaces stay smooth, e.g., for easy access to the contents of the customized wallet, so the customization system may ignore the inner surface texture rule from the style and allow the requirement from the customizable product design to take precedence, e.g., no texture may be applied to the inner surfaces.

Figure 12C:
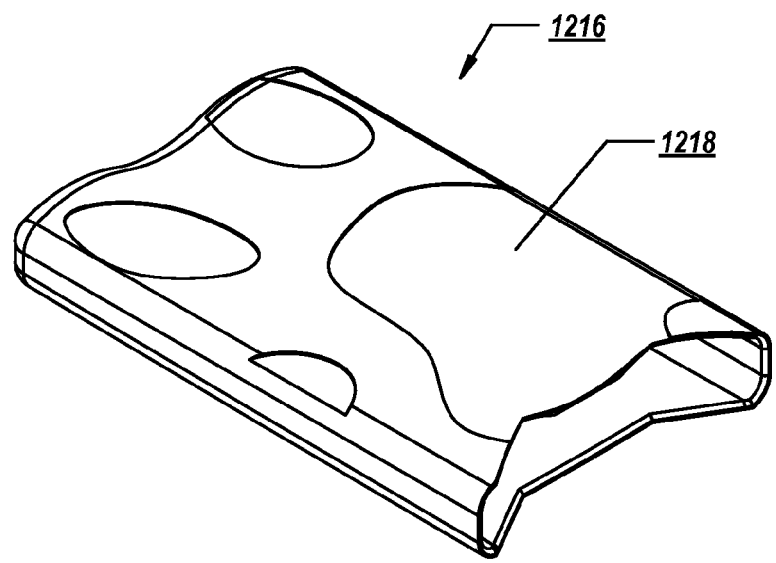

FIG. 12C shows a block diagram of an avoidable erroneous customized design geometry 1216 that would be avoided by using a well-crafted customization system. This example is provided to show how a customization system can make certain automatic decisions to generate a better customization outcome as compared to rigid application of a style alone. For instance, the customization system may create a design geometry by attempting to customize the product design geometry for the customizable wallet design 1200 of FIG. 12A without proper checks for conflicts between style attributes and customization vectors of the customizable wallet design 1200. The error in this example is that a "paw print" texture 1218 was specified in the user's style for use on primary aesthetic surfaces of accessories items and it was specified with a scale that is too large for use on a small wallet. The scale called for by the user's style causes the texture to exceed the allowable texture unit size specified in the customization vector data of the customizable design. A well-crafted customization system will catch this type of conflict and make a correction as shown in FIG. 12D.

Figure 12D:
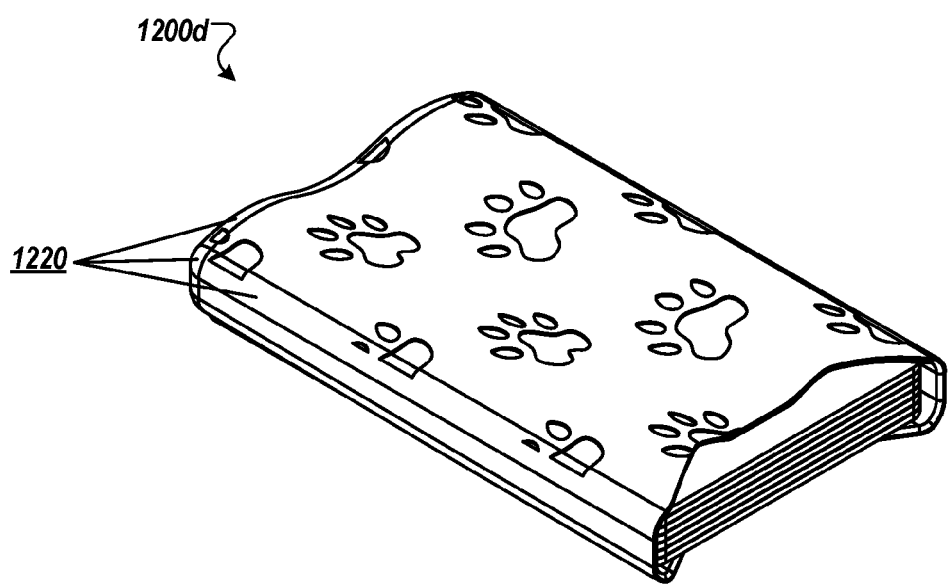

FIG. 12D shows a block diagram of a correctly customized wallet design 1200d that may be created by a well-crafted customization system. The customization system may handle the conflict in texture unit size by scaling the preferred texture from the user's style so that it may meet the requirements specified in the customization vectors for this product. Unit texture elements have been scaled down and distributed over the primary aesthetic surface. Another customization vector that may be utilized by the customization system from the user's style, and may be allowed by the customization vector data, is edge and corner treatments 1220. The sharp corners of the generic design may be replaced by the customization system with rounds according to style parameters and where allowed by the customization vectors for this customizable product design.

Figure 13A:
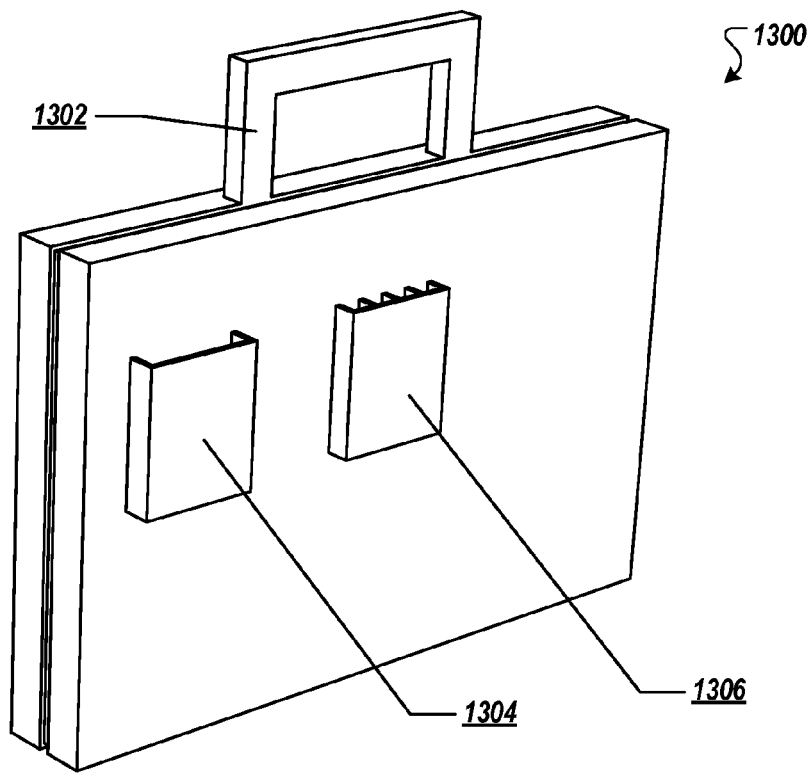
FIGS. 13A, 13B, and 13C show block diagrams of an example of a customizable case design.

FIG. 13A shows a block diagram of an example of a customizable case design 1300, e.g., a generic version of the customizable case design 1300. The customizable case design 1300 includes a handle 1302, a pocket 1304 and a divided pocket 1306. With the addition of customization vectors, the customizable case design 1300 can be customizable. Customization vectors for the customizable case design 1300 may include geometry treatments for edges, corners and faces, overall dimensions, dimensions of specific features such as the pockets and handle and topological treatments such as the use of selective space structures in certain areas.

Figure 13B:
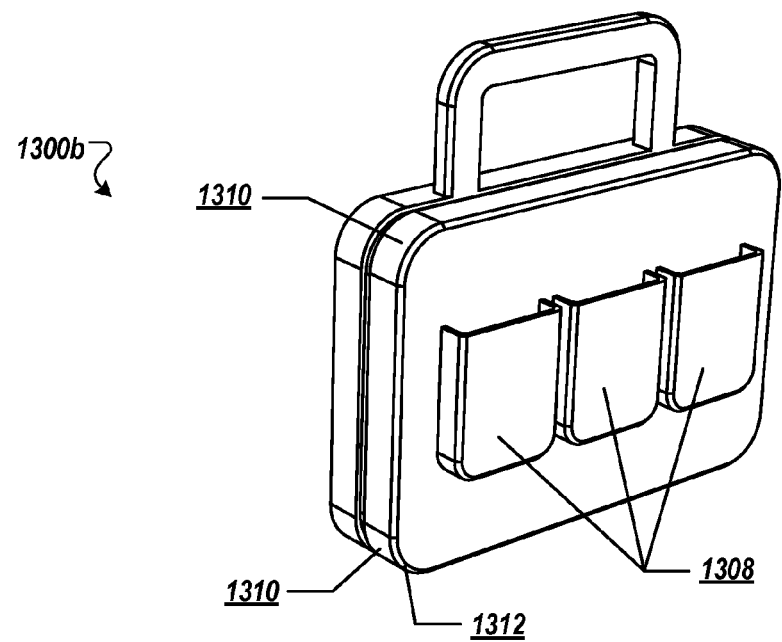

FIG. 13B shows a block diagram of a customized case design 1300b which was customized using a style. In the customized case design 1300b, a customization system may reduce the overall dimensions from the customizable case design 1300 to fit a specific model computer, e.g., laptop or tablet, that the user needs to carry (not shown) and may automatically choose three pockets 1308 with specific sizes based on devices the user typically carries, e.g., as specified by the user's style. The divided pocket was omitted. The customization system may apply a specific geometric treatment to the basic case geometry based on preferences in the user's primary style database (not shown). The customization system may use the geometric treatment to create rounded edges perpendicular to primary and secondary aesthetic surfaces with large radii 1310 and to apply a small chamfer 1312 to the resulting primary and secondary aesthetic surface perimeter edges.

Figure 13C:
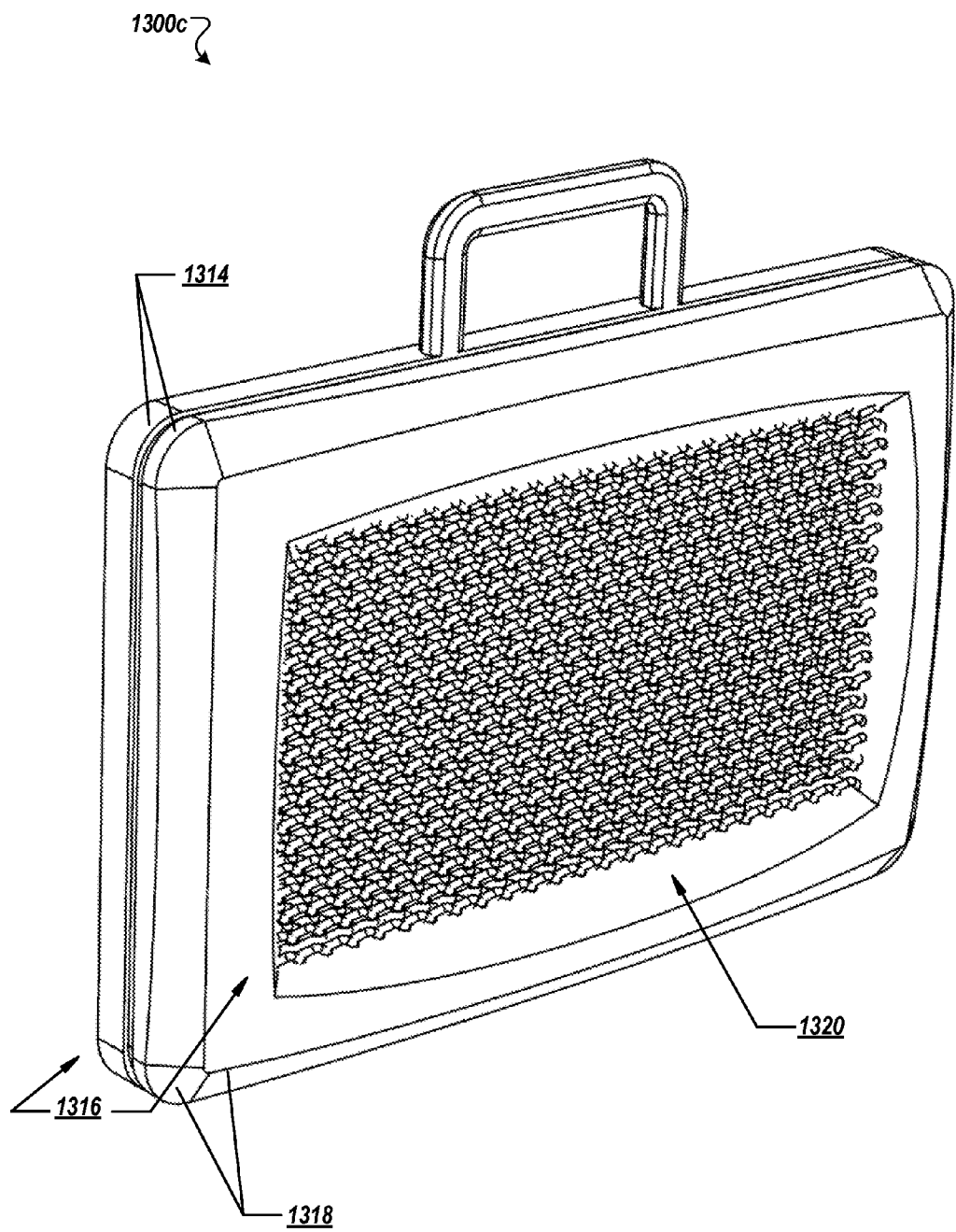

FIG. 13C shows a block diagram of a different customized case design 1300c customized using a different style. The overall dimensions were increased, from the dimensions of the customizable case design 1300, to fit a specific device identified in the user's style. The different customized case design 1300c was customized using a style that calls for a specific geometric treatment for certain features of cases. For example, the style includes "case" as a defined context and defines specific geometric features and other attributes that are to be preferentially used when customizing products that fit within that context. Edges of the product design that are perpendicular to primary aesthetic (front) surface have rounds 1314 applied with a radius chosen as percentage of the smallest dimension (in this case height) of the primary surface (in this case radius=10% of surface minimum dimension). The primary (front) surface and opposing (rear) surfaces 1316 are bulged out 20% of the case thickness. The perimeters of surfaces have large bevels 1318 applied. Primary and opposing surfaces 1316 have insets filled with a selective space structure 1320 specified in this style database with a scale factor such that the height of the seed shape of the selective space structure is 5% the size of the minimum dimension of the primary and opposing surfaces 1316. External pockets were omitted as called for by this user's style for this context. Many other customization details and methods based on user style data that are not shown here may be implemented by the customization system.

FIGS. 14 through 17 show examples of four customizable products and corresponding customized products customized with two different styles, e.g., for two different users. The styles will be referred to as style A and style B. In some examples, style data can be complex and lengthy. Only a small subset of the possible and typical style data is discussed here for purposes of a brief example.

Style A calls for a texture (texture A) to be applied to all aesthetic surfaces that don't have other additional functional texture requirements. It calls for a white stripe across the aesthetic surfaces running parallel to the longest dimension of the product. It also calls for a personal motif to be placed in a prominent area, preferably an area on each product designated for logos or icons.

Style B calls for a texture (texture B) to be applied to primary aesthetic surfaces only. It also calls for a selective space structure to be applied to either secondary aesthetic regions or regions that call for selective space structures or regions that require a rough texture. It also calls for a logo to be applied to a region where a logo is acceptable if one exists. Style B also contains biometric data about its user including hand size, body measurements for tailoring clothes and foot scan data.

Figure 14A:
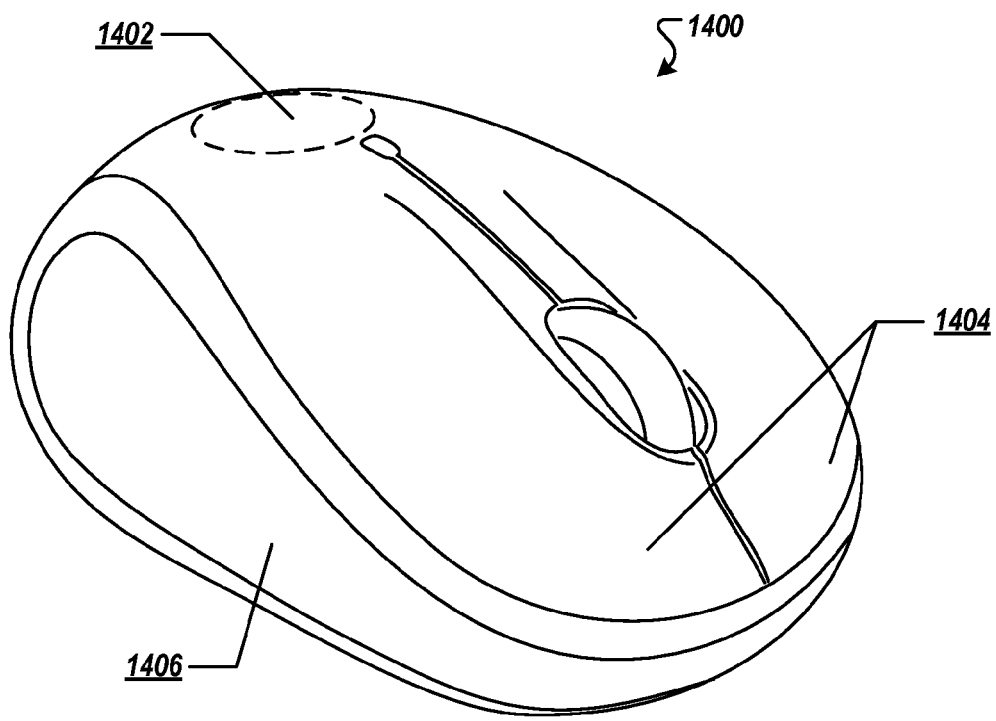
FIGS. 14A, 14B, and 14C show block diagrams of an example of a customizable computer mouse design.

FIG. 14A shows a block diagram of an example of a customizable computer mouse design 1400 which includes generic design geometry and customization vectors and associated data. One customization vector describes an area 1402 which is defined as an area where a logo may be applied. Another customization vector describes a region of purpose 1404 which is tagged in customization vector data as a primary aesthetic surface. Another customization vector may describe a region of purpose 1406 which is tagged in customization vector data both as a secondary aesthetic surface and as a grip surface. The overall size and dimensions of customizable computer mouse design 1400 may be customizable. Many other customization vectors are possible (and likely) for this product and other products. A small subset has been described here for brevity.

Figure 14B:
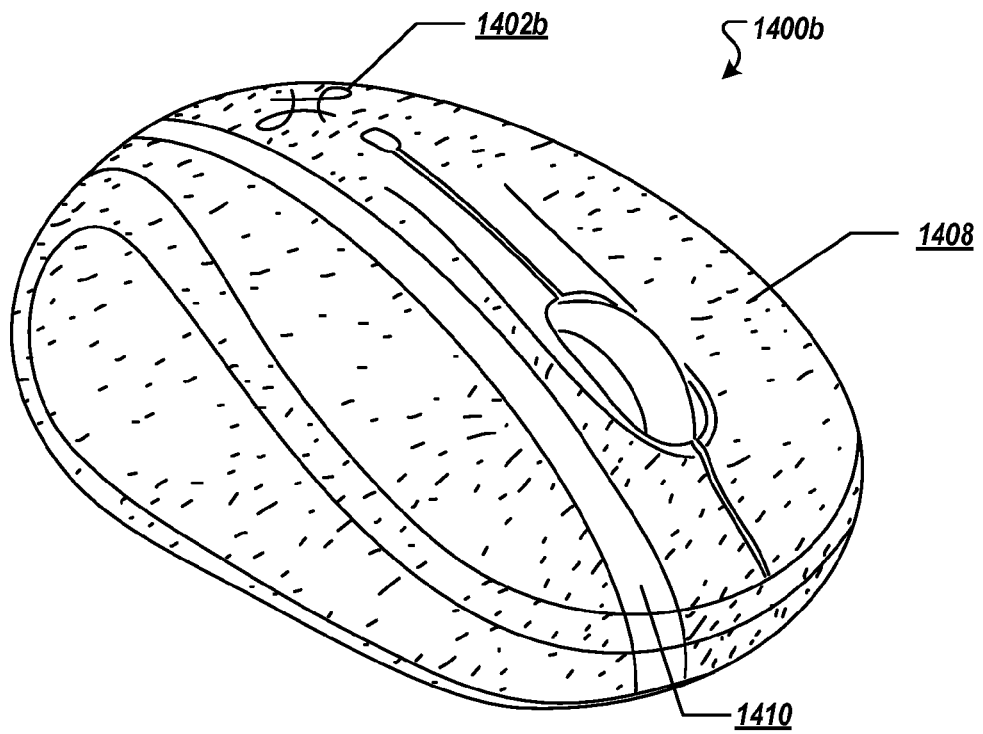

FIG. 14B shows a block diagram of a customized computer mouse design 1400b which is a modified version of the customizable computer mouse design 1400 of FIG. 14A. A customization system generates the customized computer mouse design 1400b by applying style A as described above to customizable computer mouse design 1400. A texture 1408 (texture A) has been applied according to style A, and a logo 1402b has been applied in the appropriate area. A stripe 1410 has been applied parallel to the longest dimension of customized computer mouse design 1400b across all applicable areas, surfaces or regions of purpose specified in customization vectors for the customized computer mouse design 1400b.

Figure 14C:
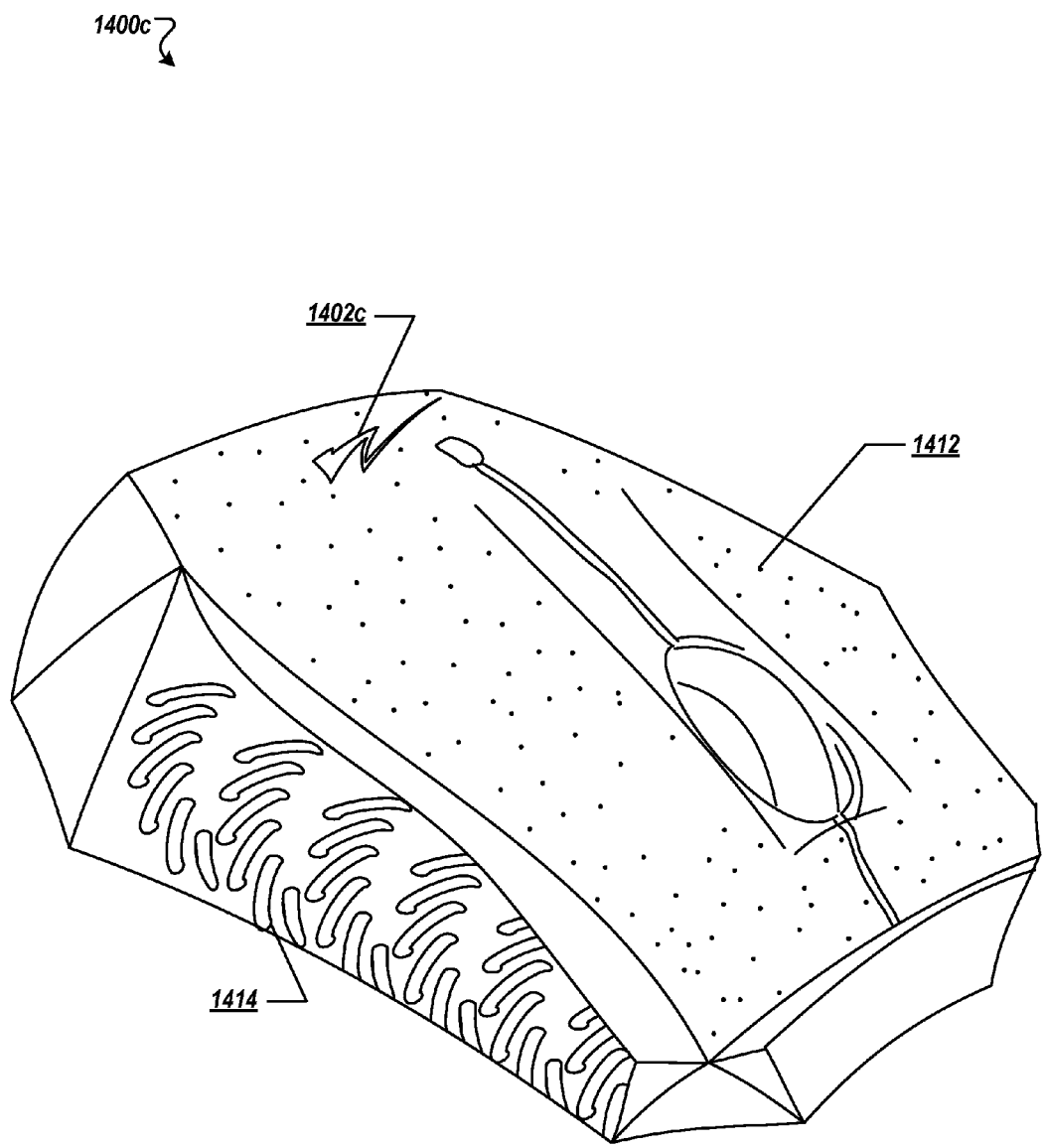

FIG. 14C shows a block diagram of a second version of a customized computer mouse design 1400c which is a modified version of the customizable computer mouse design 1400 of FIG. 14A. A customization system generated the second customized computer mouse design 1400c by applying style B as described above to the customizable computer mouse design 1400. A texture 1412 (texture B) has been applied according to style B, and a motif 1402c has been applied in the appropriate area. A selective space structure has been applied as a texture 1414 to grip surfaces on the sides of the mouse according to style B. The customization system has sized and oriented the selective space structure according to the size of the surfaces available. The design geometry of the second customized computer mouse design 1400c has been generated using an angular geometric treatment from Style B applied to design geometry of the customizable computer mouse design 1400. The overall size of the customized computer mouse design 1400c has been modified by a customization system according to hand size biometric data in style B.

Figure 15A:
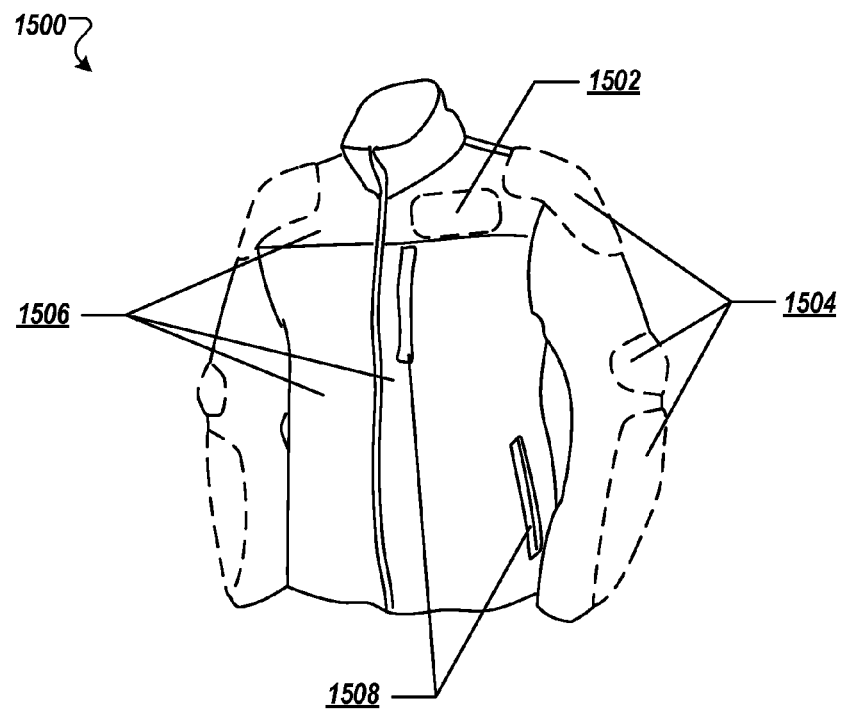
FIGS. 15A, 15B, and 15C show block diagrams of an example of a customizable jacket design.

FIG. 15A shows a block diagram of an example of a customizable jacket design 1500 which includes generic design geometry and customization vectors and associated data. One customization vector is an area 1502 designated for logo or motif placement. Another customization vector describes a set of areas or volumes 1504 which are designated for optional protective guards or aesthetic patches. Patches or guards of any shape or material may be added within the defined areas or volumes 1504. Another set of customization vectors describe regions of purpose 1506 each of which has associated tags such as "primary upper aesthetic surface", "primary lower aesthetic surface", "arms", etc. Another customization vector describes a set of regions of pocket trim 1508. Other customization vectors include specific fit dimensions that may be adapted to measurements or biometric data. Many other customization vectors are possible (and likely) for this product and other products. A small subset has been described here for brevity.

Figure 15B:
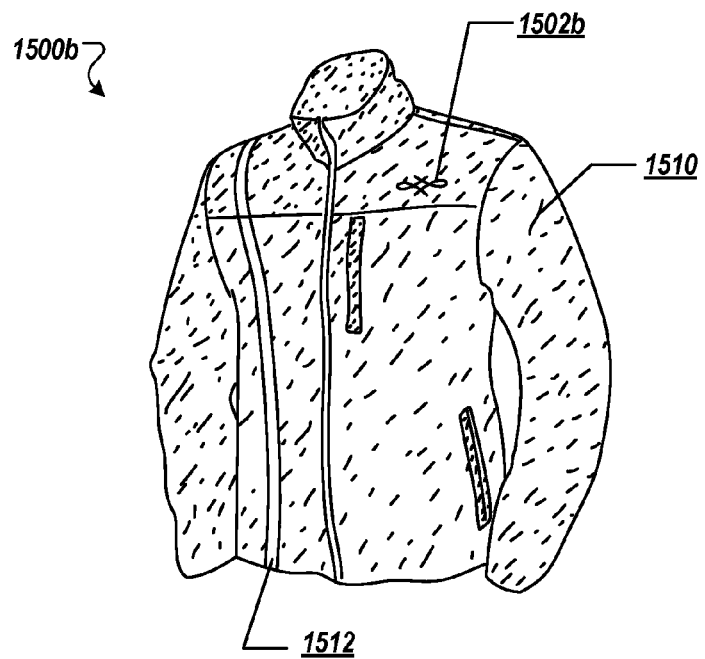

FIG. 15B shows a block diagram of a customized jacket design 1500b which is a modified version of the customizable jacket design 1500 of FIG. 15A. A customization system generates the customized jacket design 1500b by applying style A as described above to customizable jacket design 1500. A texture 1510 (texture A) has been applied to relevant regions of purpose according to style A and customization vectors. The customization system applies a logo 1502b in the appropriate area corresponding to customization vector for the area 1502. A white stripe 1512 has been applied parallel to the longest dimension of the customized jacket design 1500b across all applicable areas, surfaces or regions of purpose specified in customization vectors for customized jacket design 1500b.

Figure 15C:
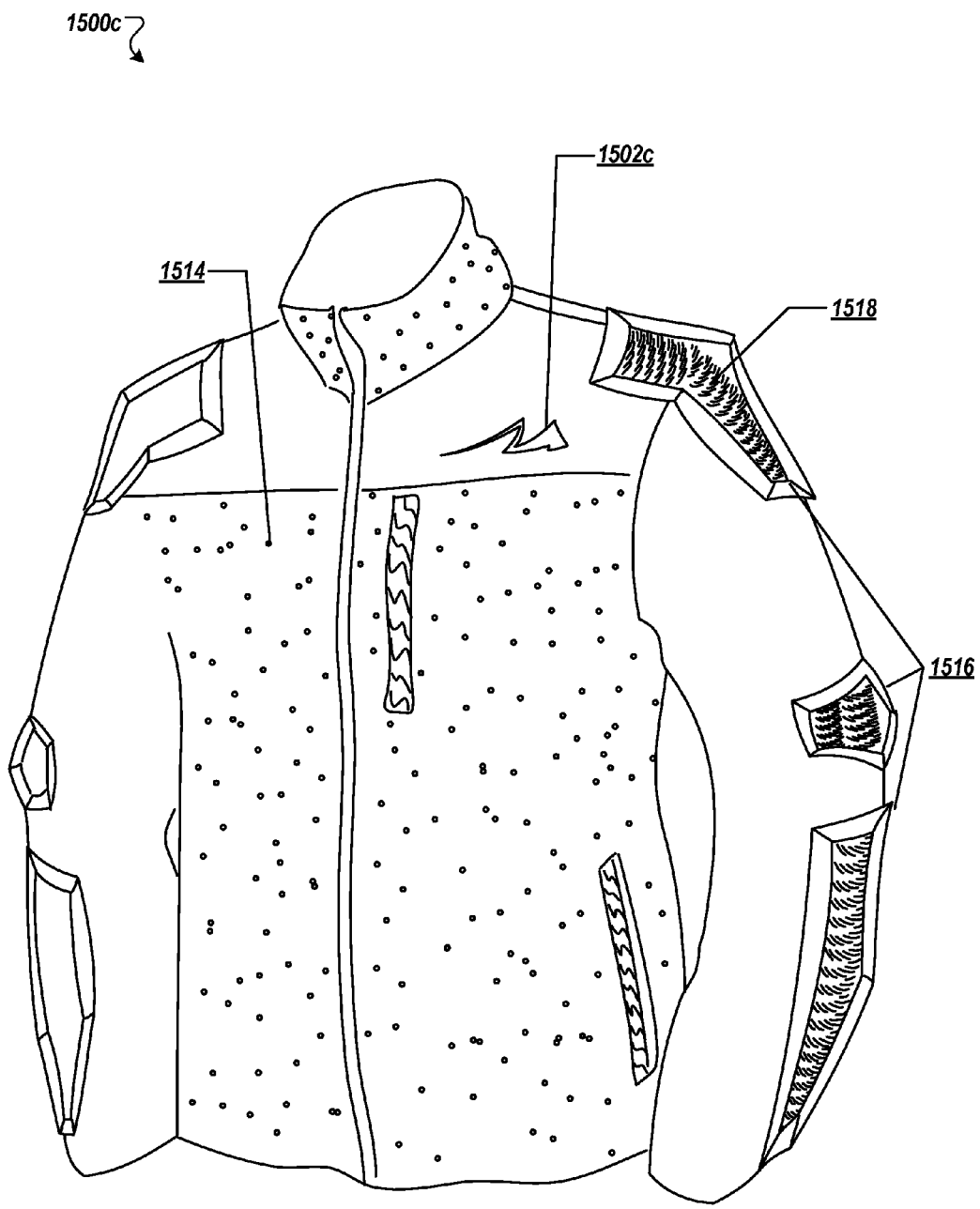

FIG. 15C shows a block diagram of a second version of a customized jacket design 1500c which is a modified version of the customizable jacket design 1500 of FIG. 15A. A customization system generates the customized jacket design 1500c by applying style B as described above to customizable jacket design 1500. A texture 1514 (texture B) has been applied to largest primary aesthetic surfaces according to style B, and a motif 1502c has been applied in the appropriate area. Armor patches 1516 have been applied according to customization vector for the areas or volumes 1504. The armor patches 1516 have a geometric treatment from Style B and also have a selective space structure texture 1518 applied according to style B. The customization system has sized and oriented the selective space structure according to the size of the surfaces available and orientation information for the product in the generic product design. The overall size of customized jacket design 1500c has been modified by a customization system according to biometric data in style B.

Figure 16A:
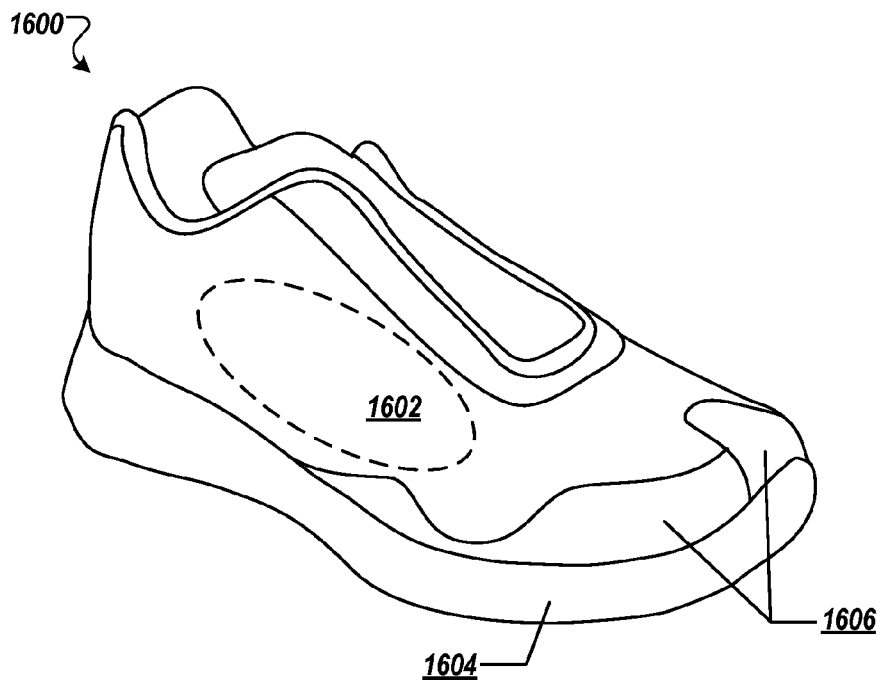
FIGS. 16A, 16B, and 16C show block diagrams of an example of a customizable shoe design.

FIG. 16A shows a block diagram of an example of a customizable shoe design 1600 which includes design geometry plus customization vectors and associated data. For example, one customization vector describes an area 1602 designated for logo or motif placement. Another customization vector describes a set of areas or volumes 1604 which are designated as "sole" and "grip areas" and requiring elastic properties such as a mechanical spring constant of 200 pounds-force per inch, per square inch of sole area. A sole design of any shape or material may be added within the defined volumes of 1604 provided it meets all the specified criteria from the customization vectors.

Another set of customization vectors describe region of purpose 1606 which his tagged as "primary aesthetic surface". Another customization vector may describe a set of regions tagged as "secondary aesthetic surfaces". Other customization vectors include specific fit dimensions that may be adapted to measurements or biometric data. Many other customization vectors are possible (and likely) for this product and other products. A small subset has been described here for brevity.

Figure 16B:
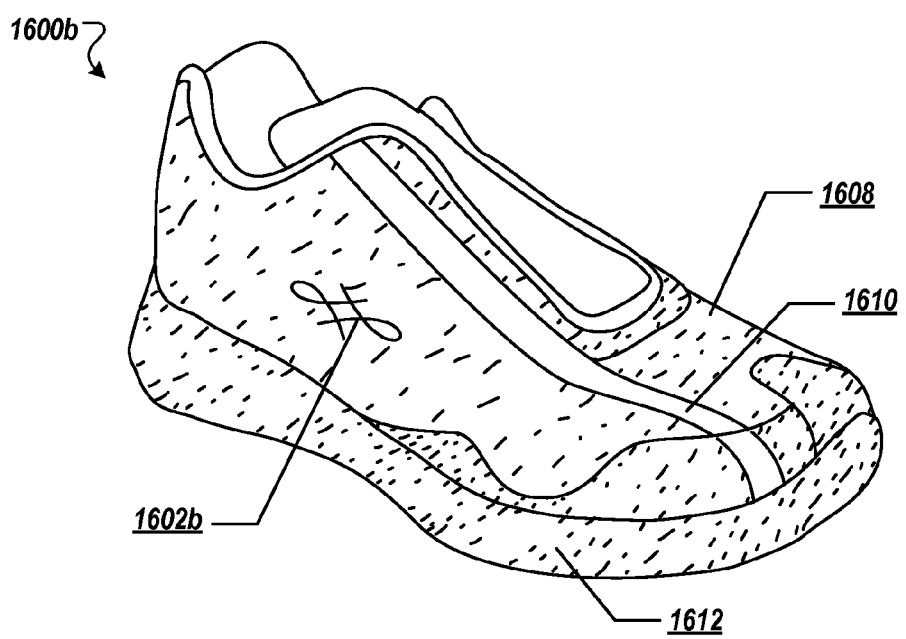

FIG. 16B shows a block diagram of a customized shoe design 1600b which is a modified version of the customizable product design 1600 of FIG. 16A. A customization system generates the customized shoe design 1600b by applying style A as described above to customizable shoe design 1600. A texture 1608 (texture A) has been applied to relevant regions of purpose according to style A and customization vectors. The customization system applies a logo 1602b in the appropriate area 1602 corresponding to logo customization vector. A white stripe 1610 has been applied parallel to the longest dimension of the customized shoe design 1600b across all applicable areas, surfaces or regions of purpose specified in customization vectors for the customized shoe design 1600b. A sole 1612 utilizes the default basic geometry and has the texture 1608 applied to it.

Figure 16C:
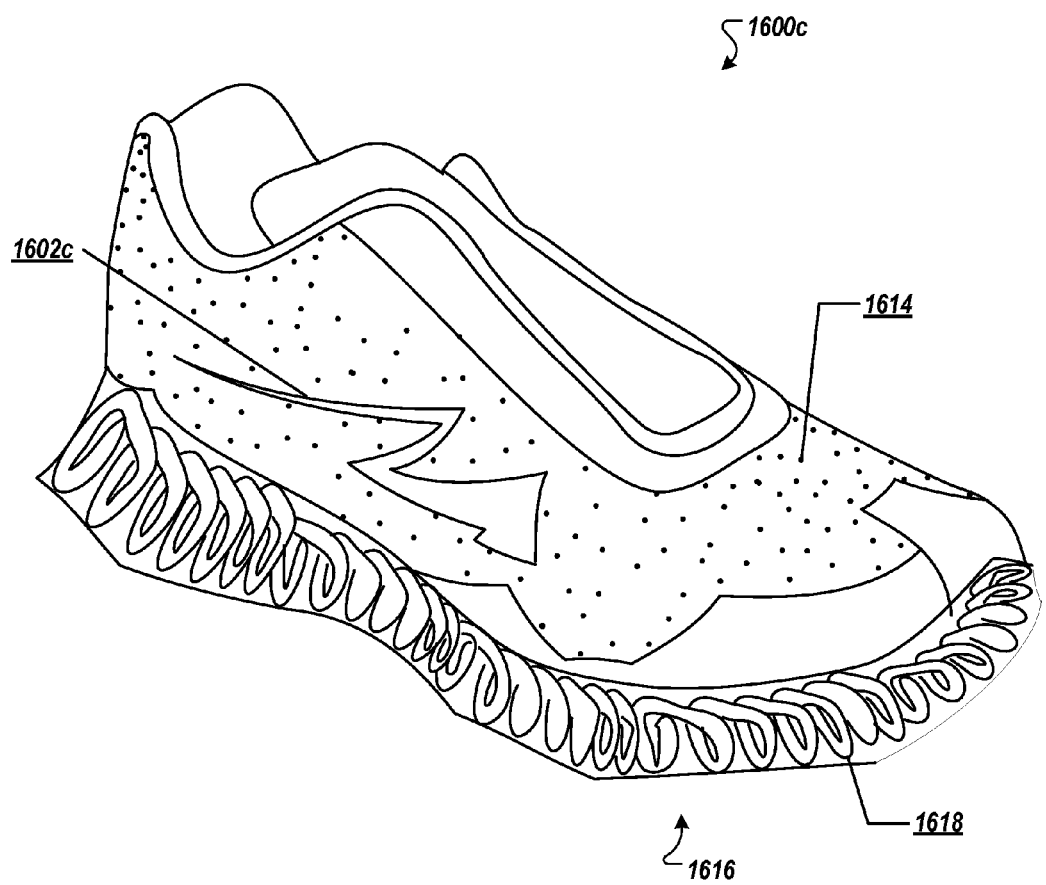

FIG. 16C shows a block diagram of a second version of a customized shoe design 1600c which is a modified version of the customizable shoe design 1600 of FIG. 16A. A customization system generates the customized shoe design 1600c by applying style B as described above to customizable show design 1600. A texture 1614 (texture B) has been applied to largest primary aesthetic surfaces according to style B, and a motif 1602c has been applied in the appropriate area. A sole 1616 has been generated according to customization vector 1604. The sole 1616 has a bounding geometric shape created according to a geometric treatment from Style B and its internal volume is filled with a selective space structure 1618 applied according to style B. The customization system has sized and oriented the selective space structure according to the size of the volumes available. The overall size of customized shoe design 1600c has been modified by a customization system according to biometric and fit data in style B.

Figure 17A:
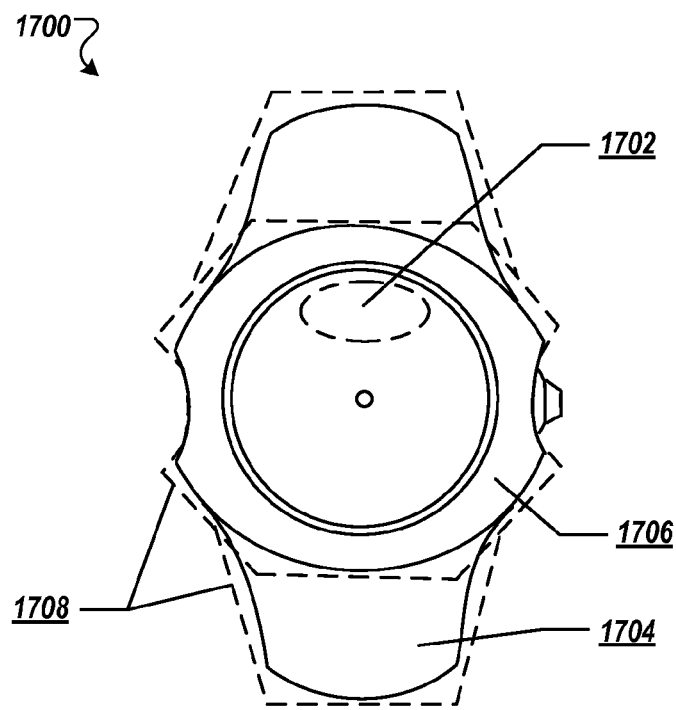
FIGS. 17A, 17B, and 17C show block diagrams of an example of a customizable watch design.

FIG. 17A shows a block diagram of an example of a customizable watch design 1700 which includes generic design geometry plus customization vectors and associated data. One customization vector describes an area 1702 designated for logo or motif placement. Another customization vector describes a set of areas or volumes 1704 which are designated as "band" and "grip areas". Another set of customization vectors describe region of purpose 1706 which his tagged as "primary aesthetic surface". The customizable watch design 1700 includes scalable maximum bounding volume 1708 inside which any customized design must fit. The scalable maximum bounding volume 1708 is uniformly scalable according to biometric data and serves to maintain proportions of watch components according to the product designer's overall intent. Other customization vectors may include specific fit dimensions that may be adapted to measurements or biometric data. Many other customization vectors are possible (and likely) for this product and other products. A small subset has been described here for brevity.

Figure 17B:
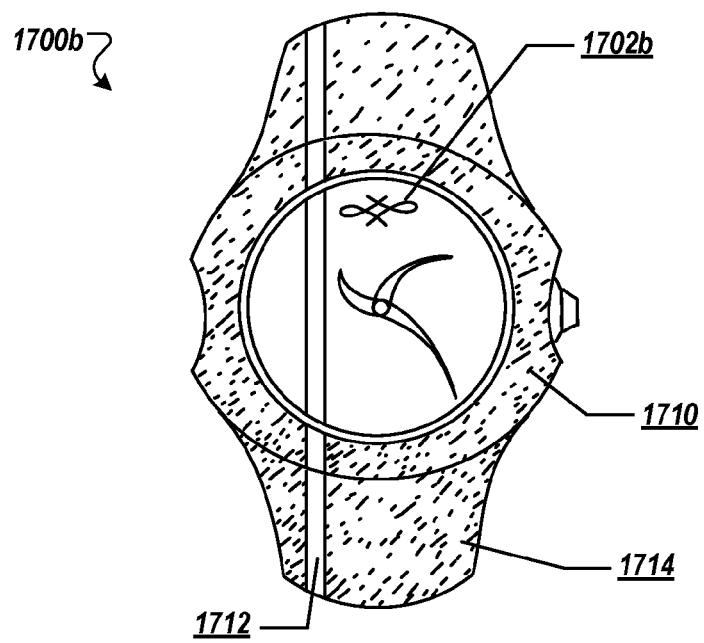

FIG. 17B shows a block diagram of a customized watch design 1700b which is a modified version of the customizable watch design 1700 of FIG. 17A. A customization system may generate the customized watch design 1700b by applying style A as described above to customizable watch design 1700. A texture 1710 (texture A) has been applied to relevant regions of purpose according to style A and customization vectors. The customization system applies a logo 1702b in the appropriate area 1702 corresponding to logo customization vector. A white stripe 1712 has been applied parallel to the longest dimension of the customized watch design 1700b across all applicable areas, surfaces or regions of purpose specified in customization vectors for the customized watch design 1700b. A band 1714 utilizes the default basic geometry but has texture 1710 applied to it.

Figure 17C:
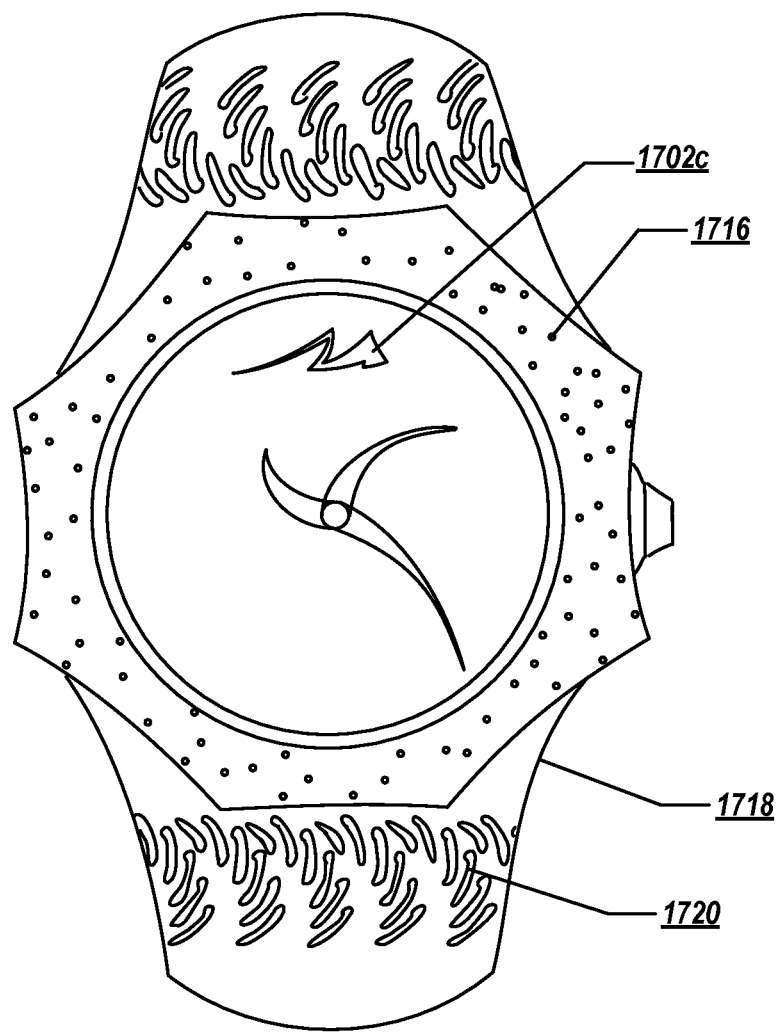

FIG. 17C shows a block diagram of a second version of a customized watch design 1700c which is a modified version of the customizable watch design 1700 of FIG. 17A. A customization system generates the second customized watch design 1700c by applying style B as described above to customizable watch design 1700. A texture 1716 (texture B) has been applied to largest primary aesthetic surfaces according to style B, and a motif 1702c has been applied in the appropriate area. A band 1718 has been generated according to customization vector for the areas or volumes 1704. The band 1718 has a bounding geometric shape created according to a geometric treatment from Style B and its internal volume is filled with a selective space structure 1720 applied according to style B. The customization system has sized and oriented the selective space structure according to the size of the volumes available. The overall size of the second customized watch design 1700c has been modified by a customization system according to biometric and fit data in style B.

Figure 18A:
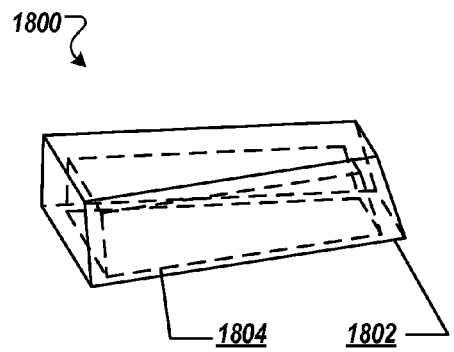
FIGS. 18A-F show block diagrams of a generic geometry of a customizable product design.

FIG. 18A shows a block diagram of a generic geometry of a customizable product design 1800. A maximum geometric envelope 1802 and a minimum geometric envelop 1804 are shown. An automated design customization, system such as one described in more detail above, may modify the generic geometry or create new geometry for a customized product as long as that geometry lies within maximum geometric envelope 1802 and outside of minimum geometric envelope 1804 and obeys other mandatory directives, e.g., rules, contained in customization vectors associated with the customizable design.

Figure 18B:
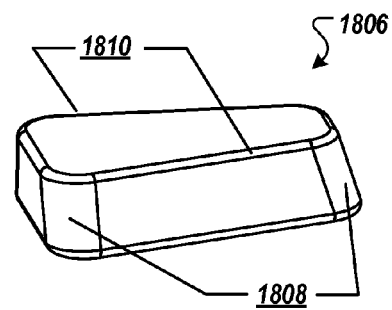

FIG. 18B shows a block diagram of a product geometry 1806 that may be created by a customization system applying a geometric treatment from a style to the generic geometry of the customizable product design 1800 of FIG. 18A. In this case product geometry 1806 has large rounds applied to edge areas 1808 that are within a certain tolerance from vertical. Edge areas 1810 that are close to horizontal are also rounded but with a different radius. The customizable product design 1800 of FIG. 18A may contain data about a preferred orientation of product geometry as well as associated information such as angles, horizontally, verticality and other geometric, location and orientation information for edges, faces, regions, volumes, areas and features.

Figure 18C:
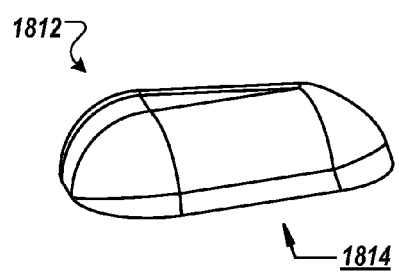

FIG. 18C shows a block diagram a product geometry 1812 that may be created by a customization system applying a geometric treatment from a style to the generic geometry of the customizable product design 1800 of FIG. 18A. In this case the product geometry 1812 has large rounds applied to all edge areas except those adjoining downward facing regions or faces 1814.

Figure 18D:
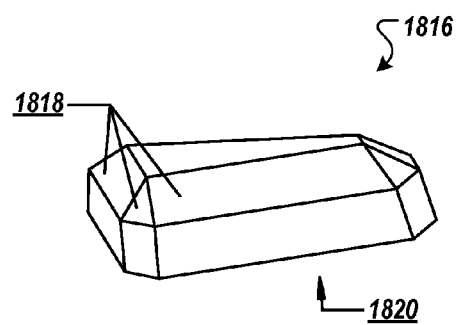

FIG. 18D shows a product geometry 1816 that may be created by a customization system applying a geometric treatment from a style to the generic geometry of the customizable product design 1800 of FIG. 18A. In this case the product geometry 1816 has bevels 1818 of a size determined relative to the size of generic geometry applied to all edge areas except those adjoining a downward facing regions or faces 1820.

Figure 18E:
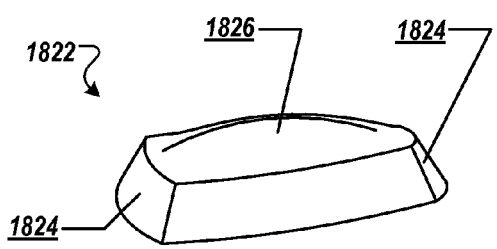

FIG. 18E shows a block diagram of a product geometry 1822 that may be created by a customization system applying a geometric treatment from a style to the generic geometry of the customizable product design 1800 of FIG. 18A. In this case the product geometry 1822 has geometry curved in one axis (i.e. cylindrical or conical) created in regions 1824 that are within a tolerance from vertical and has geometry curved in two axes (i.e. domed) in an upward facing region 1826.

Figure 18F:
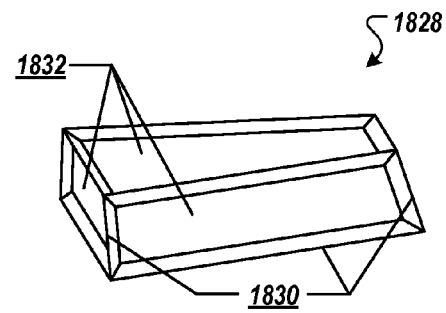

FIG. 18F shows a block diagram of a product geometry 1828 that may be created by a customization system applying a geometric treatment from a style to the generic geometry of the customizable product design 1800 of FIG. 18A. In this case the product geometry 1828 may be created by an algorithmic erosion process in which geometric locations may be assigned a hardness value based on their characteristics and then geometry may be modified (eroded) at a rate or by an amount related to the local hardness. In this case surface locations greater than a certain distance from the perimeters 1830 of each region 1832 may be assigned a relatively low hardness and locations close to the perimeter of a region may be assigned a high hardness so that depressions may be created in each region while the perimeters may be left more pronounced.

Many other geometry treatments are possible and these may be created for or defined to complement each product style. A customization system may automatically define or modify geometric treatments based on style data. A customization system can use language heuristics and other associations, deductive reasoning and correlations to create geometric treatments based on qualitative, non-geometric information such as "soft", "non-skid", "harsh", "contacts skin", "creates traction in soft surfaces", "flexible", "skeletal", etc.

Figure 19A:
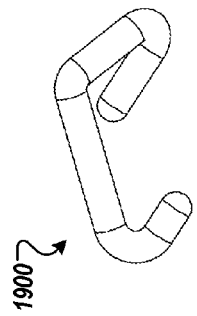
FIGS. 19A-F show block diagrams of a seed unit cell that can form the basis for a selective space structure.

FIG. 19A shows a block diagram of a seed unit cell 1900 that can form the basis for a selective space structure. Seed unit cells for selective space structures can be nearly any three dimensional shape.

Figure 19B:
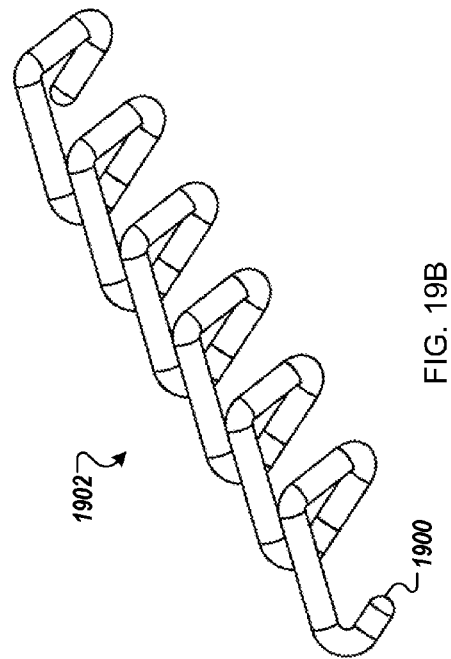

FIG. 19B shows a block diagram of a selective space structure 1902 that may be created by patterning multiple seed unit cells 1900 so that multiple copies of the seed unit cell 1900 work together to form the selective space structure 1902. The seed unit cells 1900 may be rigidly joined, or completely free or entangled but not rigidly joined. The seed unit cells 1900 may be connected using any appropriate method to create the selective space structure 1902, e.g., by a 3D printing manufacturing system. These options allow a variety of structure types to be created ranging from rigid structures to flexible structures to fabric-like structures to malleable structures in which individual elements can move and migrate.

Figure 19C:
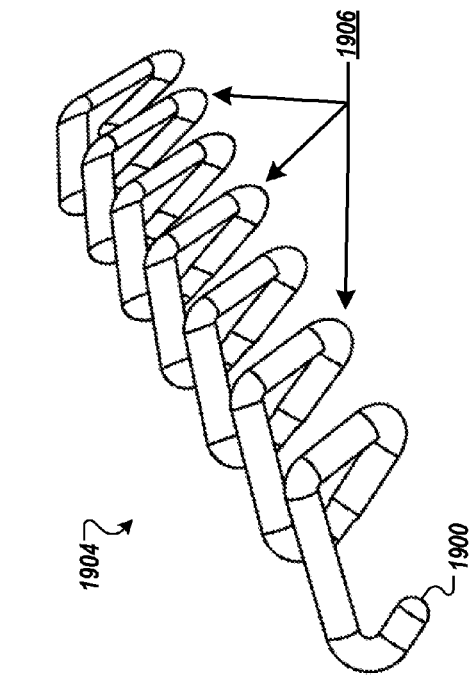

FIG. 19C shows a block diagram of a selective space structure 1904 that may be created by patterning the seed unit cell 1900 with a deformation pattern or progression so that new cells 1906 are created that are related to but differ from the shape of the seed unit cell 1900. The new cells 1906 may each have a unique shape or the shapes of some of the new cells 1906 may be the same. The new cells 1906 may have a regular spacing, irregular spacing, random spacing or some other spacing or arrangement. The new cells 1906 may change shape in a regular way across selective space structure 1904 or an irregular way or a random way or they may change shape in some other way.

Each of the new cells 1906 may have a different size and orientation. The size and orientation of the new cells 1906 may vary with some relationship to the position within the selective space structure 1904 or size and orientation may be random. While one seed unit cell 1900 is shown forming the basis of the selective space structure 1904, it is also possible to have multiple, related or unrelated seed unit cells 1900.

Figure 19D:
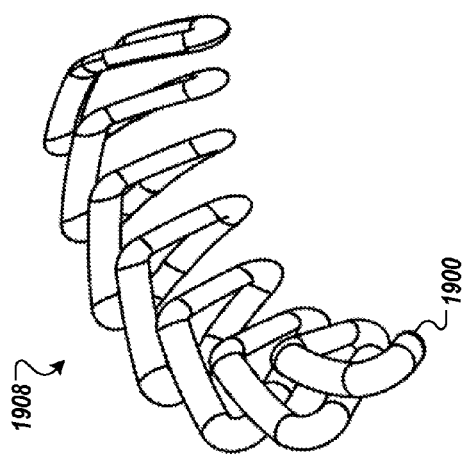

FIG. 19D shows a block diagram of a selective space structure 1908 that may be formed by patterning and deforming the seed unit cell 1900. In this example, the deformation is not linear and includes a bending component so that the resulting selective space structure 1908 is bent.

Different selective space structures may be formed with different types of patterns and deformations, and geometric changes including twisting, changing thickness, changing hole sizes, and complex geometric or algorithmic manipulations or mutations.

Figure 19E:
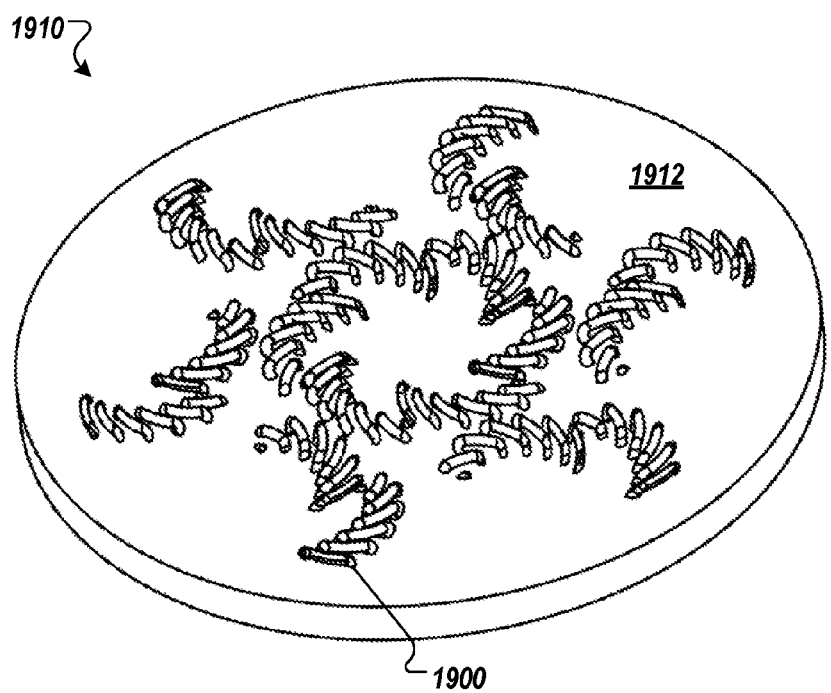

FIG. 19E shows a block diagram of a selective space structure 1910 that may be formed by several patterning operations of the seed unit cell 1900. The selective space structure 1910 is embedded in an product surface 1912. The protruding portion of the selective space structure 1910 serves as a surface texture for aesthetics or function.

Figure 19F:
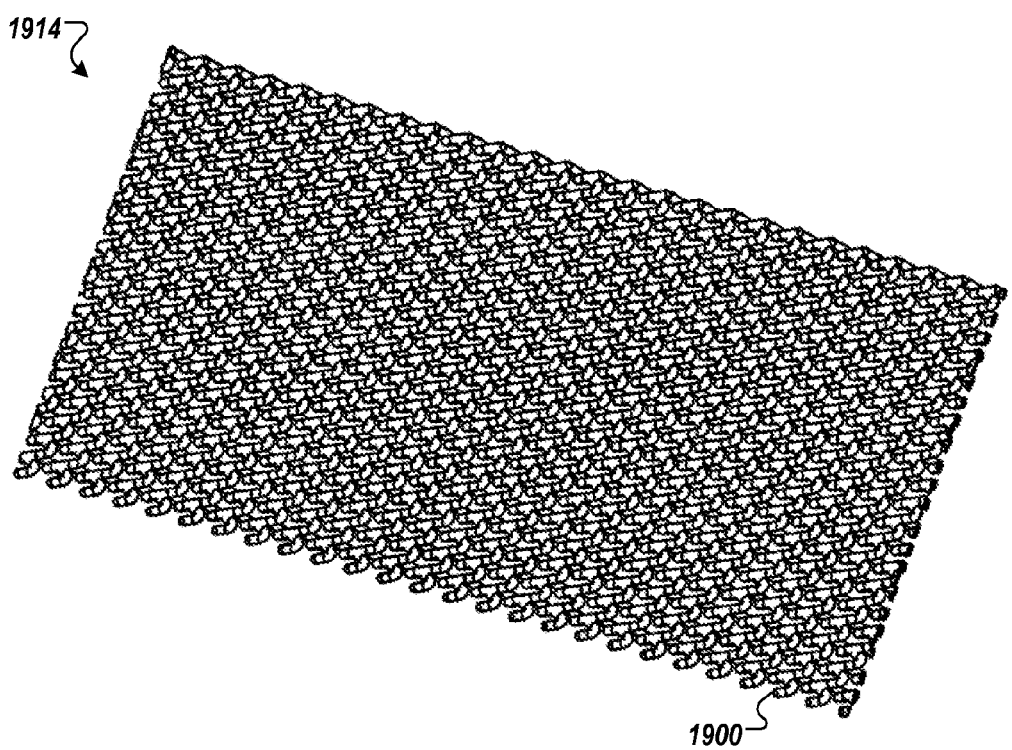

FIG. 19F shows a block diagram of a selective space structure 1914 that may be formed by a two-dimensional pattern of the seed unit cell 1900. Three-dimensional patterns are also possible, but are not shown here.

Figure 20:
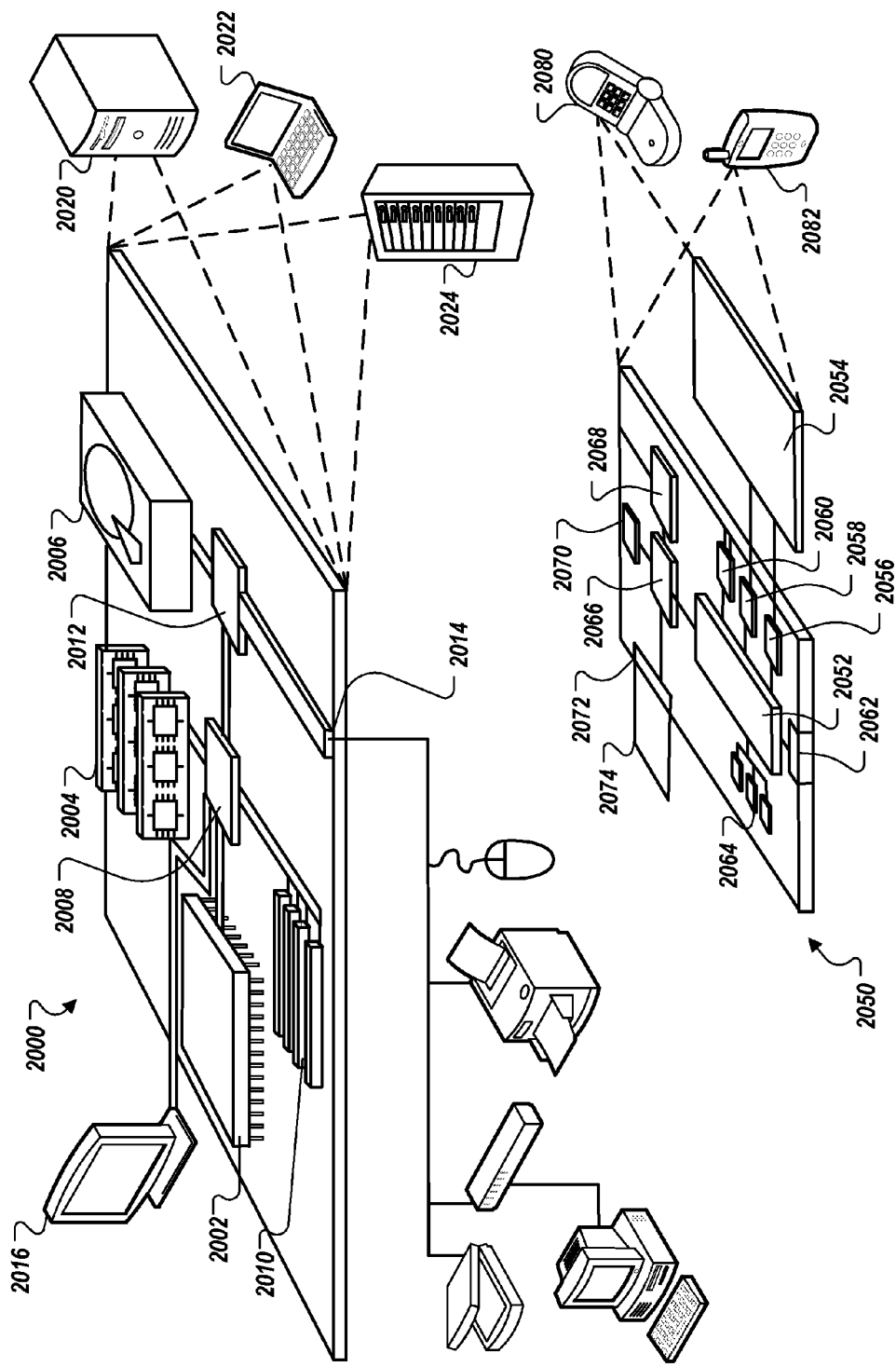
FIG. 20 is a block diagram of computing devices that may be used to implement the systems and methods described in this document.

FIG. 20 is a block diagram of computing devices 2000, 2050 that may be used to implement the systems and methods described in this document, as either a client or as a server or plurality of servers. Computing device 2000 is intended to represent various forms of digital computers, such as laptops, desktops, workstations, personal digital assistants, servers, blade servers, mainframes, and other appropriate computers. Computing device 2050 is intended to represent various forms of mobile devices, such as personal digital assistants, cellular telephones, smartphones, and other similar computing devices. Additionally computing device 2000 or 2050 can include Universal Serial Bus (USB) flash drives. The USB flash drives may store operating systems and other applications. The USB flash drives can include input/output components, such as a wireless transmitter or USB connector that may be inserted into a USB port of another computing device. The components shown here, their connections and relationships, and their functions, are meant to be exemplary only, and are not meant to limit implementations of the inventions described and/or claimed in this document.

Computing device 2000 includes a processor 2002, memory 2004, a storage device 2006, a high speed interface 2008 connecting to memory 2004 and high speed expansion ports 2010, and a low speed interface 2012 connecting to low speed bus 2014 and storage device 2006. Each of the components 2002, 2004, 2006, 2008, 2010, and 2012, are interconnected using various busses, and may be mounted on a common motherboard or in other manners as appropriate. The processor 2002 can process instructions for execution within the computing device 2000, including instructions stored in the memory 2004 or on the storage device 2006 to display graphical information for a GUI on an external input/output device, such as display 2016 coupled to high speed interface 2008. In other implementations, multiple processors and/or multiple buses may be used, as appropriate, along with multiple memories and types of memory. Also, multiple computing devices 2000 may be connected, with each device providing portions of the necessary operations (e.g., as a server bank, a group of blade servers, or a multi-processor system).

The memory 2004 stores information within the computing device 2000. In one implementation, the memory 2004 is a volatile memory unit or units. In another implementation, the memory 2004 is a non-volatile memory unit or units. The memory 2004 may also be another form of computer-readable medium, such as a magnetic or optical disk.

The storage device 2006 is capable of providing mass storage for the computing device 2000. In one implementation, the storage device 2006 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 2004, the storage device 2006, or memory on processor 2002.

The high speed controller 2008 manages bandwidth-intensive operations for the computing device 2000, while the low speed controller 2012 manages lower bandwidth-intensive operations. Such allocation of functions is exemplary only. In one implementation, the high speed controller 2008 is coupled to memory 2004, display 2016 (e.g., through a graphics processor or accelerator), and to high speed expansion ports 2010, which may accept various expansion cards (not shown). In the implementation, low speed controller 2012 is coupled to storage device 2006 and low speed expansion port 2014. The low speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 2000 may be implemented in a number of different forms, as shown in the figure. For example, it may be implemented as a standard server 2020, or multiple times in a group of such servers. It may also be implemented as part of a rack server system 2024. In addition, it may be implemented in a personal computer such as a laptop computer 2022. Alternatively, components from computing device 2000 may be combined with other components in a mobile device (not shown), such as device 2050. Each of such devices may contain one or more of computing device 2000, 2050, and an entire system may be made up of multiple computing devices 2000, 2050 communicating with each other.

Computing device 2050 includes a processor 2052, memory 2064, an input/output device such as a display 2054, a communication interface 2066, and a transceiver 2068, among other components. The device 2050 may also be provided with a storage device, such as a microdrive or other device, to provide additional storage. Each of the components 2050, 2052, 2064, 2054, 2066, and 2068, are interconnected using various buses, and several of the components may be mounted on a common motherboard or in other manners as appropriate.

The processor 2052 can execute instructions within the computing device 2050, including instructions stored in the memory 2064. The processor may be implemented as a chipset of chips that include separate and multiple analog and digital processors. Additionally, the processor may be implemented using any of a number of architectures. For example, the processor 2002 may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 2050, such as control of user interfaces, applications run by device 2050, and wireless communication by device 2050.

Processor 2052 may communicate with a user through control interface 2058 and display interface 2056 coupled to a display 2054. The display 2054 may be, for example, a TFT (Thin-Film-Transistor Liquid Crystal Display) display or an OLED (Organic Light Emitting Diode) display, or other appropriate display technology. The display interface 2056 may comprise appropriate circuitry for driving the display 2054 to present graphical and other information to a user. The control interface 2058 may receive commands from a user and convert them for submission to the processor 2052. In addition, an external interface 2062 may be provide in communication with processor 2052, so as to enable near area communication of device 2050 with other devices. External interface 2062 may provide, for example, for wired communication in some implementations, or for wireless communication in other implementations, and multiple interfaces may also be used.

The memory 2064 stores information within the computing device 2050. The memory 2064 can be implemented as one or more of a computer-readable medium or media, a volatile memory unit or units, or a non-volatile memory unit or units. Expansion memory 2074 may also be provided and connected to device 2050 through expansion interface 2072, which may include, for example, a SIMM (Single In Line Memory Module) card interface. Such expansion memory 2074 may provide extra storage space for device 2050, or may also store applications or other information for device 2050. Specifically, expansion memory 2074 may include instructions to carry out or supplement the processes described above, and may include secure information also. Thus, for example, expansion memory 2074 may be provide as a security module for device 2050, and may be programmed with instructions that permit secure use of device 2050. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 2064, expansion memory 2074, or memory on processor 2052 that may be received, for example, over transceiver 2068 or external interface 2062.

Device 2050 may communicate wirelessly through communication interface 2066, which may include digital signal processing circuitry where necessary. Communication interface 2066 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 2068. In addition, short-range communication may occur, such as using a Bluetooth, WiFi, or other such transceiver (not shown). In addition, GPS (Global Positioning System) receiver module 2070 may provide additional navigation- and location-related wireless data to device 2050, which may be used as appropriate by applications running on device 2050.

Device 2050 may also communicate audibly using audio codec 2060, which may receive spoken information from a user and convert it to usable digital information. Audio codec 2060 may likewise generate audible sound for a user, such as through a speaker, e.g., in a handset of device 2050.

Such sound may include sound from voice telephone calls, may include recorded sound (e.g., voice messages, music files, etc.) and may also include sound generated by applications operating on device 2050.

The computing device 2050 may be implemented in a number of different forms, as shown in the figure. For example, it may be implemented as a cellular telephone 2080. It may also be implemented as part of a smartphone 2082, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

This document describes technologies that can be applied to a wide range of uses, which are designed and intended to be beneficial for all users involved. However, some of the technologies described may be put to illegitimate, malicious, and even illegal ends by bad actors. This is true with almost any technology, but there is often a greater sensitivity when a technology interacts with a user's security and private information. The described technologies all are designed to operate in an environment and in a manner that respects the rights of all users. As such, features such as user notification, opt-in and opt-out procedures, and privacy settings are available options to be used to ensure user security and privacy are respected.

Although a few implementations have been described in detail above, other modifications are possible. In addition, the logic flows depicted in the figures do not require the particular order shown, or sequential order, to achieve desirable results. Other steps may be provided, or steps may be eliminated, from the described flows, and other components may be added to, or removed from, the described systems. Accordingly, other implementations are within the scope of the following claims.

What is claimed is:

1. A computer-implemented method comprising:
   storing a product design in a database, wherein the product design comprises a customization vector for a customizable attribute of the product design, wherein the customization vector includes two or more customizable attributes including the customizable attribute;
   storing style data representing a style in a style database, wherein the style data comprises values for each of two or more style attributes, including a style attribute, which are usable to customize different types of products, wherein storing the style data representing the style includes storing style data for each of the two or more style attributes including the style data for the style attribute;
   storing an identifier of a user in a user database that associates the user with the style;
   receiving data indicating selection of the product design by the user after storing the identifier of the user in the user database that associates the user with the style;
   determining, using the identifier of the user, to apply the style, from multiple styles in the style database, to the product design;
   in response to determining to apply the style to the product design, determining that the customizable attribute and the style attribute are the same attribute;
   creating a user-specific design by modifying values of the customization vector of the product design using the style data in response to determining that the customizable attribute and the style attribute are the same attribute, wherein modifying the customization vector comprises, for each of the two or more customizable attributes:
      matching the customizable attribute for the customization vector to the corresponding style data for the corresponding style attribute in the style; and
      applying the matched style data to the customizable attribute for the customization vector to create the user-specific design; and
   providing data representing the user-specific design for display.

2. The method of claim 1, wherein:
the customization vector comprises a particular customizable attribute with multiple allowable options; and
matching the customizable attribute from the customization vector to the corresponding style data for the style comprises selecting one of the allowable options for the particular customizable attribute that is a best fit using the style.

3. The method of claim 1, comprising:
determining an intended function for a product having the product design, wherein:
the style data includes multiple sets of style data for a particular style attribute; and
matching the customizable attribute from the customization vector to the corresponding style data for the style comprises selecting one of the sets of style data for the particular style attribute that is a best fit for the customizable attribute using the customization vector, the intended function, and the style data.

4. A non-transitory computer-readable medium storing software comprising instructions executable by one or more computers which, upon such execution, cause the one or more computers to perform operations comprising:
receiving data indicating a selection of a product design by a user for creation of a three-dimensional product that includes a plurality of attributes;
determining a style which includes values for some of the plurality of attributes and that is associated with the user;
for each of the plurality of attributes:
determining whether the style includes a value for the respective attribute; and
upon determining that the style includes a value for the respective attribute, customizing the product design using the value for the respective attribute; or
upon determining that the style does not include a value for the respective attribute, customizing the product design using a default value for the respective attribute, the default value being specified by the product design;
for each rule in the style:
determining whether a context for the rule applies to the product design; and
upon determining that the context for the rule does not apply to the product design, not customizing the product design using the rule; or
upon determining that the context for the rule applies to the product design:
determining whether the rule conflicts with a product design rule specified in the product design; and
upon determining that the rule does not conflict with a product design rule specified in the product design, customizing the product design using the rule; or
upon determining that the rule conflicts with a product design rule specified in the product design, not customizing the product design using the rule; and
providing, as output, data for the customized product design for the three-dimensional product.

5. The computer-readable medium of claim 4, wherein customizing the product design using the value for the respective attribute comprises modifying a customization vector defined in the product design using the value for the respective attribute.

6. The computer-readable medium of claim 4, wherein providing, as output, data for the customized product design for the three-dimensional product comprises sending instructions to a manufacturing device requesting creation of the three-dimensional product using the customized product design.

7. The computer-readable medium of claim 4, the operations comprising:
generating a feature hierarchy that ranks the attributes in the product design from highest priority to lowest priority; and
customizing the product design using a value for a higher priority attribute before determining whether the style includes a value for a lower priority attribute.

8. The computer-readable medium of claim 7, wherein generating the feature hierarchy that ranks the attributes in the product design from highest priority to lowest priority comprises generating a feature hierarchy that ranks attribute values in the product design from highest priority to lowest priority.

9. The computer-readable medium of claim 7, wherein generating the feature hierarchy that ranks the attributes in the product design from highest priority to lowest priority comprises generating a feature hierarchy that ranks the attributes in the product design from highest priority to lowest priority using the product design.

10. The computer-readable medium of claim 7, wherein generating the feature hierarchy that ranks the attributes in the product design from highest priority to lowest priority comprises generating a feature hierarchy that ranks the attributes in the product design from highest priority to lowest priority using the style.

11. The computer-readable medium of claim 7, wherein generating the feature hierarchy that ranks the attributes in the product design from highest priority to lowest priority comprises generating a feature hierarchy that ranks the attributes in the product design from highest priority to lowest priority using the product design and the style.

12. The computer-readable medium of claim 11, wherein generating the feature hierarchy that ranks the attributes in the product design from highest priority to lowest priority using the product design and the style comprises applying weights to attribute ratings to generate the feature hierarchy.

13. The computer-readable medium of claim 12, wherein applying the weights to attribute ratings to generate the feature hierarchy comprises applying greater weights to attribute ratings from the product design and lower weights to the attribute ratings from the style to cause the attribute ratings from the product design to have more influence on the feature hierarchy than the attribute ratings from the style.

14. The computer-readable medium of claim 4, the operations comprising:
determining whether a value that is included in the style conflicts with a rule for the product design; and
upon determining that the value that is included in the style does not conflict with a rule for the product design, customizing the product design using the value for the respective attribute that is included in the style; or
upon determining that the value that is included in the style conflicts with a rule for the product design, customizing the product design using a default value for the respective attribute that is specified by the product design.

15. The computer-readable medium of claim 14, comprising:
for at least a first value that is included in the style and that does not conflict with a rule for the product design, customizing the product design using the value for the respective attribute that is included in the style; and for at least a second value that is included in the style and that conflicts with a rule for the product design, customizing the product design using the default value for the respective attribute.

16. The computer-readable medium of claim 4, wherein:

determining the style which includes values for some of the plurality of attributes and that is associated with the user comprises determining the style that includes values for two or more of the attributes, from the plurality of attributes included in the product design of the three-dimensional product, which are usable to customize different types of products; and upon determining that the style includes a value for the respective attribute, customizing the product design using the value for the respective attribute comprises customizing the product design using the value for the respective attribute that is included in the style which is usable to customize different types of products.

17. A computer-implemented method comprising:

storing a product design in a database, wherein the product design is for a first type of product, and comprises a customization vector for a customizable attribute of the product design;

storing style data representing a style in a style database, wherein the style data comprises values for each of two or more style attributes, including a style attribute, which are usable to customize different types of products;

storing an identifier of a user in a user database that associates the user with the style;

receiving data indicating selection of the product design by the user after storing the identifier of the user in the user database that associates the user with the style;

determining, using the identifier of the user, to apply the style, from multiple styles in the style database, to the product design;

in response to determining to apply the style to the product design, determining that the customizable attribute and the style attribute are the same attribute;

creating a user-specific design by modifying values of the customization vector of the product design using the style data in response to determining that the customizable attribute and the style attribute are the same attribute;

providing data representing the user-specific design for display;

storing a second product design for a second type of product in the database, wherein the second product design comprises a second customization vector for a second customizable attribute of the second product design, wherein the first type of product is a different product type than the second type of product;

receiving data indicating selection of the second product design by the user after storing the identifier of the user in the user database that associates the user with the style;

determining, using the identifier of the user, to apply the style, from the multiple styles in the style database, to the second product design;

in response to determining to apply the style to the second product design, determining that the second customizable attribute and the style attribute are the same attribute;

creating a second user-specific design by modifying values of the second customization vector of the second product design using the style data in response to determining that the second customizable attribute and the style attribute are the same attribute; and providing second data representing the second user-specific design for display.

* * * * *